(12) United States Patent
Dictus et al.

(10) Patent No.: US 12,346,035 B2
(45) Date of Patent: Jul. 1, 2025

(54) PROCESS TOOL FOR DRY REMOVAL OF PHOTORESIST

(71) Applicant: Lam Research Corporation, Fremont, CA (US)

(72) Inventors: Dries Dictus, Kessel-Lo (BE); Timothy William Weidman, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 18/377,245

(22) Filed: Oct. 5, 2023

(65) Prior Publication Data

US 2024/0036483 A1  Feb. 1, 2024

Related U.S. Application Data

(63) Continuation of application No. 17/759,281, filed as application No. PCT/US2021/058647 on Nov. 9, 2021.

(Continued)

(51) Int. Cl.
*G03F 7/00* (2006.01)
*G03F 7/36* (2006.01)

(52) U.S. Cl.
CPC ............ *G03F 7/70925* (2013.01); *G03F 7/36* (2013.01)

(58) Field of Classification Search
CPC .................................. G03F 7/36; G03F 7/0042
See application file for complete search history.

(56) References Cited

U.S. PATENT DOCUMENTS 3,442,648 A   5/1969  Smith et al.
3,513,010 A   5/1970  Notley et al.
(Continued)

FOREIGN PATENT DOCUMENTS

CN   101098575 A   1/2008
CN   102027577 A   4/2011
(Continued)

OTHER PUBLICATIONS

Banerjee, D. et al., "Potential of Metal-Organic Frameworks for Separation of Xenon and Krypton", Accounts of Chemical Research, 2015, vol. 48, No. 2, pp. 211-219.
(Continued)

*Primary Examiner* — Steven H Whitesell
(74) *Attorney, Agent, or Firm* — Weaver Austin Villeneuve & Sampson LLP

(57) ABSTRACT

Dry development or dry removal of metal-containing extreme ultraviolet radiation (EUV) photoresist is performed in atmospheric conditions or performed in process tools without vacuum equipment. Dry removal of the metal-containing EUV photoresist may be performed under atmospheric pressure or over-atmospheric pressure. Dry removal of the metal-containing EUV photoresist may be performed with exposure to an air environment or with non-oxidizing gases. A process chamber or module may be modified or integrated to perform dry removal of the metal-containing EUV photoresist with baking, wafer cleaning, wafer treatment, or other photoresist processing function. In some embodiments, the process chamber for dry removal of the metal-containing EUV photoresist includes a heating assembly for localized heating of a semiconductor substrate and a movable discharge nozzle for localized gas delivery above the semiconductor substrate.

21 Claims, 15 Drawing Sheets

Related U.S. Application Data

(60) Provisional application No. 63/198,804, filed on Nov. 13, 2020.

(56) References Cited

U.S. PATENT DOCUMENTS

| | | |
|---|---|---|
| 3,529,963 A | 9/1970 | Marchese et al. |
| 3,576,755 A | 4/1971 | Patella et al. |
| 3,720,515 A | 3/1973 | Stanley |
| 4,061,829 A | 12/1977 | Taylor |
| 4,241,165 A | 12/1980 | Hughes et al. |
| 4,292,384 A | 9/1981 | Straughan et al. |
| 4,328,298 A | 5/1982 | Nester |
| 4,341,592 A | 7/1982 | Shortes et al. |
| 4,396,704 A | 8/1983 | Taylor |
| 4,590,149 A | 5/1986 | Nakane et al. |
| 4,738,748 A | 4/1988 | Kisa |
| 4,806,456 A | 2/1989 | Katoh |
| 4,814,243 A | 3/1989 | Ziger |
| 4,834,834 A | 5/1989 | Ehrlich et al. |
| 4,842,989 A | 6/1989 | Taniguchi et al. |
| 4,845,053 A | 7/1989 | Zajac |
| 4,940,854 A | 7/1990 | Debe |
| 4,956,204 A | 9/1990 | Amazawa et al. |
| 5,077,085 A | 12/1991 | Schnur et al. |
| 5,079,600 A | 1/1992 | Schnur et al. |
| 5,094,936 A * | 3/1992 | Misium ............... G03F 7/265 |
| | | 430/326 |
| 5,206,706 A | 4/1993 | Quinn |
| 5,322,765 A | 6/1994 | Clecak et al. |
| 5,399,464 A | 3/1995 | Lee |
| 5,445,988 A | 8/1995 | Schwalke |
| 5,534,312 A | 7/1996 | Hill et al. |
| 5,761,023 A | 6/1998 | Lue et al. |
| 5,914,278 A | 6/1999 | Boitnott et al. |
| 5,925,494 A | 7/1999 | Horn |
| 6,013,418 A | 1/2000 | Ma et al. |
| 6,017,553 A | 1/2000 | Burrell et al. |
| 6,045,877 A | 4/2000 | Gleason et al. |
| 6,162,577 A | 12/2000 | Felter et al. |
| 6,179,922 B1 | 1/2001 | Ishikawa et al. |
| 6,179,924 B1 | 1/2001 | Zhao et al. |
| 6,261,938 B1 | 7/2001 | Beauvais et al. |
| 6,290,779 B1 | 9/2001 | Saleh et al. |
| 6,313,035 B1 | 11/2001 | Sandhu et al. |
| 6,319,654 B1 | 11/2001 | Kim et al. |
| 6,348,239 B1 | 2/2002 | Hill et al. |
| 6,410,421 B1 | 6/2002 | Ghandehari et al. |
| 6,448,097 B1 | 9/2002 | Singh et al. |
| 6,573,030 B1 | 6/2003 | Fairbairn et al. |
| 6,607,867 B1 | 8/2003 | Kim et al. |
| 6,666,986 B1 | 12/2003 | Vaartstra |
| 6,797,439 B1 | 9/2004 | Alpay |
| 6,833,306 B2 | 12/2004 | Lyding et al. |
| 6,841,341 B2 | 1/2005 | Fairbairn et al. |
| 6,841,943 B2 | 1/2005 | Vahedi et al. |
| 6,867,086 B1 | 3/2005 | Chen et al. |
| 7,112,489 B1 | 9/2006 | Lyons et al. |
| 7,169,440 B2 | 1/2007 | Balasubramaniam et al. |
| 7,223,526 B2 | 5/2007 | Fairbairn et al. |
| 7,307,695 B2 | 12/2007 | Hazenberg et al. |
| 7,335,462 B2 | 2/2008 | Fairbairn et al. |
| 7,608,367 B1 | 10/2009 | Aigeldinger et al. |
| 8,383,316 B2 | 2/2013 | Cooper et al. |
| 8,465,903 B2 | 6/2013 | Weidman et al. |
| 8,536,068 B2 | 9/2013 | Weidman et al. |
| 8,552,334 B2 | 10/2013 | Tappan et al. |
| 8,664,124 B2 | 3/2014 | Graff |
| 8,664,513 B2 | 3/2014 | Pfenninger et al. |
| 8,703,386 B2 | 4/2014 | Bass et al. |
| 8,808,561 B2 | 8/2014 | Kanarik |
| 8,883,028 B2 | 11/2014 | Kanarik |
| 8,883,405 B2 | 11/2014 | Shiobara |
| 9,023,731 B2 | 5/2015 | Ji et al. |
| 9,261,784 B2 | 2/2016 | Wuister et al. |
| 9,281,207 B2 | 3/2016 | Stowers et al. |
| 9,310,684 B2 | 4/2016 | Meyers et al. |
| 9,551,924 B2 | 1/2017 | Burkhardt et al. |
| 9,576,811 B2 | 2/2017 | Kanarik et al. |
| 9,632,411 B2 | 4/2017 | Michaelson et al. |
| 9,719,169 B2 | 8/2017 | Mohn et al. |
| 9,778,561 B2 | 10/2017 | Marks et al. |
| 9,823,564 B2 | 11/2017 | Stowers et al. |
| 9,829,805 B2 | 11/2017 | Michaelson et al. |
| 9,996,004 B2 | 6/2018 | Smith et al. |
| 10,025,179 B2 | 7/2018 | Meyers et al. |
| 10,074,543 B2 | 9/2018 | Mahorowala et al. |
| 10,228,618 B2 | 3/2019 | Meyers et al. |
| 10,416,554 B2 | 9/2019 | Meyers et al. |
| 10,514,598 B2 | 12/2019 | Marks et al. |
| 10,566,212 B2 | 2/2020 | Kanarik |
| 10,580,585 B2 | 3/2020 | Snaith et al. |
| 10,627,719 B2 | 4/2020 | Waller et al. |
| 10,642,153 B2 | 5/2020 | Meyers et al. |
| 10,649,328 B2 | 5/2020 | Stowers et al. |
| 10,732,505 B1 | 8/2020 | Meyers et al. |
| 10,763,083 B2 | 9/2020 | Yang et al. |
| 10,775,696 B2 | 9/2020 | Meyers et al. |
| 10,782,610 B2 | 9/2020 | Stowers et al. |
| 10,787,466 B2 | 9/2020 | Edson et al. |
| 10,796,912 B2 | 10/2020 | Shamma et al. |
| 10,831,096 B2 | 11/2020 | Marks et al. |
| 11,209,729 B2 | 12/2021 | Marks et al. |
| 11,257,674 B2 | 2/2022 | Shamma et al. |
| 11,314,168 B2 | 4/2022 | Tan et al. |
| 12,105,422 B2 | 10/2024 | Tan et al. |
| 12,183,604 B2 | 12/2024 | Yu et al. |
| 12,211,691 B2 | 1/2025 | Volosskiy et al. |
| 12,278,125 B2 | 4/2025 | Yu et al. |
| 2001/0024769 A1 | 9/2001 | Donoghue et al. |
| 2001/0055731 A1 | 12/2001 | Irie |
| 2002/0015855 A1 | 2/2002 | Sajoto et al. |
| 2002/0017243 A1 | 2/2002 | Pyo |
| 2002/0123221 A1 | 9/2002 | Jost et al. |
| 2002/0180372 A1 | 12/2002 | Yamazaki |
| 2002/0185067 A1 | 12/2002 | Upham |
| 2003/0008246 A1 | 1/2003 | Cheng et al. |
| 2003/0027060 A1 | 2/2003 | Lederer |
| 2003/0049571 A1 | 3/2003 | Hallock et al. |
| 2003/0134231 A1 | 7/2003 | Tsai et al. |
| 2003/0183244 A1 | 10/2003 | Rossman |
| 2004/0067444 A1 | 4/2004 | Wakabayashi et al. |
| 2004/0097388 A1 | 5/2004 | Brask et al. |
| 2004/0103914 A1 | 6/2004 | Cheng et al. |
| 2004/0113087 A1 | 6/2004 | Ikeda et al. |
| 2004/0115956 A1 | 6/2004 | Ishida |
| 2004/0175631 A1 | 9/2004 | Crocker et al. |
| 2004/0191423 A1 | 9/2004 | Ruan et al. |
| 2004/0203256 A1 | 10/2004 | Yang et al. |
| 2004/0209201 A1 | 10/2004 | Nakano et al. |
| 2004/0213563 A1 | 10/2004 | Irie |
| 2004/0229169 A1 | 11/2004 | Sandstrom |
| 2004/0233401 A1 | 11/2004 | Irie |
| 2005/0120955 A1 | 6/2005 | Yamasaki et al. |
| 2005/0142885 A1 | 6/2005 | Shinriki |
| 2005/0167617 A1 | 8/2005 | Derra et al. |
| 2005/0208389 A1 | 9/2005 | Ishibashi et al. |
| 2005/0253077 A1 | 11/2005 | Ikeda et al. |
| 2005/0257747 A1 | 11/2005 | Wakabayashi et al. |
| 2006/0001064 A1 | 1/2006 | Hill et al. |
| 2006/0046470 A1 | 3/2006 | Becknell et al. |
| 2006/0068173 A1 | 3/2006 | Kajiyama et al. |
| 2006/0128127 A1 | 6/2006 | Seo et al. |
| 2006/0147818 A1 | 7/2006 | Lee |
| 2006/0151462 A1 | 7/2006 | Lee et al. |
| 2006/0166537 A1 | 7/2006 | Thompson et al. |
| 2006/0172530 A1 | 8/2006 | Cheng et al. |
| 2006/0175558 A1 | 8/2006 | Bakker et al. |
| 2006/0246713 A1 | 11/2006 | Tsai et al. |
| 2006/0287207 A1 | 12/2006 | Park et al. |
| 2007/0017386 A1 | 1/2007 | Kamei |
| 2007/0037410 A1 | 2/2007 | Chang et al. |
| 2007/0074541 A1 | 4/2007 | Badding et al. |
| 2007/0117040 A1 | 5/2007 | Brock et al. |

(56) References Cited

U.S. PATENT DOCUMENTS

| | | |
|---|---|---|
| 2007/0181816 A1 | 8/2007 | Ikeda et al. |
| 2007/0212889 A1 | 9/2007 | Abatchev et al. |
| 2007/0259492 A1 | 11/2007 | Roh, II et al. |
| 2007/0287073 A1 | 12/2007 | Goodwin |
| 2008/0070128 A1 | 3/2008 | Wu et al. |
| 2008/0131616 A1 | 6/2008 | Besson et al. |
| 2008/0157011 A1 | 7/2008 | Nagai et al. |
| 2009/0130859 A1 | 5/2009 | Itatani et al. |
| 2009/0134119 A1 | 5/2009 | Matsumaru et al. |
| 2009/0153826 A1 | 6/2009 | Sewell et al. |
| 2009/0197086 A1 | 8/2009 | Rathi et al. |
| 2009/0208880 A1 | 8/2009 | Nemani et al. |
| 2009/0239155 A1 | 9/2009 | Levinson et al. |
| 2009/0286402 A1 | 11/2009 | Xia et al. |
| 2009/0305174 A1 | 12/2009 | Shiobara et al. |
| 2009/0317742 A1 | 12/2009 | Toriumi et al. |
| 2009/0321707 A1 | 12/2009 | Metz et al. |
| 2009/0325387 A1 | 12/2009 | Chen et al. |
| 2010/0009274 A1 | 1/2010 | Yamamoto |
| 2010/0022078 A1 | 1/2010 | Rockenberger et al. |
| 2010/0051446 A1 | 3/2010 | Wang et al. |
| 2010/0068660 A1 | 3/2010 | Shibazaki et al. |
| 2010/0086880 A1 | 4/2010 | Saito et al. |
| 2010/0131093 A1 | 5/2010 | Yokoyama et al. |
| 2010/0197135 A1 | 8/2010 | Ishizaka |
| 2010/0260994 A1 | 10/2010 | Groenen et al. |
| 2010/0266969 A1 | 10/2010 | Shiraishi et al. |
| 2010/0297847 A1 | 11/2010 | Cheng et al. |
| 2010/0304027 A1 | 12/2010 | Lee et al. |
| 2010/0310790 A1 | 12/2010 | Chang et al. |
| 2011/0104595 A1 | 5/2011 | Hayashi et al. |
| 2011/0117702 A1 | 5/2011 | Rietzler et al. |
| 2011/0195142 A1 | 8/2011 | Mitamura et al. |
| 2011/0198756 A1 | 8/2011 | Thenappan et al. |
| 2011/0200953 A1* | 8/2011 | Arima ................ G03F 7/3021 |
| | | 430/434 |
| 2011/0209725 A1 | 9/2011 | Kim et al. |
| 2011/0242508 A1 | 10/2011 | Kobayashi |
| 2011/0244680 A1 | 10/2011 | Tohnoe et al. |
| 2011/0266252 A1 | 11/2011 | Thadani et al. |
| 2011/0277681 A1 | 11/2011 | Arena et al. |
| 2011/0292356 A1 | 12/2011 | Tsukinoki et al. |
| 2012/0024388 A1 | 2/2012 | Burrows et al. |
| 2012/0068347 A1 | 3/2012 | Isobayashi et al. |
| 2012/0088193 A1 | 4/2012 | Weidman et al. |
| 2012/0088369 A1 | 4/2012 | Weidman et al. |
| 2012/0090547 A1 | 4/2012 | Wang et al. |
| 2012/0126358 A1 | 5/2012 | Arnold et al. |
| 2012/0161405 A1 | 6/2012 | Mohn et al. |
| 2012/0183689 A1 | 7/2012 | Suzuki et al. |
| 2012/0193762 A1 | 8/2012 | Lin et al. |
| 2012/0202357 A1 | 8/2012 | Sato et al. |
| 2012/0208125 A1 | 8/2012 | Hatakeyama |
| 2012/0223418 A1 | 9/2012 | Stowers et al. |
| 2012/0322011 A1 | 12/2012 | Wu et al. |
| 2013/0023124 A1 | 1/2013 | Nemani et al. |
| 2013/0129995 A1 | 5/2013 | Ouattara et al. |
| 2013/0157177 A1 | 6/2013 | Yu et al. |
| 2013/0164691 A1 | 6/2013 | Shiobara |
| 2013/0177847 A1 | 7/2013 | Chatterjee et al. |
| 2013/0183609 A1 | 7/2013 | Seon et al. |
| 2013/0224652 A1 | 8/2013 | Bass et al. |
| 2013/0273733 A1 | 10/2013 | Tang et al. |
| 2013/0299089 A1 | 11/2013 | Kim et al. |
| 2013/0319466 A1 | 12/2013 | Mizoguchi et al. |
| 2013/0323652 A1 | 12/2013 | Fernandez et al. |
| 2013/0330928 A1* | 12/2013 | Ishikawa ........... H01L 21/67225 |
| | | 118/728 |
| 2013/0330932 A1 | 12/2013 | Rangarajan et al. |
| 2014/0014745 A1 | 1/2014 | Burrows et al. |
| 2014/0021673 A1 | 1/2014 | Chen et al. |
| 2014/0120688 A1 | 5/2014 | Booth, Jr. et al. |
| 2014/0134827 A1 | 5/2014 | Swaminathan et al. |
| 2014/0170563 A1 | 6/2014 | Hatakeyama |
| 2014/0170853 A1 | 6/2014 | Shamma et al. |
| 2014/0175617 A1 | 6/2014 | Antonelli et al. |
| 2014/0193580 A1 | 7/2014 | Tiron et al. |
| 2014/0209015 A1 | 7/2014 | Yamada et al. |
| 2014/0220489 A1 | 8/2014 | Kozuma et al. |
| 2014/0239462 A1 | 8/2014 | Shamma et al. |
| 2014/0255844 A1 | 9/2014 | Iwao et al. |
| 2014/0261568 A1 | 9/2014 | Delgado et al. |
| 2014/0263172 A1* | 9/2014 | Xie .................. H01L 21/68707 |
| | | 216/41 |
| 2014/0268082 A1 | 9/2014 | Michaelson et al. |
| 2014/0272726 A1 | 9/2014 | Chang |
| 2015/0020848 A1 | 1/2015 | Kim et al. |
| 2015/0041809 A1 | 2/2015 | Arnold et al. |
| 2015/0056542 A1 | 2/2015 | Meyers et al. |
| 2015/0077733 A1 | 3/2015 | Huang et al. |
| 2015/0079393 A1 | 3/2015 | Freedman et al. |
| 2015/0096494 A1 | 4/2015 | Nishiura et al. |
| 2015/0096683 A1 | 4/2015 | Deshmukh et al. |
| 2015/0125679 A1 | 5/2015 | Ishikawa |
| 2015/0132965 A1 | 5/2015 | Devilliers et al. |
| 2015/0152551 A1 | 6/2015 | Yamaguchi et al. |
| 2015/0170957 A1 | 6/2015 | Tsao |
| 2015/0194343 A1 | 7/2015 | Chi et al. |
| 2015/0217330 A1 | 8/2015 | Haukka et al. |
| 2015/0218695 A1 | 8/2015 | Odedra |
| 2015/0221519 A1 | 8/2015 | Marks et al. |
| 2015/0243520 A1 | 8/2015 | Park et al. |
| 2015/0270148 A1 | 9/2015 | Shinoda et al. |
| 2015/0303064 A1 | 10/2015 | Singer et al. |
| 2015/0332922 A1 | 11/2015 | Chien et al. |
| 2015/0355549 A1 | 12/2015 | Xie et al. |
| 2016/0011505 A1 | 1/2016 | Stowers et al. |
| 2016/0011516 A1 | 1/2016 | Devilliers |
| 2016/0021660 A1 | 1/2016 | Krishnamurthy |
| 2016/0035631 A1 | 2/2016 | Lee et al. |
| 2016/0041471 A1 | 2/2016 | Briend et al. |
| 2016/0086864 A1 | 3/2016 | Fischer et al. |
| 2016/0116839 A1 | 4/2016 | Meyers et al. |
| 2016/0118246 A1 | 4/2016 | Kang et al. |
| 2016/0126106 A1 | 5/2016 | Shimizu et al. |
| 2016/0135274 A1 | 5/2016 | Fischer et al. |
| 2016/0179005 A1 | 6/2016 | Shamma et al. |
| 2016/0216606 A1 | 7/2016 | Meyers et al. |
| 2016/0284559 A1 | 9/2016 | Kikuchi et al. |
| 2016/0293405 A1 | 10/2016 | Matsumoto et al. |
| 2016/0314964 A1 | 10/2016 | Tang et al. |
| 2016/0343544 A1 | 11/2016 | Watanabe et al. |
| 2016/0357103 A1 | 12/2016 | Nagahara et al. |
| 2016/0357107 A1 | 12/2016 | Buchberger, Jr. et al. |
| 2016/0365248 A1 | 12/2016 | Mebarki et al. |
| 2016/0379824 A1 | 12/2016 | Wise et al. |
| 2017/0004974 A1 | 1/2017 | Manna et al. |
| 2017/0010535 A1 | 1/2017 | Fujitani et al. |
| 2017/0018506 A1 | 1/2017 | Cao et al. |
| 2017/0069462 A1 | 3/2017 | Kanarik et al. |
| 2017/0092495 A1 | 3/2017 | Chen et al. |
| 2017/0102612 A1 | 4/2017 | Meyers et al. |
| 2017/0146909 A1 | 5/2017 | Smith et al. |
| 2017/0154766 A1 | 6/2017 | Ogihara et al. |
| 2017/0167024 A1 | 6/2017 | Wiltse et al. |
| 2017/0168398 A1 | 6/2017 | Zi et al. |
| 2017/0176858 A1 | 6/2017 | Hirano |
| 2017/0184961 A1 | 6/2017 | Nakagawa et al. |
| 2017/0192357 A1 | 7/2017 | Carcasi et al. |
| 2017/0229325 A1 | 8/2017 | Lubomirsky et al. |
| 2017/0261850 A1 | 9/2017 | Stowers et al. |
| 2017/0330787 A1 | 11/2017 | Mitsunaga et al. |
| 2017/0342553 A1 | 11/2017 | Yu et al. |
| 2018/0004083 A1 | 1/2018 | Marks et al. |
| 2018/0012759 A1 | 1/2018 | Smith et al. |
| 2018/0023192 A1 | 1/2018 | Chandra et al. |
| 2018/0039172 A1 | 2/2018 | Stowers et al. |
| 2018/0039182 A1* | 2/2018 | Zi ......................... G03F 7/0043 |
| 2018/0046086 A1 | 2/2018 | Waller et al. |
| 2018/0061663 A1 | 3/2018 | Chandrashekar et al. |
| 2018/0093306 A1 | 4/2018 | Kang et al. |
| 2018/0096840 A1 | 4/2018 | Jeong et al. |
| 2018/0122648 A1 | 5/2018 | Kim et al. |
| 2018/0149976 A1 | 5/2018 | Liu et al. |

(56) References Cited

U.S. PATENT DOCUMENTS

| | | |
|---|---|---|
| 2018/0151350 A1 | 5/2018 | Li |
| 2018/0164689 A1 | 6/2018 | Sano et al. |
| 2018/0166278 A1 | 6/2018 | Belyansky et al. |
| 2018/0173096 A1 | 6/2018 | Zi et al. |
| 2018/0224744 A1 | 8/2018 | Bae et al. |
| 2018/0233362 A1 | 8/2018 | Glodde et al. |
| 2018/0233398 A1 | 8/2018 | Van Cleemput et al. |
| 2018/0294155 A1 | 10/2018 | Soppera et al. |
| 2018/0307137 A1 | 10/2018 | Meyers et al. |
| 2018/0308687 A1 | 10/2018 | Smith et al. |
| 2018/0314167 A1 | 11/2018 | Chang et al. |
| 2018/0323064 A1 | 11/2018 | Jung et al. |
| 2018/0330930 A1 | 11/2018 | Murakami et al. |
| 2018/0337046 A1 | 11/2018 | Shamma et al. |
| 2018/0337243 A1 | 11/2018 | Li et al. |
| 2018/0354804 A1 | 12/2018 | Venkatasubramanian et al. |
| 2018/0356731 A1 | 12/2018 | Tagawa |
| 2019/0027357 A1 | 1/2019 | Girard et al. |
| 2019/0041755 A1 | 2/2019 | Tanaka et al. |
| 2019/0043731 A1 | 2/2019 | Bristol et al. |
| 2019/0088521 A1 | 3/2019 | Chua et al. |
| 2019/0094685 A1 | 3/2019 | Marks et al. |
| 2019/0129307 A1 | 5/2019 | Kwon et al. |
| 2019/0131130 A1 | 5/2019 | Smith et al. |
| 2019/0137870 A1 | 5/2019 | Meyers et al. |
| 2019/0153001 A1 | 5/2019 | Cardineau et al. |
| 2019/0163056 A1 | 5/2019 | Maes et al. |
| 2019/0172714 A1 | 6/2019 | Bobek et al. |
| 2019/0187556 A1 | 6/2019 | Park et al. |
| 2019/0198338 A1 | 6/2019 | Kim et al. |
| 2019/0244809 A1 | 8/2019 | Ono |
| 2019/0259601 A1 | 8/2019 | De Silva et al. |
| 2019/0308998 A1 | 10/2019 | Cardineau et al. |
| 2019/0315781 A1 | 10/2019 | Edson et al. |
| 2019/0315782 A1 | 10/2019 | Edson et al. |
| 2019/0332014 A1 | 10/2019 | Ookubo et al. |
| 2019/0333777 A1 | 10/2019 | Hsieh et al. |
| 2019/0348292 A1 | 11/2019 | Dutta et al. |
| 2019/0352776 A1 | 11/2019 | Parikh |
| 2019/0369489 A1 | 12/2019 | Meyers et al. |
| 2019/0378696 A1 | 12/2019 | Addepalli et al. |
| 2019/0382890 A1 | 12/2019 | Lerner et al. |
| 2019/0391486 A1 | 12/2019 | Jiang et al. |
| 2020/0041897 A1 | 2/2020 | Moon et al. |
| 2020/0050109 A1 | 2/2020 | Ho et al. |
| 2020/0064733 A1 | 2/2020 | Meyers et al. |
| 2020/0066536 A1 | 2/2020 | Yaegashi |
| 2020/0089104 A1 | 3/2020 | Marks et al. |
| 2020/0124970 A1 | 4/2020 | Kocsis et al. |
| 2020/0133131 A1 | 4/2020 | Ouyang |
| 2020/0133133 A1 | 4/2020 | Park et al. |
| 2020/0157683 A1 | 5/2020 | Kato et al. |
| 2020/0166845 A1 | 5/2020 | Berendsen et al. |
| 2020/0174374 A1 | 6/2020 | Liao et al. |
| 2020/0176246 A1 | 6/2020 | Huotari et al. |
| 2020/0209756 A1 | 7/2020 | Waller et al. |
| 2020/0239498 A1 | 7/2020 | Clark et al. |
| 2020/0241413 A1 | 7/2020 | Clark et al. |
| 2020/0257196 A1 | 8/2020 | Meyers et al. |
| 2020/0292937 A1 | 9/2020 | Stowers et al. |
| 2020/0326627 A1 | 10/2020 | Jiang et al. |
| 2020/0393765 A1 | 12/2020 | Sakanishi |
| 2021/0005425 A1 | 1/2021 | Yang et al. |
| 2021/0013034 A1 | 1/2021 | Wu et al. |
| 2021/0013037 A1 | 1/2021 | Sun et al. |
| 2021/0041784 A1 | 2/2021 | Chen et al. |
| 2021/0271170 A1 | 9/2021 | Telecky et al. |
| 2021/0302833 A1 | 9/2021 | Weng et al. |
| 2021/0305040 A1 | 9/2021 | Kuo et al. |
| 2021/0397085 A1 | 12/2021 | Weidman et al. |
| 2022/0002882 A1* | 1/2022 | Kalutarage ............. G03F 7/265 |
| 2022/0020584 A1 | 1/2022 | Volosskiy et al. |
| 2022/0035247 A1 | 2/2022 | Tan et al. |
| 2022/0043334 A1 | 2/2022 | Tan et al. |
| 2022/0075260 A1 | 3/2022 | Marks et al. |
| 2022/0122846 A1 | 4/2022 | Shamma et al. |
| 2022/0157617 A1 | 5/2022 | Zhou et al. |
| 2022/0179328 A1 | 6/2022 | Xia et al. |
| 2022/0216050 A1 | 7/2022 | Yu et al. |
| 2022/0244645 A1 | 8/2022 | Tan et al. |
| 2022/0299877 A1 | 9/2022 | Weidman et al. |
| 2022/0308454 A1 | 9/2022 | Weidman et al. |
| 2022/0308462 A1 | 9/2022 | Berney et al. |
| 2022/0342301 A1 | 10/2022 | Weidman et al. |
| 2022/0344136 A1 | 10/2022 | Peter et al. |
| 2022/0365434 A1 | 11/2022 | Nardi et al. |
| 2022/0404713 A1 | 12/2022 | Tapily |
| 2023/0031955 A1 | 2/2023 | Yu et al. |
| 2023/0045336 A1 | 2/2023 | Yu et al. |
| 2023/0078946 A1 | 3/2023 | Grzeskowiak et al. |
| 2023/0100995 A1 | 3/2023 | Cardineau et al. |
| 2023/0107357 A1 | 4/2023 | Dictus et al. |
| 2023/0126516 A1 | 4/2023 | Wang et al. |
| 2023/0152701 A1 | 5/2023 | Kanakasabapathy |
| 2023/0230811 A1 | 7/2023 | Yu et al. |
| 2023/0259025 A1 | 8/2023 | Hansen et al. |
| 2023/0266662 A1 | 8/2023 | Marks et al. |
| 2023/0266664 A1 | 8/2023 | Hansen et al. |
| 2023/0266670 A1 | 8/2023 | Hansen et al. |
| 2023/0273516 A1 | 8/2023 | Marks et al. |
| 2023/0288798 A1 | 9/2023 | Hansen et al. |
| 2023/0290657 A1 | 9/2023 | Yu et al. |
| 2023/0314946 A1 | 10/2023 | Hansen et al. |
| 2023/0314954 A1 | 10/2023 | Peter et al. |
| 2023/0341781 A1 | 10/2023 | Han et al. |
| 2023/0416606 A1 | 12/2023 | Dictus et al. |
| 2024/0027900 A1 | 1/2024 | Hajibabaeinajafabadi et al. |
| 2024/0036473 A1 | 2/2024 | Fujimoto et al. |
| 2024/0036483 A1 | 2/2024 | Dictus et al. |
| 2024/0045337 A1 | 2/2024 | Hajibabaeinajafabadi et al. |
| 2024/0053684 A1 | 2/2024 | Hajibabaeinajafabadi et al. |
| 2024/0134274 A1 | 4/2024 | Weidman et al. |
| 2024/0145272 A1 | 5/2024 | Yu et al. |
| 2024/0192590 A1 | 6/2024 | Kanakasabapathy et al. |
| 2024/0329538 A1 | 10/2024 | Li et al. |
| 2024/0355650 A1 | 10/2024 | Kanakasabapathy et al. |
| 2024/0361696 A1 | 10/2024 | Tan et al. |
| 2024/0419078 A1 | 12/2024 | Tan et al. |
| 2025/0053080 A1 | 2/2025 | Marks et al. |
| 2025/0053084 A1 | 2/2025 | Hansen et al. |
| 2025/0053092 A1 | 2/2025 | Kenane et al. |
| 2025/0060673 A1 | 2/2025 | Wu et al. |
| 2025/0060674 A1 | 2/2025 | Li et al. |
| 2025/0093781 A1 | 3/2025 | Peter et al. |
| 2025/0112045 A1 | 4/2025 | Volosskiy et al. |

FOREIGN PATENT DOCUMENTS

| | | |
|---|---|---|
| CN | 102610516 A | 7/2012 |
| CN | 103119695 A | 5/2013 |
| CN | 103243310 A | 8/2013 |
| CN | 105047541 A | 11/2015 |
| CN | 105579906 A | 5/2016 |
| CN | 106558477 A | 4/2017 |
| CN | 106876251 A | 6/2017 |
| CN | 107153326 A | 9/2017 |
| CN | 108351594 A | 7/2018 |
| CN | 108388079 A | 8/2018 |
| CN | 108780739 A | 11/2018 |
| CN | 109521657 A | 3/2019 |
| CN | 109976097 A | 7/2019 |
| CN | 111254416 A | 6/2020 |
| CN | 111258190 A | 6/2020 |
| EP | 0197286 A2 | 10/1986 |
| EP | 0197286 B1 | 9/1991 |
| EP | 0465064 A2 | 1/1992 |
| EP | 1123423 B1 | 8/2007 |
| EP | 2608247 A1 | 6/2013 |
| EP | 3230294 A1 | 10/2017 |
| EP | 3258317 A1 | 12/2017 |
| EP | 3451059 A1 | 3/2019 |
| JP | S5119974 A | 2/1976 |
| JP | S57205736 A | 12/1982 |
| JP | S58108744 A | 6/1983 |

(56) References Cited

FOREIGN PATENT DOCUMENTS

| | | |
|---|---|---|
| JP | S6112653 U | 1/1986 |
| JP | S61234035 A | 10/1986 |
| JP | S6347364 A | 2/1988 |
| JP | H04226462 A | 8/1992 |
| JP | H0637050 A | 2/1994 |
| JP | H06169021 A | 6/1994 |
| JP | H06232041 A | 8/1994 |
| JP | H07106224 A | 4/1995 |
| JP | H07161607 A | 6/1995 |
| JP | H0869959 A | 3/1996 |
| JP | H08316237 A | 11/1996 |
| JP | H08339950 A | 12/1996 |
| JP | H1041206 A | 2/1998 |
| JP | H10209133 A | 8/1998 |
| JP | H11119440 A | 4/1999 |
| JP | 2000305273 A | 11/2000 |
| JP | 2000347413 A | 12/2000 |
| JP | 2000347421 A | 12/2000 |
| JP | 2000356857 A | 12/2000 |
| JP | 2001089860 A | 4/2001 |
| JP | 2001308019 A | 11/2001 |
| JP | 2002030445 A | 1/2002 |
| JP | 2002100558 A | 4/2002 |
| JP | 2002118096 A | 4/2002 |
| JP | 2003131364 A | 5/2003 |
| JP | 2003213001 A | 7/2003 |
| JP | 2003280155 A | 10/2003 |
| JP | 2003532303 A | 10/2003 |
| JP | 2004006798 A | 1/2004 |
| JP | 2004513515 A | 4/2004 |
| JP | 2004247678 A | 9/2004 |
| JP | 2004259786 A | 9/2004 |
| JP | 2005504146 A | 2/2005 |
| JP | 2005123651 A | 5/2005 |
| JP | 2005260015 A | 9/2005 |
| JP | 2006253282 A | 9/2006 |
| JP | 2006310681 A | 11/2006 |
| JP | 2007027617 A | 2/2007 |
| JP | 2007114255 A | 5/2007 |
| JP | 2008091215 A | 4/2008 |
| JP | 2009192350 A | 8/2009 |
| JP | 2009212404 A | 9/2009 |
| JP | 2010016083 A | 1/2010 |
| JP | 2010016314 A | 1/2010 |
| JP | 2010500762 A | 1/2010 |
| JP | 2010067979 A | 3/2010 |
| JP | 2010123732 A | 6/2010 |
| JP | 2010531931 A | 9/2010 |
| JP | 2010239087 A | 10/2010 |
| JP | 2011520242 A | 7/2011 |
| JP | 2011526082 A | 9/2011 |
| JP | 2011529126 A | 12/2011 |
| JP | 2012074738 A | 4/2012 |
| JP | 2012142481 A | 7/2012 |
| JP | 2012173315 A | 9/2012 |
| JP | 2012185485 A | 9/2012 |
| JP | 5055743 B2 | 10/2012 |
| JP | 2012191242 A | 10/2012 |
| JP | 2013033291 A | 2/2013 |
| JP | 2013047848 A | 3/2013 |
| JP | 2013096011 A | 5/2013 |
| JP | 2013526061 A | 6/2013 |
| JP | 2013145874 A | 7/2013 |
| JP | 2013151627 A | 8/2013 |
| JP | 2014504004 A | 2/2014 |
| JP | 2014512458 A | 5/2014 |
| JP | 5544914 B2 | 7/2014 |
| JP | 2014146767 A | 8/2014 |
| JP | 2014521111 A | 8/2014 |
| JP | 2014159625 A | 9/2014 |
| JP | 2015012198 A | 1/2015 |
| JP | 2015504604 A | 2/2015 |
| JP | 5705103 B2 | 4/2015 |
| JP | 2015513540 A | 5/2015 |
| JP | 2015105405 A | 6/2015 |
| JP | 2015106640 A | 6/2015 |
| JP | 2015201622 A | 11/2015 |
| JP | 2016037656 A | 3/2016 |
| JP | 2016072557 A | 5/2016 |
| JP | 2016517633 A | 6/2016 |
| JP | 2016131238 A | 7/2016 |
| JP | 2016208027 A | 12/2016 |
| JP | 2017014602 A | 1/2017 |
| JP | 2017500448 A | 1/2017 |
| JP | 2017045869 A | 3/2017 |
| JP | 2017108053 A | 6/2017 |
| JP | 2017116923 A | 6/2017 |
| JP | 2017152689 A | 8/2017 |
| JP | 2017208374 A | 11/2017 |
| JP | 2017228596 A | 12/2017 |
| JP | 2018006742 A | 1/2018 |
| JP | 2018502173 A | 1/2018 |
| JP | 2018017780 A | 2/2018 |
| JP | 2018025686 A | 2/2018 |
| JP | 2018098229 A | 6/2018 |
| JP | 2018518688 A | 7/2018 |
| JP | 2018164076 A | 10/2018 |
| JP | 2018200930 A | 12/2018 |
| JP | 2019500490 A | 1/2019 |
| JP | 2019024129 A | 2/2019 |
| JP | 2019506730 A | 3/2019 |
| JP | 2019053305 A | 4/2019 |
| JP | 2019056730 A | 4/2019 |
| JP | 2019095794 A | 6/2019 |
| JP | 2019135755 A | 8/2019 |
| JP | 2019192814 A | 10/2019 |
| JP | 2021523403 A | 9/2021 |
| KR | 890015374 A | 10/1989 |
| KR | 900001238 B1 | 3/1990 |
| KR | 950001406 A | 1/1995 |
| KR | 960000375 B1 | 1/1996 |
| KR | 19990029141 A | 4/1999 |
| KR | 19990070327 A | 9/1999 |
| KR | 20000073111 A | 12/2000 |
| KR | 20020000292 A | 1/2002 |
| KR | 20050112115 A | 11/2005 |
| KR | 100575847 B1 | 5/2006 |
| KR | 20070003657 A | 1/2007 |
| KR | 20080046577 A | 5/2008 |
| KR | 100841495 B1 | 6/2008 |
| KR | 20090042059 A | 4/2009 |
| KR | 20100090643 A | 8/2010 |
| KR | 20110007192 A | 1/2011 |
| KR | 20110009739 A | 1/2011 |
| KR | 20130007389 A | 1/2013 |
| KR | 20130093038 A | 8/2013 |
| KR | 20140047120 A | 4/2014 |
| KR | 101426105 B1 | 8/2014 |
| KR | 20140106442 A | 9/2014 |
| KR | 20140109816 A | 9/2014 |
| KR | 20150008065 A | 1/2015 |
| KR | 20150091260 A | 8/2015 |
| KR | 20150127145 A | 11/2015 |
| KR | 20150129781 A | 11/2015 |
| KR | 20150143480 A | 12/2015 |
| KR | 20160035995 A | 4/2016 |
| KR | 20160082969 A | 7/2016 |
| KR | 20170066218 A | 6/2017 |
| KR | 20170066225 A | 6/2017 |
| KR | 20180036263 A | 4/2018 |
| KR | 20180054917 A | 5/2018 |
| KR | 20180116438 A | 10/2018 |
| KR | 20190003528 A | 1/2019 |
| KR | 20190085654 A | 7/2019 |
| KR | 20190139594 A | 12/2019 |
| KR | 20190142242 A | 12/2019 |
| KR | 20210142118 A | 11/2021 |
| KR | 20220025020 A | 3/2022 |
| KR | 20220130783 A | 9/2022 |
| KR | 20230029977 A | 3/2023 |
| TW | 200504864 A | 2/2005 |
| TW | 200903686 A | 1/2009 |
| TW | 200947117 A | 11/2009 |
| TW | 201005568 A | 2/2010 |

(56) References Cited

FOREIGN PATENT DOCUMENTS

| | | |
|---|---|---|
| TW | 201145383 A | 12/2011 |
| TW | 201224190 A | 6/2012 |
| TW | I365354 B | 6/2012 |
| TW | 201241555 A | 10/2012 |
| TW | 201245918 A | 11/2012 |
| TW | 201246273 A | 11/2012 |
| TW | 201330093 A | 7/2013 |
| TW | 201430164 A | 8/2014 |
| TW | 201501179 A | 1/2015 |
| TW | I494689 B | 8/2015 |
| TW | 201631377 A | 9/2016 |
| TW | 201729006 A | 8/2017 |
| TW | 201734025 A | 10/2017 |
| TW | 201734667 A | 10/2017 |
| TW | 201811876 A | 4/2018 |
| TW | 201826034 A | 7/2018 |
| TW | 201830472 A | 8/2018 |
| TW | 201837066 A | 10/2018 |
| TW | 201930323 A | 8/2019 |
| TW | 201931011 A | 8/2019 |
| TW | 202001407 A | 1/2020 |
| WO | WO-03029015 A2 | 4/2003 |
| WO | WO-2004007797 A1 | 1/2004 |
| WO | WO-2004095551 A1 | 11/2004 |
| WO | WO-2007058120 A1 | 5/2007 |
| WO | WO-2007123539 A1 | 11/2007 |
| WO | WO-2008019362 A2 | 2/2008 |
| WO | WO-2008088076 A1 | 7/2008 |
| WO | WO-2011081151 A1 | 7/2011 |
| WO | WO-2011137059 A2 | 11/2011 |
| WO | WO-2012075249 A1 | 6/2012 |
| WO | WO-2012048094 A3 | 7/2012 |
| WO | WO-2013007442 A1 | 1/2013 |
| WO | WO-2013078211 A1 | 5/2013 |
| WO | WO-2013128313 A1 | 9/2013 |
| WO | WO-2013146595 A1 | 10/2013 |
| WO | WO-2014152023 A1 | 9/2014 |
| WO | WO-2015088613 A1 | 6/2015 |
| WO | WO-2016065120 A1 | 4/2016 |
| WO | WO-2016144960 A1 | 9/2016 |
| WO | WO-2016208300 A1 | 12/2016 |
| WO | WO-2017066319 A2 | 4/2017 |
| WO | WO-2017109040 A1 | 6/2017 |
| WO | WO-2017153725 A1 | 9/2017 |
| WO | WO-2017198418 A1 | 11/2017 |
| WO | WO-2018004551 A1 | 1/2018 |
| WO | WO-2018004646 A1 | 1/2018 |
| WO | WO-2018061670 A1 | 4/2018 |
| WO | WO-2018173446 A1 | 9/2018 |
| WO | WO-2018180663 A1 | 10/2018 |
| WO | WO-2018189413 A1 | 10/2018 |
| WO | WO-2019023797 A1 | 2/2019 |
| WO | WO-2019163455 A1 | 8/2019 |
| WO | WO-2019217749 A1 | 11/2019 |
| WO | WO-2019222320 A1 | 11/2019 |
| WO | WO-2019230462 A1 | 12/2019 |
| WO | WO-2019241402 A1 | 12/2019 |
| WO | WO-2020014179 A1 | 1/2020 |
| WO | WO-2020030855 A2 | 2/2020 |
| WO | WO-2020033602 A1 | 2/2020 |
| WO | WO-2020050035 A1 | 3/2020 |
| WO | WO-2020102085 A1 | 5/2020 |
| WO | WO-2020132281 A1 | 6/2020 |
| WO | WO-2020190941 A1 | 9/2020 |
| WO | WO-2020223011 A1 | 11/2020 |
| WO | WO-2020223152 A1 | 11/2020 |
| WO | WO-2020263750 A1 | 12/2020 |
| WO | WO-2020264158 A1 | 12/2020 |
| WO | WO-2020264557 A1 | 12/2020 |
| WO | WO-2020264571 A1 | 12/2020 |
| WO | WO-2021067632 A2 | 4/2021 |
| WO | WO-2021072042 A1 | 4/2021 |
| WO | WO-2021146138 A1 | 7/2021 |
| WO | WO-2021202681 A1 | 10/2021 |
| WO | WO-2021262371 A1 | 12/2021 |
| WO | WO-2021262529 A1 | 12/2021 |
| WO | WO-2022005808 A1 | 1/2022 |
| WO | WO-2022103764 A1 | 5/2022 |
| WO | WO-2022103949 A1 | 5/2022 |
| WO | WO-2022125388 A1 | 6/2022 |

OTHER PUBLICATIONS

Bespalov I., et al., "Key Role of Very Low Energy Electrons in Tin-Based Molecular Resists for Extreme Ultraviolet Nanolithography," ACS Applied Materials & Interfaces, 2020, vol. 12, pp. 9881-9889.

Cardineau, B. et al., "EUV Resists Based on Tin-oxo Clusters", Advances in Patterning Materials and Processes XXXI, Proceedings Of Spie, Apr. 4, 2014, vol. 9051, pp. 335-346.

Chiang C L., et al., "Secondary Electron Emission Characteristics of Oxide Electrodes In Flat Electron Emission Lamp," AIP Advances, 2016, vol. 6, 015317, 9 Pages.

Chinese First Office Action dated May 24, 2017 issued in Application No. CN 201510053668.7.

Chinese Second Office Action dated Feb. 28, 2018 issued in Application No. CN 201510053668.7.

CN Office Action dated Dec. 13, 2023 in CN Application No. 201810783756.6 with English translation.

CN Office Action dated Dec. 26, 2023 in CN Application No. 201980028279.5, with English Translation.

CN Office Action dated Jan. 3, 2024 in CN Application No. 202310318757.4 with English Translation.

CN Office Action dated Jan. 22, 2024 in CN Application No. 202080047683.X, with English Translation.

CN Office Action dated Jan. 23, 2024 in CN Application No. 202080046943.1 with English Translation.

CN Office Action dated Jun. 1, 2023, in application No. CN201810783756 with English translation.

CN Office Action dated Jun. 8, 2022 in Application No. CN202180002531.2 With English Translation.

CN Office Action dated Nov. 16, 2022, in Application No. CN202180002531.2 with English translation.

CN Office Action dated Nov. 18, 2022, in Application No. CN201810783756.6 with English translation.

Coons et al., (2010) "Comparison of EUV spectral and ion emission features from laser-produced Sn and Li plasmas," Extreme Ultraviolet (EUV) Lithography, Proc. Of SPIE, 7636:763636-1 to 763636-7.

Cui L F., et al., "Endohedral Stannaspherenes M@Sn12: A Rich Class of Stable Molecular Cage Clusters," Endohedral Tin Cages, 2007, vol. 46, pp. 742-745.

Dahuang, D., et al., Functional Thin Films and Their Deposition Preparation Techniques, Metallurgy Industrial Press, Jan. 31, 2013, pp. 450-454. [with English Translation].

Danilo D.E., et al., "Metal Containing Resist Readiness for HVM EUV Lithography", Journal of Photopolymer Science and Technology, 2016, vol. 29(3), pp. 501-507.

EP Extended European Search Report dated Jul. 13, 2023, in Application No. EP20831843.6.

EP Extended European Search report dated Jun. 23, 2023, in Application No. EP20831420.3.

EP Extended European Search report dated Jun. 26, 2023, in Application No. 20831242.1.

EP Extended European Search Report dated Jun. 26, 2023, in Application No. 20831343.7.

EP Extended European Search report dated Jun. 28, 2023, in Application No. EP 20832501.9.

EP Extended European Search report dated Nov. 29, 2023 in EP Application No. 23173688.5.

EP Extended European Search report dated Oct. 25, 2023, in Application No. EP21837274.6.

EP Extended European Search report dated Sep. 25, 2023, in Application No. EP20870849.5.

EP Partial European Search Report dated Aug. 29, 2023, in Application No. 23173688.5.

European Search Report dated Feb. 15, 2022, in Application No. EP21741104.

(56) References Cited

OTHER PUBLICATIONS

European Office Action dated Feb. 25, 2022 in Application No. 21741104.
Extended European Search Report dated Dec. 23, 2021, in Application No. EP19800353.5.
Fan, Y. et al., (2016) "Benchmarking Study of EUV Resists for NXE:3300B," Proc. of SPIE, 9776:97760W-1 to 97760W-11 [Downloaded From http://proceedings.spiedigitallibrary.org/ on Mar. 30, 2017].
Fitzgerald C B., et al., "Magnetism in Dilute Magnetic Oxide Thin Films Based on SnO2," The American Physical Society, 2006, vol. 74, 115307, 10 Pages.
Fujifilm Corp., (Presentation) "Negative tone development process for double patterning," 5th International Symposium on Immersion Lithography, Sep. 2008, Presentation Slides No. P-1-P-27.
Fujifilm Corp., (Safety Data Sheet) Name of Substance: n-Butyl acetate; Trade Name of Substance: FN-DP001 Ultra Pure Developer, Revision Date: Nov. 25, 2013, MSDS file: 16328_GB_EN_V2.0, pp. 1-9.
Gangnaik, A.S. et al., (Jan. 12, 2017) "New Generation Electron Beam Resists: A Review," Chem. Mater., 29:1898-1917.
Gerritsen et al., (Apr. 1, 1986) "Laser-generated plasma as soft x-ray source," J. Appl. Phys., 59(7):2337-2344.
Gross, R.A. et al., "Biodegradable Polymers for the Environment", Science, Aug. 2, 2002, vol. 297, No. 5582, pp. 803-807.
Hamley, I.W., "Nanostructure fabrication using block copolymers", Nanotechnology. Sep. 2003. 17;14(10):R39-R54.
Harrisson, S. et al., "RAFT Polymerization of Vinyl Esters: Synthesis and Applications", Polymers, 2014, vol. 6, No. 5, pp. 1437-1488.
Hench, L.L. and West, J.K., "The sol-gel process," Chemical reviews, Jan. 1, 1990; 90(1) pp. 33-72.
International Preliminary Report on Patentability dated Oct. 13, 2022, in PCT Application No. PCT/US2021/023493.
International Preliminary Report on Patentability dated Oct. 13, 2022, in PCT Application No. PCT/US2021/025111.
International Search Report and Written Opinion dated Aug. 4, 2021, in PCT Application No. PCT/US2021/023493.
International Search Report and Written Opinion dated Jul. 13, 2021, in PCT Application No. PCT/US2021/023901.
International Search Report and Written Opinion dated Jul. 20, 2021, in PCT Application No. PCT/US2021/025111.
International Search Report and Written Opinion dated Mar. 4, 2022, in Application No. PCT/US2021/058647.
International Search Report and Written Opinion dated May 18, 2022, in International Application No. PCT/US2022/014984.
International Search Report and Written Opinion dated Nov. 11, 2022 in PCT Application No. PCT/US2022/037733.
International Search Report and Written Opinion dated Oct. 8, 2020 in Application No. WO2020US38968.
International Preliminary Report on Patentability dated Jul. 1, 2021 issued in Application No. PCT/US2019/067540.
International Preliminary Report on Patentability dated May 27, 2021 issued in Application No. PCT/US2019/060742.
International Search Report and Written Opinion dated May 17, 2021 issued in Application No. PCT/US2021/015656.
International Preliminary Report on Patentability and Written Opinion dated Feb. 8, 2024 in PCT Application No. PCT/US2022/037393.
International Preliminary Report on Patentability and Written Opinion dated Feb. 8, 2024 in PCT Application No. PCT/US2022/037733.
International Preliminary Report on Patentability dated Apr. 14, 2022 issued in PCT Application No. PCT/US2020/053856.
International Preliminary Report on Patentability dated Aug. 18, 2022 in PCT Application No. PCT/US2021/015656.
International Preliminary Report on Patentability dated Aug. 24, 2023, in PCT Application No. PCT/US2022/014984.
International Preliminary Report on Patentability dated Jan. 27, 2021 in Application PCT/US2020/054730.
International Preliminary Report on Patentability dated Jan. 5, 2023 in PCT Application No. PCT/US2021/034019.
International Preliminary Report on Patentability dated Jan. 5, 2023 in PCT Application No. PCT/US2021/037924.
International Preliminary Report on Patentability dated Jan. 19, 2023 in PCT Application No. PCT/US2021/040381.
International Preliminary Report on Patentability dated Jan. 26, 2023 in PCT Application No. PCT/US2021/042103.
International Preliminary Report on Patentability dated Jan. 26, 2023 in PCT Application No. PCT/US2021/042104.
International Preliminary Report on Patentability dated Jan. 26, 2023 in PCT Application No. PCT/US2021/042106.
International Preliminary Report on Patentability dated Jan. 26, 2023 in PCT Application No. PCT/US2021/042107.
International Preliminary Report on Patentability dated Jan. 26, 2023 in PCT Application No. PCT/US2021/042108.
International Preliminary Report on Patentability dated Jan. 6, 2022 in PCT Application No. PCT/US2020/038968.
International Preliminary Report on Patentability dated Jan. 6, 2022 in PCT Application No. PCT/US2020/039615.
International Preliminary Report on Patentability dated Jan. 6, 2022 in PCT Application No. PCT/US2020/070171.
International Preliminary Report on Patentability dated Jan. 6, 2022 in PCT Application No. PCT/US2020/070172.
International Preliminary Report on Patentability dated Jan. 6, 2022 in PCT Application No. PCT/US2020/070187.
International Preliminary Report on Patentability dated Jul. 28, 2022 in PCT Application No. PCT/US2021/012953.
International Preliminary Report on Patentability dated Jun. 22, 2023, in Application No. PCT/US2021/061751.
International Preliminary Report on Patentability dated May 25, 2023, in Application No. PCT/US2021/058647.
International Preliminary Report on Patentability dated Nov. 11, 2021, for International Application No. PCT/US2020/028151.
International Preliminary Report on Patentability dated Nov. 28, 2019 issued in Application No. PCT/US2018/032783.
International Preliminary Report on Patentability dated Nov. 7, 2019 issued in Application No. PCT/US2018/028192.
International Preliminary Report on Patentability dated Oct. 13, 2022, in PCT Application No. PCT/US2021/023901.
International Preliminary Report on Patentability dated Sep. 7, 2023, in PCT Application No. PCT/US2022/014281.
International Preliminary Report on Patentability dated Sep. 9, 2022, in PCT Application No. PCT/US2021/019245.
International Preliminary Report on Patentability dated Sep. 30, 2021 issued in Application No. PCT/US2020/023146.
International Search Report and Written Opinion dated May 12, 2021 issued in Application No. PCT/US2021/012953.
International Search Report and Written Opinion dated Apr. 10, 2020 issued in Application No. PCT/US2019/060742.
International Search Report and Written Opinion dated Apr. 17, 2023, in Application No. PCT/US2022/081390.
International Search Report and Written Opinion dated Apr. 17, 2023 in PCT Application No. PCT/US2022/081376.
International Search Report and Written Opinion dated Apr. 19, 2023, in Application No. PCT/US2022/081845.
International Search Report and Written Opinion dated Apr. 24, 2020 issued in Application No. PCT/US2019/067540.
International Search Report and Written Opinion dated Aug. 17, 2023, in Application No. PCT/US2023/019871.
International Search Report and Written Opinion dated Aug. 22, 2019 issued in Application No. PCT/US2019/031618.
International Search Report and Written Opinion dated Aug. 8, 2018 issued in Application No. PCT/US2018/028192.
International Search Report and Written Opinion dated Feb. 1, 2024 in PCT Application No. PCT/US2023/034545.
International Search Report and Written Opinion dated Jan. 10, 2024 in PCT Application No. PCT/US2023/033020.
International Search Report and Written Opinion dated Jan. 27, 2021 issued in Application No. PCT/US2020/054730.
International Search Report and Written Opinion dated Jul. 17, 2020 issued in Application No. PCT/US2020/023146.

(56) References Cited

OTHER PUBLICATIONS

International Search Report and Written Opinion dated Jul. 31, 2020, in PCT Application No. PCT/US2020/028151.
International Search Report and Written Opinion dated Mar. 23, 2021 issued in Application No. PCT/US2020/053856.
International Search Report and Written Opinion dated Mar. 24, 2022, for International Application No. PCT/US2021/061751.
International Search Report and Written Opinion dated May 3, 2023, in Application No. PCT/US2023/060306.
International Search Report and Written Opinion dated May 16, 2022, In International Application No. PCT/US2022/014281.
International Search Report and Written Opinion dated Nov. 3, 2021, in PCT Application No. PCT/US2021/042108.
International Search Report and Written Opinion dated Nov. 4, 2021 in PCT Application No. PCT/US2021/042103.
International Search Report and Written Opinion dated Nov. 4, 2021 in PCT Application No. PCT/US2021/042106.
International Search Report and Written Opinion dated Nov. 4, 2021 in PCT Application No. PCT/US2021/042107.
International Search Report and Written Opinion dated Nov. 7, 2022 in PCT Application No. PCT/US2022/037393.
International Search Report and Written Opinion dated Nov. 10, 2021, in PCT Application No. PCT/US2021/042104.
International Search Report and Written Opinion dated Oct. 13, 2021, in application No. PCT/US2021/037924.
International Search Report and Written Opinion dated Oct. 13, 2023 in PCT Application No. PCT/US2023/069419.
International Search Report and Written Opinion dated Oct. 16, 2018 issued in Application No. PCT/US2018/032783.
International Search Report and Written Opinion dated Oct. 16, 2020 issued in Application No. PCT/US2020/039615.
International Search Report and Written Opinion dated Oct. 16, 2020 issued in Application No. PCT/US2020/070171.
International Search Report and Written Opinion dated Oct. 16, 2020 issued in Application No. PCT/US2020/070172.
International Search Report and Written Opinion dated Oct. 16, 2020 issued in Application No. PCT/US2020/070187.
International Search Report and Written Opinion dated Oct. 28, 2021 in PCT Application No. PCT/US2021/040381.
International Search Report and Written Opinion dated Oct. 8, 2020 issued in Application No. PCT/US2020/038968.
International Search Report and Written Opinion dated Sep. 15, 2021, in PCT Application No. PCT/US2021/034019.
Jalife S., et al., "Noble Gas Endohedral Fullerenes," Chemical Science, 2020, vol. 11, pp. 6642-6652.
Japanese Decision to Grant dated Feb. 12, 2019 issued in Application No. JP 2015-016254.
Japanese Decision to Grant dated May 3, 2021 issued in Application No. JP 2016-220096.
Japanese First Office Action dated Oct. 30, 2018 issued in Application No. JP 2015-016254.
Japanese First Office Action dated Sep. 15, 2020 issued in Application No. JP 2016-220096.
Joo, W. et al., "Synthesis of Unzipping Polyester and a Study of its Photochemistry", Journal of the American Chemical Society, 2019, vol. 141, No. 37, pp. 14736-14741.
JP Office Action dated Jul. 26, 2022 in Application No. JP2021102822 With English translation.
JP Office Action dated Nov. 15, 2022, in Application No. JP2021-176082 with English translation.
JP Office Action dated Apr. 11, 2023 in Application No. JP2021-176082 with English translation.
JP Office Action dated Apr. 27, 2023 in Application No. JP2021-575910 with English translation.
JP Office Action dated Dec. 26, 2023 in JP Application No. 20210576241, with English Translation.
JP Office Action dated Dec. 26, 2023 in JP Application No. 2021-526240, with English Translation.
JP Office Action dated Feb. 13, 2024 in JP Application No. 2023-63868, with English Translation.
JP Office Action dated Feb. 28, 2023 in Application No. JP2020-562160 with English translation.
JP Office Action dated Jan. 9, 2024 in JP Application No. 2023-179933, with English Translation.
JP Office Action dated Jan. 9, 2024 in JP Application No. 2023-184334 with English Translation.
JP Office Action dated Jan. 17, 2023, in Application No. JP2022-552422 with English translation.
JP Office Action dated Jun. 14, 2022, in Application No. JP20190563508 with English translation.
JP Office Action dated Jun. 27, 2023, in Application No. JP2022-552422 with English translation.
JP Office Action dated Jun. 27, 2023, in application No. JP2023-63868 with English translation.
JP Office Action dated Jun. 28, 2022 in Application No. JP2021560945 with English translation.
JP Office Action dated Nov. 14, 2023, in JP Application No. 2021-0575910 with English Translation.
JP Office Action dated Nov. 14, 2023 in JP Application No. 2022-559416, with English Translation.
JP Office Action dated Oct. 3, 2023 in Application No. JP2021-176082 with English Translation.
JP Office Action dated Oct. 10, 2023 in Application No. JP2022-552422 with English Translation.
JP Office Action dated Sep. 19, 2023 in Application No. JP2020-562160 with English translation.
Klepper, K.B. et al., "Atomic Layer Deposition of Organic-inorganic Hybrid Materials Based on Saturated Linear Carboxylic Acids", Dalton Transactions, May 7, 2011, vol. 40, No. 17, pp. 4337-4748.
Komen C V., et al., "Structure-Magnetic Property Relationship Intransition Metal (M=V,Cr, Mn, Fe, Co, Ni) Doped Sno2 Nanoparticles," Journal of Applied Physics, 2008, vol. 103, 5 Pages.
Korean Decision for Grant dated Sep. 2, 2021 issued in Application No. KR 10-2015-0015184.
Korean First Office Action dated Dec. 22, 2020 issued in Application No. KR 10-2015-0015184.
Korean Second Office Action dated Jul. 27, 2021 issued in Application No. KR 10-2015-0015184.
KR Office Action dated Feb. 8, 2022, in Application No. KR10-2021-7030794 with English Translation.
KR Office Action dated Aug. 11, 2023, in Application No. KR10-2023-7011840 with English translation.
KR Office Action dated Jan. 2, 2023 in Application No. KR10-2022-7027233 with English translation.
KR Office Action dated May 9, 2022, in Application No. KR1020217030794 with English translation.
KR Office Action dated Nov. 21, 2023 in KR Application No. 10-2022-7002869 with English Translation.
KR Office Action dated Nov. 21, 2023 in KR Application No. 10-2022-7029421 with English Translation.
KR Office Action dated Sep. 28, 2022, in Application No. KR10-2022-7027233 with English translation.
Kvon V., et al., "Secondary Electron Emission Of Tin And Tin-Lithium Under Low Energy Helium Plasma Exposure," Nuclear Materials and Energy, 2017, vol. 13, pp. 21-27.
Kwon, J., et al., "Substrate Selectivity of (tBu-Allyl)Co(C0)3 during Thermal Atomic Layer Deposition of Cobalt," Chemistry of Materials, Mar. 27, 2012; 24(6): pp. 1025-1030.
Lemaire, P.C., et al., "Understanding inherent substrate selectivity during atomic layer deposition: Effect of surface preparation, hydroxyl density, and metal oxide composition on nucleation mechanisms during tungsten ALD" The Journal of chemical physics, Feb. 7, 2017, 146(5):052811.
Lin Y., et al., "A New Examination Of Secondary Electron Yield Data," Surface And Interface Analysis, 2005, vol. 37, pp. 895-900.
Lu, Y., et al., "Continuous formation of supported cubic and hexagonal mesoporous films by sol-gel dip-coating" Nature, Sep. 1997, 389(6649), pp. 364-368.
Mackus, A.J., et al. "The use of atomic layer deposition in advanced nanopatterning", Nanoscale. Jul. 25, 2014; 6(19):10941-60.
Mai, L. et al., "Atomic/molecular Layer Deposition of Hybrid Inorganic-organic Thin Films from Erbium Guanidinate Precursor",

(56) References Cited

OTHER PUBLICATIONS

Journal of Materials Science, 2017, vol. 52, No. 11, pp. 6216-6224. https://doi.org/10.1007/s10853-017-0855-6.
McGinniss, Vincent D., (1978) "Light Sources," Edited by: Pappas, S. Peter, UV Curing: Science and Technology; technology marketing corporation, 642 Westover Rd., Stamford, CT, USA; pp. 96-129.
Meng, X., "An Overview of Molecular Layer Deposition for Organic and Organic-inorganic Hybrid Materials: Mechanisms, Growth Characteristics, and Promising Applications", Journal of Materials Chemistry A, 2017, vol. 5, pp. 18326-18378.
Molloy, K. C., "Precursors for the Formation of Tin (IV) Oxide and Related Materials", Journal of Chemical Research, 2008, vol. 2008, No. 10, pp. 549-554.
Nazarov, D.V., et al., "Atomic layer deposition of tin dioxide nanofilms: A review", Rev. Adv. Mater. Sci. Jun. 1, 2015; 40(3):262-75.
Notice of Allowance dated Dec. 9, 2021 in U.S. Appl. No. 17/310,635.
Ogale S B., et al., "High Temperature Ferromagnetism with Giant Magnetic Moment in Transparent Co-doped $SnO_2$-δ," Physical Review Letters, 2003, 17 Pages.
Pedersen A., et al., "Lithiation of Tin Oxide: A Computational Study," Integrated Systems Laboratory, 2014, 20 Pages.
Rantala, et al., "New resist and underlayer approaches toward EUV lithography," Proc. SPIE 10809, International Conference on Extreme Ultraviolet Lithography 2018, pp. 108090X-1-108090X-8. (Oct. 11, 2018).
Rothschild, et al., "Liquid immersion lithography: Why, how, and when?" Journal Vacuum Science Technology, Nov./Dec. 2004, pp. 2877-2881.
Santillan et al., "In Situ analysis of negative-tone resist pattern formation using organic-solvent-based developer process," Applied Physics Express, vol. 7 (2014), pp. 016501-1-016501-4. [retrieved Sep. 20, 2017] URL: http:dx.doi.org/10.7567/APEX.7.016501.
Saunders M., et al., "Noble Gas Atoms Inside Fullerenes," Science, 1996, vol. 271, pp. 1693-1697.
Singh R ., "Unexpected Magnetism In Nanomaterials," Journal of Magnetism and Magnetic Materials, 2013, vol. 346, pp. 58-73.
Spitzer et al., (Mar. 1, 1986) "Conversion efficiencies from laser-produced plasmas in the extreme ultraviolet regime," J. Appl. Phys., 79(5):2251-2258.
Stowers et al.; "Directly patterned inorganic hard mask for EUV lithography"; proceedings of the SPIE 7969; Extreme Ultraviolet (EUV) Lithography 11, 796915-1-11 (Apr. 7, 2011), event: SPI E Advanced Lithography, 2011, San Jose California.
Stulen, et al., "Extreme Ultraviolet Lithography" IEEE Journal of Quantum Electronics, vol. 35, No. 5, May 1999, pp. 694-699.
Sundberg, P. et al., "Organic and Inorganic-organic Thin Film Structures by Molecular Layer Deposition: A Review", Beilstein Journal of Nanotechnology, 2014, vol. 5, pp. 1104-1136.
Taiwanese First Office Action dated Aug. 10, 2020 issued in Application No. TW 105137362.
Taiwanese First Office Action dated May 31, 2018 issued in Application No. TW 104103153.
Taiwanese Office Action dated Apr. 10, 2023 in TW Application No. TW108140940 with English translation.
Taiwanese Second Office Action dated Nov. 18, 2020 issued in Application No. TW 105137362.
Tian Y F., et al., "Oxide Magnetic Semiconductors: Materials, Properties, And Devices," Magnetism, Magnetic Materials, And Interdisciplinary Research, 2013, vol. 22(8), 2 Pages.
TW Office Action dated Jan. 9, 2023 In Application No. TW20190116155 with English translation.
TW Office Action dated Sep. 5, 2022, in Application No. TW110101388 with English translation.
TW Office Action dated Sep. 8, 2022 in Application No. TW111123386 with English translation.
TW First Office Action dated Oct. 6, 2021, in application No. TW20180116415 with English translation.
TW Office Action dated Apr. 29, 2022 in Application No. TW110118172 with English translation.
TW Office Action dated Aug. 17, 2023, in application No. TW110124741 with Translation.
TW Office Action dated Dec. 20, 2023, in TW Application No. 109121579 with English Translation.
TW Office Action dated Jan. 2, 2024 in TW Application No. 109121639, with English Translation.
TW Office Action dated Jan. 11, 2024 in TW Application No. 108146890, with English Translation.
TW Office Action dated Jan. 13, 2023, in Application No. TW110124741 with English translation.
TW Office Action dated Jan. 19, 2023 in Application No. TW110141961 with English translation.
TW Office Action dated Jun. 3, 2022, in Application No. TW110143913 with English translation.
TW Office Action dated Mar. 7, 2022, in Application No. TW110101388 with English translation.
TW Office Action dated May 16, 2023, in Application No. TW20190146890 with English translation.
TW Office Action dated Oct. 13, 2023, in application No. TW109121680 with English Translation.
TW Office Action dated Oct. 30, 2023, in application No. TW108116155 with English Translation.
U.S. Corrected Notice of Allowance dated Jan. 31, 2024 in U.S. Appl. No. 17/309,247.
US Final Office Action, dated Feb. 5, 2019 issued in U.S. Appl. No. 15/495,701.
US Final Office Action, dated May 11, 2017, issued in U.S. Appl. No. 14/610,038.
U.S. Final Office Action dated May 12, 2023 in U.S. Appl. No. 17/455,185.
U.S. Final Office Action dated Nov. 9, 2023 in U.S. Appl. No. 17/455,185.
US Final Office Action, dated Sep. 10, 2018, issued in U.S. Appl. No. 15/691,659.
U.S. Non-Final Office Action dated Feb. 1, 2024 in U.S. Appl. No. 17/759,281.
U.S. Non-Final office Action dated Feb. 7, 2023 in U.S. Appl. No. 17/455,185.
U.S. Non-Final Office Action dated May 11, 2023, in U.S. Appl. No. 17/452,365.
U.S. Non-Final Office Action dated Nov. 6, 2023, in U.S. Appl. No. 17/309,587.
U.S. Non-Final Office Action dated Oct. 13, 2023, in U.S. Appl. No. 18/184,545.
U.S. Non-Final Office Action dated Oct. 20, 2023, in U.S. Appl. No. 18/297,989.
U.S. Non-Final Office Action dated Oct. 20, 2023, in U.S. Appl. No. 18/298,003.
U.S. Non-Final Office Action dated Oct. 26, 2023, in U.S. Appl. No. 17/596,648.
U.S. Non-Final Office Action dated Oct. 26, 2023, in U.S. Appl. No. 17/596,928.
U.S. Non-Final Office Action dated Sep. 13, 2023, in U.S. Appl. No. 17/596,651.
U.S. Non-Final Office Action dated Sep. 28, 2023, in U.S. Appl. No. 15/733,598.
US Notice of Allowance, dated Apr. 25, 2018 issued in U.S. Appl. No. 14/948,109.
U.S. Notice of Allowance dated Aug. 21, 2023 in U.S. Appl. No. 17/452,365.
US Notice of Allowance, dated Aug. 22, 2017, issued in U.S. Appl. No. 14/610,038.
U.S. Notice of Allowance dated Dec. 4, 2023 in U.S. Appl. No. 17/452,365.
U.S. Notice of Allowance dated Feb. 22, 2022 in U.S. Appl. No. 17/310,635.
US Notice of Allowance, dated Jul. 28, 2020, issued in U.S. Appl. No. 16/206,959.
US Notice of Allowance, dated Jun. 10, 2020 issued in U.S. Appl. No. 15/979,340.
U.S. Notice of Allowance dated Oct. 18, 2023 in U.S. Appl. No. 17/309,247.

(56) References Cited

OTHER PUBLICATIONS

US Notice of Allowance dated Sep. 15, 2021, issued in U.S. Appl. No. 16/691,508.
US Notice of Allowance, dated Sep. 19, 2019, issued in U.S. Appl. No. 15/691,659.
US Notice of Allowance, dated Sep. 30, 2021 issued in U.S. Appl. No. 17/008,095.
US Notice of Allowance dated Sep. 9, 2021, issued in U.S. Appl. No. 16/691,508.
US Office Action, dated Apr. 9, 2019, issued in U.S. Appl. No. 15/691,659.
US Office Action, dated Aug. 9, 2018 issued in U.S. Appl. No. 15/495,701.
US Office Action, dated Jan. 23, 2017, issued in U.S. Appl. No. 14/610,038.
US Office Action, dated Mar. 18, 2021 issued in U.S. Appl. No. 17/008,095.
US Office Action, dated Mar. 5, 2020, issued in U.S. Appl. No. 16/206,959.
US Office Action dated May 14, 2021, issued in U.S. Appl. No. 16/691,508.
US Office Action, dated May 21, 2018, issued in U.S. Appl. No. 15/691,659.
US Office Action, dated Nov. 2, 2017, issued in U.S. Appl. No. 14/948,109.
US Office Action, dated Nov. 6, 2019 issued in U.S. Appl. No. 15/979,340.
U.S. Appl. No. 17/905,754, inventors Kanakasabapathy et al., filed on Sep. 6, 2022.
U.S. Appl. No. 18/005,571 inventors Hansen et al., filed on Jan. 13, 2023.
U.S. Appl. No. 18/005,594, inventors Hansen et al., filed on Jan. 13, 2023.
U.S. Appl. No. 18/264,391, inventors Kanakasabapathy S K, et al., filed on Aug. 4, 2023.
U.S. Appl. No. 18/298,003, inventors Marks et al., filed on Apr. 10, 2023.
U.S. Appl. No. 18/377,267, inventors Yu J, et al., filed on Oct. 5, 2023.
U.S. Appl. No. 18/546,879, inventors Weidman T W, et al., filed on Aug. 17, 2023.
U.S. Appl. No. 18/580,334, inventors Peter D, et al., filed on Jan. 18, 2024.
U.S. Restriction Requirement dated Nov. 14, 2022 in U.S. Appl. No. 17/455,185.
U.S. Restriction requirement dated Aug. 4, 2023, in U.S. Appl. No. 18/297,989.
U.S Restriction requirement dated Aug. 18, 2023 in U.S. Appl. No. 18/298,003.
U.S. Restriction Requirement dated Nov. 20, 2023 in U.S. Appl. No. 17/759,281.
U.S. Restriction requirement dated Sep. 7, 2023 in U.S. Appl. No. 17/309,587.
U.S. Supplemental Notice of Allowability dated Jan. 26, 2022, in U.S. Appl. No. 17/008,095.
Wang, et al., "Lithography Simulation for the Fabrication of Silicon Photonic Devices with Deep-Ultraviolet Lithography" IEEE, (2012) pp. 288-290.
Xu, et al., "Underlayer designs to enhance the performance of EUV resists," Proceedings of SPIE, vol. 7273, 2009, pp. 727311-1-727311-11.
Yoon, K. et al., "Fabrication of a New Type of Organic-inorganic Hybrid Superlattice Films Combined With Titanium Oxide and Polydiacetylene", Nanoscale Research Letters, Jan. 5, 2012, vol. 7, No. 71, 6 pages.
Zhou, H. et al., "Molecular Layer Deposition of Functional Thin Films for Advanced Lithographic Patterning", ACS Applied Materials & Interfaces, 2011, vol. 3, No. 2, pp. 505-511.
JP Office Action dated Apr. 2, 2024 in JP Application No. 2022-559416, with English Translation.
TW Office Action dated Apr. 19, 2024 in TW Application No. 112146727 with English translation.
TW Office Action dated Apr. 22, 2024 in TW Application No. 112126160 with English translation.
CN Office Action dated Apr. 22, 2024 in CN Application No. 201980085227.1 with English translation.
CN Office Action dated Apr. 24, 2024 in CN Application No. 201980075389.7 with English translation.
CN Office Action dated Mar. 14, 2024 in CN Application No. 201810783756.6, with English Translation.
JP Office Action dated Apr. 30, 2024 in JP Application No. 2021-577241 with English translation.
JP Office Action dated Mar. 5, 2024 in JP Application No. 2021-575910, with English Translation.
JP Office Action dated Mar. 22, 2024 in JP Application No. 2020-562160, with English Translation.
JP Office Action dated Mar. 26, 2024 in JP Application No. 2021-576240, with English Translation.
KR Office Action dated Apr. 5, 2024 in KR Application No. 10-2021-7036139, with English Translation.
KR Office Action dated Apr. 9, 2024 in KR Application No. 10-2023-7038357 with English Translation.
KR Office Action dated Apr. 23, 2024 in KR Application No. 10-2016-0152489 with English translation.
KR Office Action dated Feb. 29, 2024 in KR Application No. 10-2022-7026649, with English Translation.
KR Office Action dated Mar. 14, 2024 in KR Application No. 10-2021-7022858, with English Translation.
SG Written Opinion dated Apr. 16, 2024 in SG Application No. 11202114197Y.
TW Office Action dated Feb. 21, 2024 in TW Application No. 109121664 with English translation.
TW Office Action dated Feb. 29, 2024 in TW Application No. 109134377, with English Translation.
TW Office Action dated Mar. 11, 2024 in TW Application No. 109121649, with English Translation.
TW Office Action dated Mar. 21, 2024 in TW Application No. 108146890, with English Translation.
U.S. Advisory Action dated Apr. 16, 2024 in U.S. Appl. No. 17/596,648.
U.S. Final Office Action dated Apr. 10, 2024 in U.S. Appl. No. 15/733,598.
U.S. Final Office Action dated Apr. 23, 2024 in U.S. Appl. No. 17/596,928.
U.S. Final Office Action dated Feb. 27, 2024 in U.S. Appl. No. 18/298,003.
U.S. Final Office Action dated Mar. 5, 2024 in U.S. Appl. No. 17/596,648.
U.S. Final Office Action dated Mar. 14, 2024 in U.S. Appl. No. 17/596,651.
U.S. Final Office Action dated May 3, 2024 in U.S. Appl. No. 18/297,989.
U.S. Non-Final Office Action dated Mar. 4, 2024 in U.S. Appl. No. 17/758,125.
U.S. Non-Final Office Action dated Mar. 4, 2024 in U.S. Appl. No. 18/377,267.
U.S. Notice of Allowance dated Mar. 6, 2024 in U.S. Appl. No. 18/184,545.
U.S. Notice of Allowance dated Mar. 13, 2024 in U.S. Appl. No. 18/184,545.
U.S. Notice of Allowance dated Mar. 15, 2024 in U.S. Appl. No. 17/452,365.
U.S. Patent Application No. 18/628, 111, inventors Tan S.S, et al., filed on Apr. 5, 2024.
U.S. Restriction Requirement dated Apr. 8, 2024 in U.S. Appl. No. 17/754,019.
Alf, M.E., et al., "Chemical Vapor Deposition of Conformal, Functional, and Responsive Polymer Films," Advanced Materials, 2010, vol. 22(18), pp. 1993-2027.
JP Office Action dated May 14, 2024 in JP Application No. 2021-576241 with English translation.
JP Office Action dated May 14, 2024 in JP Application No. 2021-576792 with English translation.

(56) References Cited

OTHER PUBLICATIONS

KR Office Action dated May 24, 2024 in KR Application No. 10-2020-7035732 with English translation.
KR Prior Art Search Report dated Apr. 3, 2023, in application No. KR 10-2022-7029421 with English translation.
KR Prior Art Search Report dated Aug. 25, 2023, in Application No. KR10-2021-7022858 with English translation.
KR Prior Art Search Report dated Nov. 14, 2023, in Application No. KR10-2023-7038357 with English translation.
KR Prior Art Search Report dated Oct. 30, 2023 in KR Application No. 10-2023-7036296 with English translation.
SG Search Report and Written Opinion dated May 14, 2024 in SG Application No. 11202251864Y.
Singapore Search Report and Written Opinion dated Mar. 17, 2023 issued in Application No. SG11202114197Y.
U.S. Advisory Action dated Jun. 10, 2024 in U.S. Appl. No. 17/596,651.
U.S. Advisory Action dated May 7, 2024 in U.S. Appl. No. 18/298,003.
U.S. Final Office Action dated May 9, 2024 in U.S. Appl. No. 17/309,587.
U.S. Non-Final Office Action dated Jun. 21, 2024 in U.S. Appl. No. 17/596,648.
U.S. Non-Final Office Action dated May 29, 2024 in U.S. Appl. No. 18/298,003.
CN Office Action dated Jul. 23, 2024 in CN Application No. 201810783756.6 with English translation.
International Preliminary Report on Patentability and Written Opinion dated Dec. 28, 2023 in PCT Application No. PCT/US2022/033488.
International Preliminary Report on Patentability and Written Opinion dated Jun. 27, 2024 in PCT Application No. PCT/US2022/081376.
International Preliminary Report on Patentability and Written Opinion dated Jun. 27, 2024 in PCT Application No. PCT/US2022/081390.
International Preliminary Report on Patentability and Written Opinion dated Jun. 27, 2024 in PCT Application No. PCT/US2022/081845.
International Search Report and Written Opinion dated Jul. 4, 2024 in PCT Application No. PCT/US2024/019555.
International Search Report and Written Opinion dated Oct. 17, 2022 in PCT Application No. PCT/US2022/033488.
KR Notice of Allowance dated Aug. 1, 2024 in KR Application No. 10-2024-7012307, with English Translation.
KR Office Action dated Jul. 12, 2024 in KR Application No. 10-2022-7029421 with English translation.
KR Office Action dated Jul. 12, 2024 in KR Application No. 10-2023-7036296 with English translation.
KR Office Action dated Jun. 24, 2024 in KR Application No. 10-2022-7002869, with English Translation.
TW Office Action dated Jul. 2, 2024 in TW Application No. 109134940 with English translation.
TW Office Action dated Jul. 9, 2024 in TW Application No. 110111086 with English translation.
TW Office Action dated Jun. 27, 2024 in TW Application No. 113107490 with English translation.
U.S. Final Office Action dated Jun. 21, 2024 in U.S. Appl. No. 18/377,267.
U.S. Final Office Action dated Jun. 27, 2024 in U.S. Appl. No. 17/759,281.
U.S. Notice of Allowance dated Aug. 7, 2024 in U.S. Appl. No. 18/184,545.
U.S. Notice of Allowance dated Aug. 16, 2024 in U.S. Appl. No. 17/596,648.
U.S. Appl. No. 18/569,213, inventors Kanakasabapathy S K, et al., filed on Dec. 11, 2023.
CN Office Action dated Dec. 2, 2024 in CN Application No. 202211142175.7, with English Translation.
CN Office Action dated Sep. 14, 2024 in CN Application No. 202310318757.4 with English translation.
CN Office Action dated Sep. 23, 2024 in CN Application No. 202080046943.1 with English translation.
International Preliminary Report on Patentability and Written Opinion dated Nov. 14, 2024 in PCT Application No. PCT/US2023/019871.
International Search Report and Written Opinion dated Nov. 20, 2024 in PCT Application No. PCT/US2024/039915.
JP Notice of Allowances dated Aug. 27, 2024 in JP Application No. 2022-559416 with English translation.
JP Notice of Allowances dated Sep. 3, 2024 in JP Application No. 2023-63868 with English translation.
JP Office Action dated Nov. 12, 2024 in JP Application No. 2024-522188 with English translation.
KR Notice of Allowance dated Dec. 12, 2024 in KR Application No. 10-2016- 0152489, with English Translation.
KR Notice of Allowances dated Oct. 16, 2024 in KR Application No. 10-2022- 7002869 with English Translation.
KR Office Action dated Nov. 28, 2024 in KR Application No. 10-2022-7014896, with English Translation.
SG Written Opinion dated Aug. 30, 2024 in SG Application No. 11202114183P.
TW Office Action dated Nov. 26, 2024 in TW Application No. 110126445, with English Translation.
U.S. Advisory Action dated Sep. 3, 2024 in U.S. Appl. No. 18/377,267.
U.S. Advisory Action dated Sep. 5, 2024 in U.S. Appl. No. 17/759,281.
U.S. Corrected Notice of Allowance dated Aug. 29, 2024 in U.S. Appl. No. 17/596,648.
U.S. Corrected Notice of Allowance dated Dec. 30, 2024 in U.S. Appl. No. 17/309,587.
U.S. Corrected Notice of Allowance dated Dec. 31, 2024 in U.S. Appl. No. 18/377,267.
U.S. Corrected Notice of Allowance dated Nov. 21, 2024 in U.S. Appl. No. 17/309,587.
U.S. Non-Final Office Action dated Oct. 1, 2024 in U.S. Appl. No. 17/309,587.
U.S. Notice of Allowance dated Dec. 13, 2024 in U.S. Appl. No. 18/377,267.
U.S. Notice of Allowance dated Nov. 14, 2024 in U.S. Appl. No. 17/309,587.
U.S. Notice of Allowance dated Sep. 9, 2024 in U.S. Appl. No. 18/184,545.
U.S. Appl. No. 18/850,628, inventors Li D, et al., filed on Sep. 25, 2024.
U.S. Appl. No. 18/850,990, inventors Lee Y, et al., filed on Sep. 25, 2024.
U.S. Appl. No. 18/855,026, inventors Lee Y, et al., filed on Oct. 8, 2024.
U.S. Appl. No. 18/932,475, inventors Marks J, et al., filed on Oct. 30, 2024.
U.S. Appl. No. 18/980,854, inventors Volosskiy B et al., filed on Dec. 13, 2024.
U.S. Restriction requirement dated Aug. 30, 2024 in U.S. Appl. No. 18/700,238.
U.S. Restriction requirement dated Nov. 14, 2024 in U.S. Appl. No. 18/700,238.
U.S. Restriction requirement dated Oct. 30, 2024 in U.S. Appl. No. 18/769,038.
U.S. Restriction requirement dated Oct. 30, 2024 in U.S. Appl. No. 18/769,048.
U.S. Supplemental Notice of Allowance dated Nov. 15, 2024 in U.S. Appl. No. 18/184,545.
CN Office Action dated Aug. 31, 2024 in CN Application No. 201980028279.5 with English translation.
EP Office Action dated Jan. 21, 2025 in EP Application No. 23173688.5.
International Search Report and Written Opinion dated Feb. 21, 2025 in PCT Application No. PCT/US2024/054953.
International Search Report and Written Opinion dated Sep. 13, 2024 in PCT Application No. PCT/US2024/033522.
JP Office Action dated Jan. 7, 2025 in JP Application No. 2023-533602, with English Translation.

(56) References Cited

OTHER PUBLICATIONS

JP Office Action dated Oct. 8, 2024 in JP Application No. 2020-562160 with English translation.
KR Notice of Allowance dated Jan. 23, 2025 in KR Application No. 10-2024- 7037880, with English Translation.
KR Office Action dated Feb. 5, 2025 in KR Application No. 10-2022-7037995, with English Translation.
KR Office Action dated Jan. 15, 2025 in KR Application No. 10-2023-7023253, with English Translation.
KR Office Action dated Jan. 24, 2025 in KR Application No. 10-2020-7035732, with English Translation.
KR Office Action dated Nov. 28, 2024 in KR Application No. 10-2022-7014447, with English Translation.
TW Office Action and Search Report dated Jan. 16, 2025 in TW Application No. 113105443, with English Translation.
TW Office Action dated Jan. 20, 2025 in TW Application No. 108146890, with English Translation.
U.S. Non-Final Office Action dated Aug. 28, 2024 in U.S. Appl. No. 15/733,598.
U.S. Non-Final Office Action dated Feb. 20, 2025 in U.S. Appl. No. 18/700,238.
U.S. Non-Final Office Action dated Jan. 3, 2025 in U.S. Appl. No. 18/769,038.
U.S. Non-Final Office Action dated Jan. 24, 2025 in U.S. Appl. No. 18/769,048.
U.S. Non-Final Office Action dated Mar. 5, 2025 in U.S. Appl. No. 18/850,628.
CN Office Action dated May 6, 2025 in CN Application No. 202080081121.7, with English Translation.
JP Office Action dated May 13, 2025 in JP Application No. 2023-502906, with English Translation.
KR Office Action dated Mar. 13, 2025 in KR Application No. 10-2023-7004801, with English Translation.
TW Office Action and Search Report dated Apr. 24, 2025 in TW Application No. 108116155, with English Translation.
TW Office Action dated Apr. 17, 2025 in TW Application No. 113105443, with English Translation.
TW Office Action dated Apr. 17, 2025 in TW Application No. 113118322, with English Translation.
TW Office Action dated Mar. 11, 2025 in TW Application No. 110126445, with English Translation.
U.S. Non-Final Office Action dated Apr. 17, 2025 in U.S. Appl. No. 18/769,038.
US Non-Final Office Action dated May 5, 2025 in U.S. Appl. No. 18/769,048.
U.S. Notice of Allowance dated Apr. 9, 2025 in U.S. Appl. No. 18/850,990.
U.S. Appl. No. 19/076,745, inventors Yu J et al., filed on Mar. 11, 2025.
U.S. Appl. No. 19/179,005, inventors Dictus D et al., filed Apr. 15, 2025.
U.S. Appl. No. 19/181,906, inventors Li D et al., filed Apr. 17, 2025.
U.S. Appl. No. 19/182,430, inventors Weidman T.W et al., filed Apr. 17, 2025.
U.S. Restriction Requirement dated Mar. 20, 2025 in U.S. Application No. 17/753,110.
U.S. Supplemental Notice of Allowance dated Mar. 17, 2025 in U.S. Appl. No. 18/377,267.

* cited by examiner

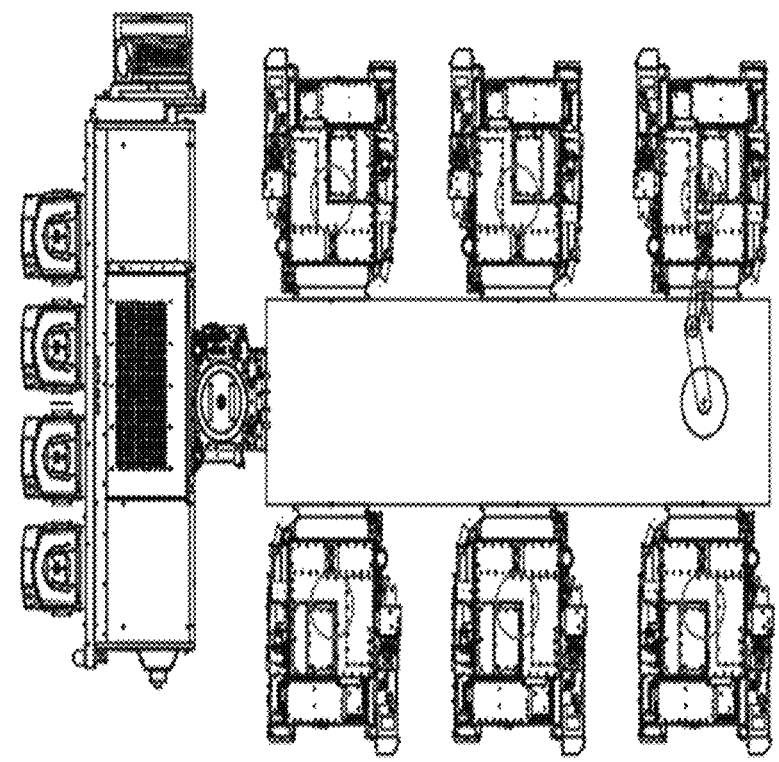
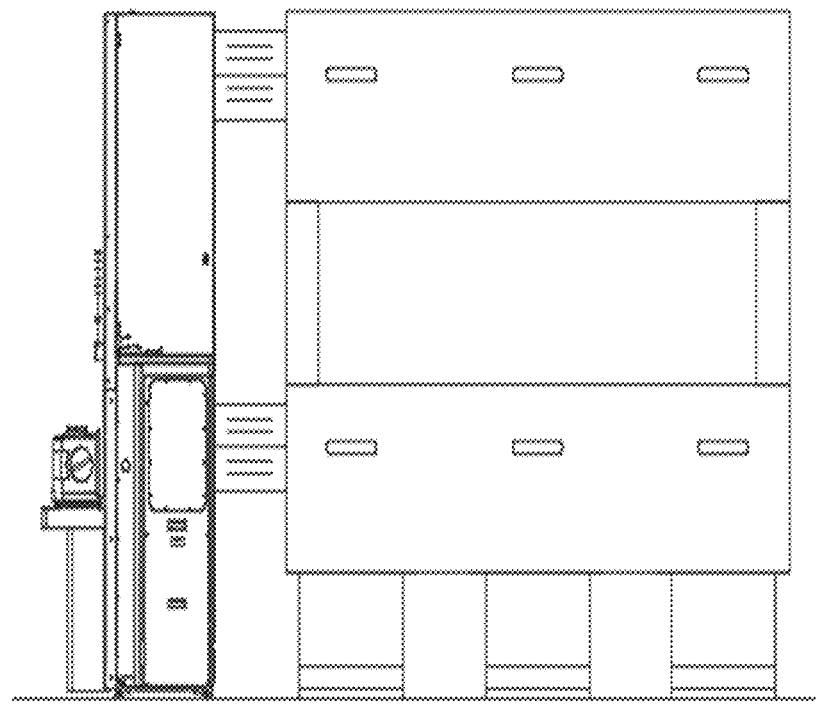
FIG. 14

PROCESS TOOL FOR DRY REMOVAL OF PHOTORESIST

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in their entireties and for all purposes.

BACKGROUND

The fabrication of semiconductor devices, such as integrated circuits, is a multi-step process involving photolithography. In general, the process includes the deposition of material on a wafer, and patterning the material through lithographic techniques to form structural features (e.g., transistors and circuitry) of the semiconductor device. The steps of a typical photolithography process known in the art include: preparing the substrate; applying a photoresist, such as by spin coating; exposing the photoresist to light in a desired pattern, causing the exposed areas of the photoresist to become more or less soluble in a developer solution; developing by applying a developer solution to remove either the exposed or the unexposed areas of the photoresist; and subsequent processing to create features on the areas of the substrate from which the photoresist has been removed, such as by etching or material deposition.

The evolution of semiconductor design has created the need, and has been driven by the ability, to create ever smaller features on semiconductor substrate materials. This progression of technology has been characterized in "Moore's Law" as a doubling of the density of transistors in dense integrated circuits every two years. Indeed, chip design and manufacturing has progressed such that modern microprocessors may contain billions of transistors and other circuit features on a single chip. Individual features on such chips may be on the order of 22 nanometers (nm) or smaller, in some cases less than 10 nm.

One challenge in manufacturing devices having such small features is the ability to reliably and reproducibly create photolithographic masks having sufficient resolution. Current photolithography processes typically use 193 nm ultraviolet (UV) light to expose a photoresist. The fact that the light has a wavelength significantly greater than the desired size of the features to be produced on the semiconductor substrate creates inherent issues. Achieving feature sizes smaller than the wavelength of the light requires use of complex resolution enhancement techniques, such as multipatterning. Thus, there is significant interest and research effort in developing photolithographic techniques using shorter wavelength light, such as extreme ultraviolet radiation (EUV), having a wavelength of from 10 nm to 15 nm, e.g., 13.5 nm.

EUV photolithographic processes can present challenges, however, including low power output and loss of light during patterning. Traditional organic chemically amplified resists (CAR) similar to those used in 193 nm UV lithography have potential drawbacks when used in EUV lithography, particularly as they have low absorption coefficients in EUV region and the diffusion of photo-activated chemical species can result in blur or line edge roughness. Furthermore, in order to provide the etch resistance required to pattern underlying device layers, small features patterned in conventional CAR materials can result in high aspect ratios at risk of pattern collapse. Accordingly, there remains a need for improved EUV photoresist materials, having such properties as decreased thickness, greater absorbance, and greater etch resistance.

The background description provided herein is for the purpose of generally presenting the context of the present technology. Work of the presently named inventors, to the extent it is described in this background section, as well as aspects of the description that may not otherwise qualify as prior art at the time of filing, are neither expressly nor impliedly admitted as prior art against the present technology.

SUMMARY

Provided herein is an apparatus for substrate processing. The apparatus includes a process chamber, where the process chamber is exposed to atmospheric conditions. The apparatus further includes a substrate support for holding a semiconductor substrate in the process chamber, a heating assembly that faces the semiconductor substrate on the substrate support, where the heating assembly includes a plurality of heating elements, and an etch gas delivery nozzle positioned over the substrate support, where the etch gas delivery nozzle is movable to position delivery of etch gas to a location over the semiconductor substrate.

In some implementations, the semiconductor substrate includes a metal-containing EUV resist, where one or more portions of the metal-containing EUV resist is removable by the etch gas. In some implementations, the process chamber exposed to atmospheric conditions is exposed to atmospheric pressure between about 50 Torr and about 765 Torr. In some implementations, the process chamber exposed to atmospheric conditions is exposed to a controlled atmosphere, where exposure to the controlled atmosphere includes exposure to a chamber pressure greater than about 760 Torr and/or exposure to nitrogen, water vapor, carbon dioxide, argon, helium, or combinations thereof. In some implementations, the plurality of heating elements include a plurality of LEDs, the plurality of LEDs being arranged in a plurality of independently controllable heating zones. In some implementations, the etch gas delivery nozzle is coupled to a movable swing arm, the movable swing arm configured to position the etch gas delivery nozzle from center to edge of the semiconductor substrate. In some implementations, a controller configured with instructions for processing the semiconductor substrate, the instructions comprising code for: providing in the process chamber a metal-containing EUV resist on the semiconductor substrate; and delivering the etch gas to the semiconductor substrate via the etch gas delivery nozzle to dry etch one or more portions of the metal-containing EUV resist from the semiconductor substrate under atmospheric conditions. In some implementations, the apparatus further includes an exhaust fan configured to remove etch byproducts and other residual gases in the process chamber. In some implementations, the apparatus further includes a gas source coupled to the process chamber for delivering inert gas and/or diluent gas to the process chamber. In some implementations, the process chamber is a plasma-free thermal process chamber.

Also provided herein is a substrate processing apparatus. The apparatus includes a process chamber, where the process chamber is exposed to atmospheric conditions, a bake plate for supporting a semiconductor substrate and including a plurality of heating zones, each of the plurality of heating zones including one or more heating elements, and an etch gas distributor positioned over the bake plate, where the etch gas distributor is configured to deliver etch gas to the semiconductor substrate.

In some implementations, the semiconductor substrate includes a metal-containing EUV resist, wherein one or more portions of the metal-containing EUV resist is removable by the etch gas. In some implementations, the process chamber exposed to atmospheric conditions is exposed to atmospheric pressure between about 50 Torr and about 765 Torr. In some implementations, the process chamber exposed to atmospheric conditions is exposed to a controlled atmosphere, where exposure to the controlled atmosphere includes exposure to a chamber pressure greater than about 760 Torr and/or exposure to nitrogen, water vapor, carbon dioxide, argon, helium, or combinations thereof. In some implementations, the bake plate includes an upper surface and a plurality of minimum contact area (MCA) supports for supporting the semiconductor substrate at a height above the upper surface of the bake plate. In some implementations, the etch gas distributor includes a showerhead having a faceplate that faces the semiconductor substrate, where the faceplate includes a plurality of through-holes for delivery of the etch gas to the semiconductor substrate. In some implementations, the process chamber is a plasma-free thermal process chamber. In some implementations, the apparatus further includes a controller configured with instructions for processing the semiconductor substrate, the instructions comprising code for: providing in the process chamber a metal-containing EUV resist on the semiconductor substrate, and delivering the etch gas to the semiconductor substrate via the etch gas distributor to dry etch one or more portions of the metal-containing EUV resist from the semiconductor substrate under atmospheric conditions.

Also provided herein is a substrate processing apparatus. The apparatus includes a furnace reactor with a substrate support for holding a plurality of semiconductor substrates, a plurality of heating elements for heating the plurality of semiconductor substrates to an elevated temperature, and one or more etch gas inlets for delivering etch gas into the furnace reactor, wherein the one or more etch gas inlets are configured to deliver etch gas to the plurality of semiconductor substrates.

In some implementations, the furnace reactor is exposed to atmospheric conditions. In some implementations, atmospheric conditions include exposure to a controlled atmosphere, where the one or more etch gas inlets are further configured to deliver nitrogen, water vapor, carbon dioxide, argon, helium, or combinations thereof to provide the controlled atmosphere. In some implementations, the apparatus further includes one or more gas outlets for removal of etch byproducts and other residual gases from the furnace reactor, and a motor for rotating the substrate support. In some implementations, chamber walls of the furnace reactor includes a quartz, a ceramic material, or a low-temperature polymer material. In some implementations, each of the plurality of semiconductor substrates includes a metal-containing EUV resist, where one or more portions of the metal-containing EUV resist is removable by the etch gas.

Also provided herein is a track lithography system. The track lithography system includes a cassette mounting section, where the cassette mounting section includes one or more pods for receiving and returning a semiconductor substrate, and a processing section, where the processing section includes a plurality of processing stations for photoresist processing of the semiconductor substrate. The plurality of processing stations includes a deposition chamber for depositing metal-containing EUV resist on the semiconductor substrate, a thermal process chamber, and a substrate cleaning chamber, where at least one of the plurality of processing stations are exposed to atmospheric conditions and configured to perform dry removal of one or more portions of the metal-containing EUV resist from the semiconductor substrate. The track lithography system further includes an exposure section, where the exposure section includes a scanner for exposing the semiconductor substrate to EUV radiation, and an interface section for transferring the semiconductor substrate between the processing section and the exposure section.

In some implementations, the plurality of processing stations further comprises: a hexamethyldisilazane (HMDS) treatment chamber for treating a surface of the semiconductor substrate, wherein the HMDS treatment chamber is configured to perform dry removal of the one or more portions of the metal-containing EUV resist under atmospheric conditions. In some implementations, the at least one of the plurality of processing stations includes a substrate support for holding the semiconductor substrate and a gas distributor for delivery of etch gas to the semiconductor substrate, where the one or more portions of the metal-containing EUV resist is removable by the etch gas.

Also provided herein is a method for conducting dry development of EUV resist. The method includes providing in a process chamber a metal-containing EUV resist on a semiconductor substrate, and dry etching the metal-containing EUV resist in the process chamber by exposure to an etch gas, where dry etching the metal-containing EUV resist is performed under atmospheric conditions.

In some implementations, atmospheric conditions include an atmospheric pressure between about 50 Torr and about 765 Torr. In some implementations, atmospheric conditions include a controlled atmosphere, where the controlled atmosphere includes exposure of the semiconductor substrate to a chamber pressure greater than about 760 Torr and/or exposure of the semiconductor substrate to nitrogen, water vapor, carbon dioxide, argon, helium, or combinations thereof. In some implementations, the method further includes baking the metal-containing EUV resist at an elevated temperature in the same process chamber as dry etching the metal-containing EUV resist. In some implementations, dry etching the metal-containing EUV resist includes dry developing the metal-containing EUV resist by selectively removing a portion of the EUV resist by exposure to dry development chemistry. In some implementations, the method further includes performing a bevel edge clean of the semiconductor substrate in the same process chamber as dry developing the metal-containing EUV resist. In some implementations, dry etching the metal-containing EUV resist includes heating the semiconductor substrate to a temperature equal to or greater than about 100° C. In some implementations, heating the semiconductor substrate includes locally heating regions of the semiconductor substrate. In some implementations, dry etching the metal-containing EUV resist includes positioning a movable discharge nozzle over the semiconductor substrate to preferentially direct the etch gas to one or more regions of the semiconductor substrate. In some implementations, the process chamber includes a substrate support coupled with a plurality of independently controllable heating zones for localized heating of the semiconductor substrate, and a movable discharge nozzle positioned over the substrate support for directing the etch gas to targeted regions of the semiconductor substrate.

BRIEF DESCRIPTION OF DRAWINGS

FIGS. 13 and 14 present various example tool architectures that may be used to perform methods in accordance with disclosed embodiments.

DETAILED DESCRIPTION

Figure 1:
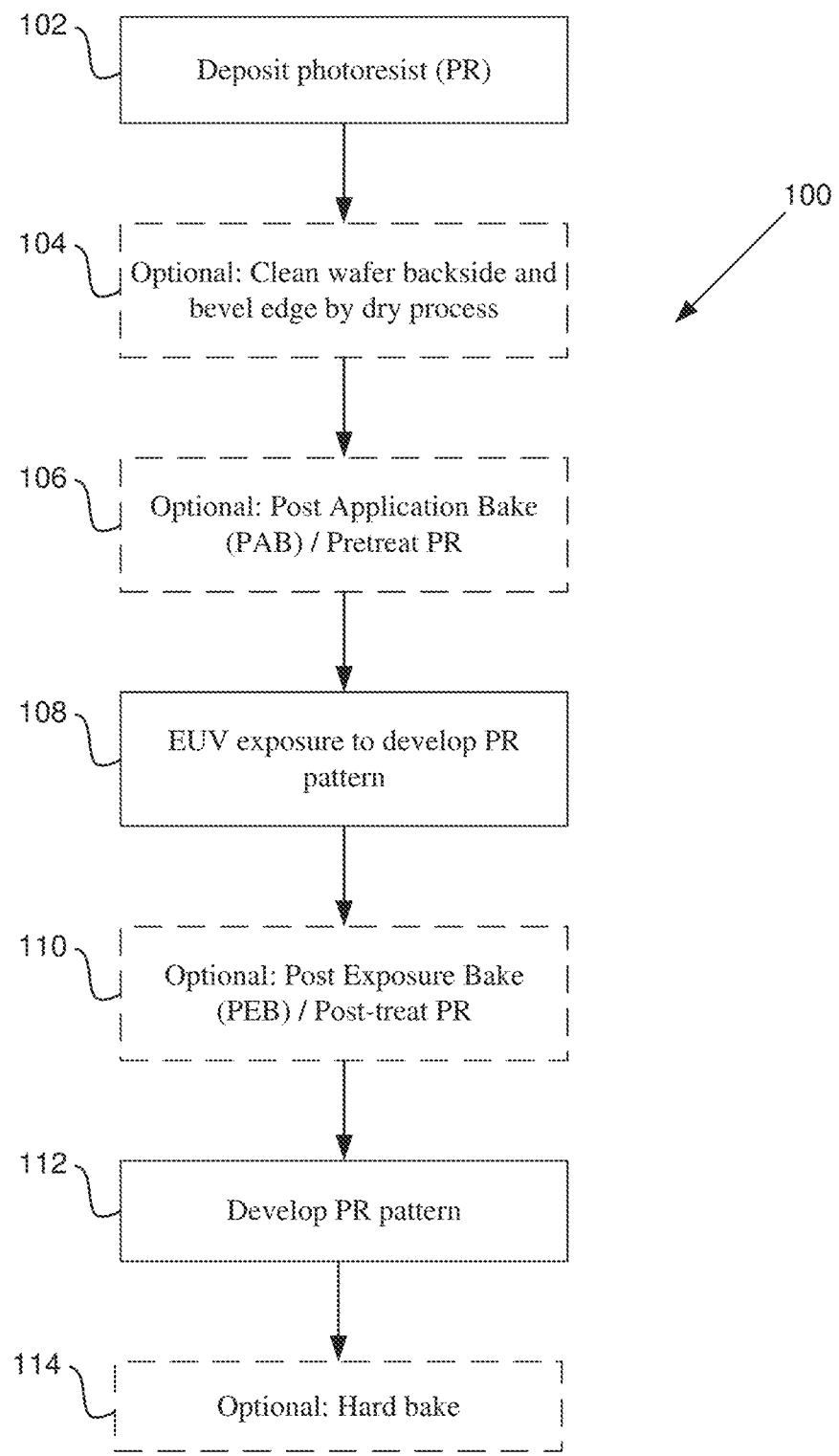
FIG. 1 presents a flow diagram of an example method for depositing and developing a photoresist according to some embodiments.

This disclosure relates generally to the field of semiconductor processing. In particular aspects, the disclosure is directed to methods and apparatuses for processing of EUV photoresists (e.g., EUV-sensitive metal and/or metal oxide-containing photoresists) in the context of EUV patterning and EUV patterned film development to form a patterning mask.

Reference is made herein in detail to specific embodiments of the disclosure. Examples of the specific embodiments are illustrated in the accompanying drawings. While the disclosure will be described in conjunction with these specific embodiments, it will be understood that it is not intended to limit the disclosure to such specific embodiments. On the contrary, it is intended to cover alternatives, modifications, and equivalents as may be included within the spirit and scope of the disclosure. In the following description, numerous specific details are set forth in order to provide a thorough understanding of the present disclosure. The present disclosure may be practiced without some or all of these specific details. In other instances, well known process operations have not been described in detail so as to not unnecessarily obscure the present disclosure.

Introduction

Patterning of thin films in semiconductor processing is often an important step in the fabrication of semiconductors. Patterning involves lithography. In conventional photolithography, such as 193 nm photolithography, patterns are printed by emitting photons from a photon source onto a mask and printing the pattern onto a photosensitive photoresist, thereby causing a chemical reaction in the photoresist that, after development, removes certain portions of the photoresist to form the pattern.

Advanced technology nodes (as defined by the International Technology Roadmap for Semiconductors) include nodes 22 nm, 16 nm, and beyond. In the 16 nm node, for example, the width of a typical via or line in a Damascene structure is typically no greater than about 30 nm. Scaling of features on advanced semiconductor integrated circuits (ICs) and other devices is driving lithography to improve resolution.

Extreme ultraviolet (EUV) lithography can extend lithography technology by moving to smaller imaging source wavelengths than would be achievable with conventional photolithography methods. EUV light sources at approximately 10-20 nm, or 11-14 nm wavelength, for example 13.5 nm wavelength, can be used for leading-edge lithography tools, also referred to as scanners. The EUV radiation is strongly absorbed in a wide range of solid and fluid materials including quartz and water vapor.

EUV lithography makes use of EUV resists that are patterned to form masks for use in etching underlying layers. EUV resists may be polymer-based chemically amplified resists (CARs) produced by liquid-based spin-on techniques. An alternative to CARs are directly photopatternable metal oxide-containing films, such as those available from Inpria, Corvallis, OR, and described, for example, in US Patent Publications US 2017/0102612, US 2016/021660 and US 2016/0116839, incorporated by reference herein at least for their disclosure of photopatternable metal oxide-containing films. Such films may be produced by spin-on techniques or dry vapor-deposited. The metal oxide-containing film can be patterned directly (i.e., without the use of a separate photoresist) by EUV exposure in a vacuum ambient providing sub-30 nm patterning resolution, for example as described in U.S. Pat. No. 9,996,004, issued Jun. 12, 2018 and titled EUV PHOTOPATTERNING OF VAPOR-DEPOSITED METAL OXIDE-CONTAINING HARDMASKS, and/or in Application PCT/US19/31618, filed May 9, 2019, and titled METHODS FOR MAKING EUV PATTERNABLE HARD MASKS, the disclosures of which at least relating to the composition, deposition, and patterning of directly photopatternable metal oxide films to form EUV resist masks is incorporated by reference herein. Generally, the patterning involves exposure of the EUV resist with EUV radiation to form a photo pattern in the resist, followed by development to remove a portion of the resist according to the photo pattern to form the mask.

It should also be understood that the while present disclosure relates to lithographic patterning techniques and materials exemplified by EUV lithography, it is also applicable to other next generation lithographic techniques. In addition to EUV, which includes the standard 13.5 nm EUV wavelength currently in use and development, the radiation sources most relevant to such lithography are DUV (deep-UV), which generally refers to use of 248 nm or 193 nm excimer laser sources, X-ray, which formally includes EUV at the lower energy range of the X-ray range, as well as e-beam, which can cover a wide energy range. The specific methods may depend on the particular materials and applications used in the semiconductor substrate and ultimate semiconducting device. Thus, the methods described in this application are merely exemplary of the methods and materials that may be used in present technology.

Directly photopatternable EUV resists may be composed of or contain metals and/or metal oxides mixed within organic components. The metals/metal oxides are highly promising in that they can enhance the EUV photon adsorption and generate secondary electrons and/or show increased etch selectivity to an underlying film stack and device layers. To date, these resists have been developed using a wet (solvent) approach, which requires the wafer to move to the track, where it is exposed to developing solvent, dried and baked. Wet development does not only limit productivity but can also lead to line collapse due to surface tension effects during the evaporation of solvent between fine features.

Dry development techniques have been proposed to overcome these issues by eliminating substrate delamination and interface failures. Dry development can improve performance (e.g., prevent line collapse due to surface tension and delamination in wet development) and enhance throughput (e.g., by avoiding wet development track). Other advantages may include eliminating the use of organic solvent developers, reduced sensitivity to adhesion issues, increased EUV absorption for improved dose efficiency, and a lack of solubility-based limitations. Dry development can also provide more tunability and give further critical dimension (CD) control and scum removal.

Dry development has its own challenges, including etch selectivity between unexposed and EUV exposed resist material which can lead to a higher dose to size requirement for effective resist exposure when compared to wet development. Suboptimal selectivity can also cause PR corner rounding due to longer exposures under etching gas, which may increase line CD variation in the following transfer etch step.

Dry Etch of EUV Resist

The present disclosure provides for dry etch of metal-containing EUV resist under atmospheric conditions. As used herein, "atmospheric conditions" may constitute exposure to non-vacuum conditions. Specifically, the atmospheric conditions may constitute a chamber pressure between about 50 Torr and about 760 Torr (i.e., atmospheric pressure) or between about 50 Torr and about 765 Torr. The tools and chambers in the present disclosure may operate at overpressures above atmospheric pressure. For example, an overpressure may be about 0.1 Torr to about 5 Torr or about 0.3 Torr to about 1.5 Torr above atmospheric pressure. In some embodiments, atmospheric conditions may constitute a controlled atmosphere where a chamber pressure is greater than about 760 Torr. Operating at above atmospheric pressure may be useful for avoiding leak-in contamination by oxygen or air.

Atmospheric conditions may include exposure to ambient gas(es) (e.g., air), where ambient gases may include oxygen, nitrogen, carbon dioxide, water vapor, or combinations thereof. Alternatively, atmospheric conditions may include exposure to a controlled atmosphere, where exposure to the controlled atmosphere includes exposure to nitrogen, water vapor, carbon dioxide, argon, helium, or combinations thereof. In some embodiments, the controlled atmosphere includes exposure to gases that are non-oxidizing gases. Such gases may serve as inert or diluent gases that contribute to providing an overpressure that is useful for avoiding leak-in contamination by oxygen or air. Though dry etching of the metal-containing EUV resist may occur in atmospheric conditions, it will be understood that a chamber in which dry etching is performed may or may not include vacuum equipment. Rather than exposing the metal-containing EUV resist to a vacuum environment for dry etch, the metal-containing EUV resist may be exposed to atmospheric conditions, where atmospheric conditions may include exposure to air or exposure to a controlled environment (e.g., above atmospheric pressure). Dry etch in the present disclosure can apply to dry development of photopatterned metal-containing EUV resist, bevel edge cleaning of deposited metal-containing EUV resist, or other photoresist processes that involve dry etch. Avoiding wet clean/development equivalents reduces costs. Furthermore, avoiding vacuum equipment or operation thereof in dry clean/development equivalents reduces costs.

An EUV-sensitive metal or metal oxide-containing film, e.g., an organotin oxide, is disposed on a semiconductor substrate. Unwanted EUV-sensitive metal or metal oxide-containing film is optionally removed by bevel edge cleaning. The EUV-sensitive metal or metal oxide-containing film is patterned directly by EUV exposure. A pattern is then developed to form a resist mask using a development chemistry. In some embodiments, the development chemistry includes a halogen-containing compound. An etch gas may be delivered to the semiconductor substrate under atmospheric conditions for removal of EUV resist during development and/or bevel edge cleaning.

Dry etch techniques may use either a gentle plasma (low power) or a thermal process while flowing the etch gas. Dry etch in atmospheric conditions may be performed in a process chamber with a gas distributor for delivering the etch gas and a heating assembly that faces the semiconductor substrate and that has one or more heating elements. In some embodiments, the gas distributor may include an etch gas delivery nozzle positioned above a substrate support. In some embodiments, the etch gas delivery nozzle is connected to a movable swing arm for positioning the etch gas delivery nozzle over certain regions of the semiconductor substrate. In some embodiments, the heating assembly includes a plurality of independently controllable heating zones. For instance, the heating assembly may be positioned underneath the semiconductor substrate and may include a plurality of heating elements such as light-emitting diodes (LEDs). The process chamber for performing dry etch of EUV resist under atmospheric conditions may also be a wafer cleaning chamber, a bake chamber, or a treatment chamber. Specifically, the process chamber for dry etch of EUV resist may be a wafer spin-clean chamber, a bevel edge clean chamber, a post-application bake chamber, a post-exposure bake chamber, a batch furnace reactor, a buffer module, a development chamber, or a hexamethyldisilazane (HMDS) treatment chamber. Such chambers may be part of a track system or cluster tool for photoresist processing. That way, dry etch processes (e.g., dry development) may be integrated in the same station, module, or chamber as other processes in photoresist processing without having to transfer to a separate station, module, or chamber. Integration of tools/chambers in increases throughput and reduces costs.

FIG. 1 presents a flow diagram of an example method for depositing and developing a photoresist according to some embodiments. The operations of a process 100 may be performed in different orders and/or with different, fewer, or additional operations. Aspects of the process 100 may be described with reference to FIGS. 2A-2C. One or more operations of the process 100 may be performed using apparatuses or chambers described in FIGS. 3A, 3B, 4-6, 7A, 7B, 8A, 8B, and 9-14. In some embodiments, the operations of the process 100 may be implemented, at least in part, according to software stored in one or more non-transitory computer readable media.

At block 102 of the process 100, a layer of photoresist is deposited. This may be either a dry deposition process such as a vapor deposition process or a wet process such as a spin-on deposition process.

The photoresist may be a metal-containing EUV resist. An EUV-sensitive metal or metal oxide-containing film may be deposited on a semiconductor substrate by any suitable technique, including wet (e.g., spin-on) or dry (e.g., CVD) deposition techniques. For example, described processes have been demonstrated for EUV photoresist compositions based on organotin oxides, being applicable to both commercially spin-coatable formulations (e.g., such as are available from Inpria Corp, Corvallis, OR) and formulations applied using dry vacuum deposition techniques, further described below.

Semiconductor substrates may include any material construct suitable for photolithographic processing, particularly for the production of integrated circuits and other semiconducting devices. In some embodiments, semiconductor substrates are silicon wafers. Semiconductor substrates may be silicon wafers upon which features have been created ("underlying features"), having an irregular surface topography. As referred to herein, the "surface" is a surface onto which a film of the present disclosure is to be deposited or that is to be exposed to EUV during processing. Underlying features may include regions in which material has been removed (e.g., by etching) or regions in which materials have been added (e.g., by deposition) during processing prior to conducting a method of this disclosure. Such prior processing may include methods of this disclosure or other processing methods in an iterative process by which two or more layers of features are formed on the substrate.

EUV-sensitive thin films may be deposited on the semiconductor substrate, such films being operable as resists for subsequent EUV lithography and processing. Such EUV-sensitive thin films comprise materials which, upon exposure to EUV, undergo changes, such as the loss of bulky pendant substituents bonded to metal atoms in low density M-OH rich materials, allowing their crosslinking to denser M-O-M bonded metal oxide materials. Through EUV patterning, areas of the film are created that have altered physical or chemical properties relative to unexposed areas. These properties may be exploited in subsequent processing, such as to dissolve either unexposed or exposed areas, or to selectively deposit materials on either the exposed or unexposed areas. In some embodiments, the unexposed film has a more hydrophobic surface than the exposed film under the conditions at which such subsequent processing is performed. For example, the removal of material may be performed by leveraging differences in chemical composition, density and cross-linking of the film. Removal may be by dry processing, as further described below.

The thin films are, in various embodiments, organometallic materials, for example organotin materials comprising tin oxide, or other metal oxide materials/moieties. The organometallic compounds may be made in a vapor phase reaction of an organometallic precursor with a counter reactant. In various embodiments, the organometallic compounds are formed through mixing specific combinations of organometallic precursors having bulky alkyl groups or fluoroalkyl groups with counter-reactants and polymerizing the mixture in the vapor phase to produce a low-density, EUV-sensitive material that deposits onto the semiconductor substrate.

In various embodiments, organometallic precursors comprise at least one alkyl group on each metal atom that can survive the vapor-phase reaction, while other ligands or ions coordinated to the metal atom can be replaced by the counter-reactants. Organometallic precursors include those of the formula:

$$M_a R_b L_c \quad \text{(Formula 1)}$$

wherein: M is an element with a high patterning radiation-absorption cross-section; R is alkyl, such as $C_n H_{2n+1}$, preferably wherein $n \geq 2$; L is a ligand, ion or other moiety which is reactive with the counter-reactant; $a \geq 1$; $b \geq 1$; and $c \geq 1$.

In various embodiments, M has an atomic absorption cross section equal to or greater than $1 \times 10^7$ cm$^2$/mol. M may be, for example, selected from the group consisting of tin, hafnium, tellurium, bismuth, indium, antimony, iodine, germanium, and combinations thereof. In some embodiments, M is tin. R may be fluorinated, e.g., having the formula $C_n F_x H_{(2n+1)}$. In various embodiments, R has at least one beta-hydrogen or beta-fluorine. For example, R may be selected from the group consisting of ethyl, i-propyl, n-propyl, t-butyl, i-butyl, n-butyl, sec-butyl, n-pentyl, i-pentyl, t-pentyl, sec-pentyl, and mixtures thereof. L may be any moiety readily displaced by a counter-reactant to generate an M-OH moiety, such as a moiety selected from the group consisting of amines (such as dialkylamino, monoalkylamino), alkoxy, carboxylates, halogens, and mixtures thereof.

Organometallic precursors may be any of a wide variety of candidate metal-organic precursors. For example, where M is tin, such precursors include t-butyl tris(dimethylamino) tin, i-butyl tris(dimethylamino) tin, n-butyl tris(dimethylamino) tin, sec-butyl tris(dimethylamino) tin, i-propyl(tris) dimethylamino tin, n-propyl tris(dimethylamino) tin, ethyl tris(dimethylamino) tin and analogous alkyl(tris)(t-butoxy) tin compounds such as t-butyl tris(t-butoxy) tin. In some embodiments, the organometallic precursors are partially fluorinated.

Counter-reactants have the ability to replace the reactive moieties, ligands or ions (e.g., L in Formula 1, above) so as to link at least two metal atoms via chemical bonding. Counter-reactants can include water, peroxides (e.g., hydrogen peroxide), di- or polyhydroxy alcohols, fluorinated di- or polyhydroxy alcohols, fluorinated glycols, and other sources of hydroxyl moieties. In various embodiments, a counter-reactant reacts with the organometallic precursor by forming oxygen bridges between neighboring metal atoms. Other potential counter-reactants include hydrogen sulfide and hydrogen disulfide, which can crosslink metal atoms via sulfur bridges.

The thin films may include optional materials in addition to an organometallic precursor and counter-reactants to modify the chemical or physical properties of the film, such as to modify the sensitivity of the film to EUV or enhancing etch resistance. Such optional materials may be introduced, such as by doping during vapor phase formation prior to deposition on the semiconductor substrate, after deposition of the thin film, or both. In some embodiments, a gentle remote $H_2$ plasma may be introduced so as to replace some Sn-L bonds with Sn—H, which can increase reactivity of the resist under EUV.

In various embodiments, the EUV-patternable films are made and deposited on the semiconductor substrate using vapor deposition equipment and processes among those known in the art. In such processes, the polymerized organometallic material is formed in vapor phase or in situ on the surface of the semiconductor substrate. Suitable processes include, for example, chemical vapor deposition (CVD), atomic layer deposition (ALD), and ALD with a CVD component, such as a discontinuous, ALD-like process in which metal precursors and counter-reactants are separated in either time or space.

In general, methods comprise mixing a vapor stream of an organometallic precursor with a vapor stream of a counter-reactant so as to form a polymerized organometallic material, and depositing the organometallic material onto the surface of the semiconductor substrate. In some embodiments, more than one organometallic precursor is included in the vapor stream. In some embodiments, more than one counter-reactant is included in the vapor stream. As will be understood by one of ordinary skill in the art, the mixing and depositing aspects of the process may be concurrent, in a substantially continuous process.

In an example continuous CVD process, two or more gas streams, in separate inlet paths, of organometallic precursor and source of counter-reactant are introduced to the deposition chamber of a CVD apparatus, where they mix and react in the gas phase, to form agglomerated polymeric materials (e.g., via metal-oxygen-metal bond formation). The streams may be introduced, for example, using separate injection inlets or a dual-plenum showerhead. The apparatus is configured so that the streams of organometallic precursor and counter-reactant are mixed in the chamber, allowing the organometallic precursor and counter-reactant to react to form a polymerized organometallic material. Without limiting the mechanism, function, or utility of present technology, it is believed that the product from such vapor-phase reaction becomes heavier in molecular weight as metal atoms are crosslinked by counter-reactants, and is then condensed or otherwise deposited onto the semiconductor substrate. In various embodiments, the steric hindrance of the bulky alkyl groups prevents the formation of densely packed network and produces smooth, amorphous, low-density films.

The CVD process is generally conducted at reduced pressures, such as from 10 milliTorr to 10 Torr. In some embodiments, the process is conducted at from 0.5 to 2 Torr. In some embodiments, the temperature of the semiconductor substrate is at or below the temperature of the reactant streams. For example, the substrate temperature may be from 0° C. to 250° C., or from ambient temperature (e.g., 23° C.) to 150° C. In various processes, deposition of the polymerized organometallic material on the substrate occurs at rates inversely proportional to surface temperature.

In some embodiments, the EUV-patternable films are made and deposited on the semiconductor substrate using wet deposition equipment and processes among those known in the art. For example, the organometallic material is formed by spin-coating on the surface of the semiconductor substrate.

The thickness of the EUV-patternable film formed on the surface of the semiconductor substrate may vary according to the surface characteristics, materials used, and processing conditions. In various embodiments, the film thickness may range from 0.5 nm to 100 nm, and may be a sufficient thickness to absorb most of the EUV light under the conditions of EUV patterning. The EUV-patternable film may be able to accommodate absorption equal to or greater than 30%, thereby having significantly fewer EUV photons available towards the bottom of the EUV-patternable film. Higher EUV absorption leads to more cross-linking and densification near the top of an EUV-exposed film compared to the bottom of the EUV-exposed film. Though insufficient cross-linking may cause the resist to be more prone to liftoff or collapse in wet development, such as risk is not as present in dry development. An all-dry lithography approach may facilitate more efficient utilization of EUV photons by more opaque resist films. Though efficient utilization of EUV photons may occur with EUV-patternable films having higher overall absorption, it will be understood that in some instances, the EUV-patternable film may be less than about 30%. For comparison, the maximum overall absorption of most other resist films is less than 30% (e.g., 10% or less, or 5% or less) so that the resist material at the bottom of the resist film is sufficiently exposed. In some embodiments, the film thickness is from 10 nm to 40 nm or from 10 nm to 20 nm. Without limiting the mechanism, function, or utility of the present disclosure, it is believed that the processes of the present disclosure have few restrictions on the surface adhesion properties of the substrate, and therefore can be applied to a wide variety of substrates. Moreover, as discussed above, the deposited films may closely conform to surface features, providing advantages in forming masks over substrates, such as substrates having underlying features, without "filling in" or otherwise planarizing such features.

At block 104, an optional cleaning process is performed to clean a backside and/or bevel edge of the semiconductor substrate. The backside and/or bevel edge clean may non-selectively etch EUV resist film to equally remove film with various levels of oxidation or crosslinking on the substrate backside and bevel edge. During application of the EUV-patternable film, either by wet deposition processing or dry deposition processing, there may be some unintended deposition of resist material on the substrate bevel edge and/or backside. The unintended deposition may lead to undesirable particles later moving to a top surface of the semiconductor substrate and becoming particle defects. Moreover, this bevel edge and backside deposition can cause downstream processing problems, including contamination of the patterning (scanner) and development tools. Conventionally, removal of this bevel edge and backside deposition is done by wet cleaning techniques. For spin-coated photoresist material, this process is called edge bead removal (EBR) and is performed by directing a stream of solvent from above and below the bevel edge while the substrate is spinning. The same process can be applied to soluble organotin oxide-based resists deposited by vapor deposition techniques. However, in some embodiments, bevel edge and backside cleaning may be performed using dry cleaning techniques.

The substrate bevel edge and/or backside clean may also be a dry clean process. In some embodiments, the dry clean process involves a vapor and/or plasma having one or more of the following gases: HBr, HCl, $BCl_3$, $SOCl_2$, $Cl_2$, $BBr_3$, $H_2$, $O_2$, $PCl_3$, $CH_4$, methanol, ammonia, formic acid, $NF_3$, HF. In some embodiments, the dry clean process may use the same chemistries as a dry development process described herein. For example, the bevel edge and/or backside clean may use a halogen-containing development chemistry. For the bevel edge and/or backside clean process, the vapor and/or the plasma has to be limited to a specific region of the substrate to ensure that only the backside and the bevel are removed, without any film degradation on a frontside of the substrate.

Process conditions may be optimized for bevel edge and/or backside clean. In some embodiments, higher temperature, higher pressure, and/or higher reactant flow may lead to increased etch rate. Suitable process conditions for a dry bevel edge and backside clean may be: reactant flow of 100-10000 sccm (e.g., 500 sccm HCl, HBr, HI, or $H_2$ and $Cl_2$ or $Br_2$, $BCl_3$ or $H_2$, or other halogen-containing compound), temperature of 20 to 140° C. (e.g., 80° C.), pressure of 20-1000 mTorr (e.g., 100 mTorr) or pressure of 50-765 Torr (e.g., 760 Torr), plasma power of 0 to 500 W at high frequency (e.g., 13.56 MHz), and for a time of about 10 to 20 seconds, dependent on the photoresist film and composition and properties. Bevel and/or backside clean may be accomplished using a Coronus® tool available from Lam Research Corporation, Fremont, CA.

The dry-cleaning operation may alternatively be extended to a full photoresist removal or photoresist "rework" in which an applied EUV photoresist is removed and the semiconductor substrate prepared for photoresist reapplication, such as when the original photoresist is damaged or otherwise defective. Photoresist rework should be accomplished without damaging the underlying semiconductor substrate, so an oxygen-based etch should be avoided. Instead, variants of halide-containing chemistries as described herein may be used. It will be understood that the photoresist rework operation may be applied at any stage during the process 100. Thus, the photoresist rework operation may be applied after photoresist deposition, after bevel edge and/or backside clean, after PAB treatment, after EUV exposure, after PEB treatment, after development, or after hard bake. In some embodiments, the photoresist rework may be performed for non-selective removal of exposed and unexposed regions of the photoresist but selective to an underlayer.

In some embodiments, the photoresist rework process involves a vapor and/or plasma having one or more of the following gases: HBr, HCl, HI, $BCl_3$, $Cl_2$, $BBr_3$, $H_2$, $PCl_3$, $CH_4$, methanol, ammonia, formic acid, $NF_3$, HF.

Process conditions may be optimized for the photoresist rework. In some embodiments, higher temperature, higher pressure, and/or higher reactant flow may lead to increased etch rate. Suitable process conditions for a photoresist rework may be: reactant flow of 100-500 sccm (e.g., 500 sccm HCl, HBr, HI, $BCl_3$ or $H_2$ and $Cl_2$ or $Br^2$), temperature of 20 to 140° C. (e.g., 80° C.), pressure of 20-1000 mTorr (e.g., 300 mTorr) or pressure of 50-765 Torr (e.g., 760 Torr), plasma power of 0 to 800 W (e.g., 500 W) at high frequency (e.g., 13.56 MHz), wafer bias of 0 to 200 $V_b$ (a higher bias may be used with harder underlying substrate materials) and for a time of about 20 seconds to 3 minutes, sufficient to completely remove the EUV photoresist, dependent on the photoresist film and composition and properties. It should be understood that while these conditions are suitable for some processing reactors, e.g., a Kiyo etch tool available from Lam Research Corporation, Fremont, CA, a wider range of process conditions may be used according to the capabilities of the processing reactor.

In some embodiments, bevel edge cleaning may be performed using an etch gas under atmospheric conditions. Rather than requiring vacuum equipment for generating a vacuum environment in a process chamber, the process chamber for bevel edge cleaning may be exposed to atmospheric conditions. In some embodiments, the process chamber for bevel edge cleaning may expose the metal-containing EUV resist to non-vacuum pressure, where non-vacuum pressure is between about 50 Torr and about 765 Torr, between about 100 Torr and about 765 Torr, or between about 300 Torr and about 765 Torr. In some embodiments, the process chamber for bevel edge cleaning may expose the metal-containing EUV resist to above atmospheric pressure, where a chamber pressure is greater than about 760 Torr. In some embodiments, the process chamber for bevel edge cleaning can expose the metal-containing EUV resist to air or ambient gas(es). Ambient gases may include oxygen, nitrogen, carbon dioxide, water vapor, or combinations thereof. In some embodiments, the process chamber for bevel edge cleaning can expose the metal-containing EUV resist to a controlled atmosphere, where the controlled atmosphere includes exposure to nitrogen, water vapor, carbon dioxide, argon, helium, or combinations thereof.

The process chamber may include one or more heaters for temperature control. One or more heaters may be coupled to a heating assembly that faces the semiconductor substrate in the process chamber for substrate temperature control. For example, the heating assembly may be positioned underneath the substrate support or between the substrate support and the semiconductor substrate. In some embodiments, the substrate temperature may be controlled using a radiant heating assembly such as an IR lamp or one or more LEDs. During bevel edge cleaning of the EUV resist, the semiconductor substrate may be subjected to an elevated temperature. Temperature may be tuned, where temperature may influence various aspects of etching such as etch rate. In some embodiments, bevel edge cleaning includes heating the semiconductor substrate to a temperature equal to or greater than about 50° C., equal to or greater than about 100° C., equal to or greater than about 120° C., or between about 100° C. and about 230° C.

In some embodiments, the process chamber for bevel edge and/or backside cleaning may be a plasma-free thermal process chamber. The plasma-free thermal process chamber may be incapable of generating a direct or remote plasma. In some other embodiments, the process chamber for bevel and/or backside cleaning may be coupled to a direct or remote plasma source. The plasma source may be useful for generating plasma for bevel and/or backside cleaning or subsequent desorption, descumming, and smoothing operations.

In some embodiments, bevel edge cleaning in the process chamber may be performed in a bake chamber such as a bake chamber for performing PAB exposure at block 106 or a bake chamber for performing PEB exposure at block 110. In some embodiments, bevel edge cleaning in the process chamber may be performed in a development chamber for performing a development at block 112. In some embodiments, bevel edge cleaning in the process chamber may be performed in a wafer cleaning chamber such as a spin-clean chamber. In some embodiments, bevel edge cleaning in the process chamber may be performed in a treatment chamber such as a HMDS treatment chamber. In some embodiments, bevel edge cleaning in the process chamber may be performed in a batch furnace reactor. In some embodiments, bevel edge cleaning in the process chamber may be performed in a single or mini-batch buffer module.

At block 106 of the process 100, an optional post-application bake (PAB) is performed after deposition of the EUV-patternable film and prior to EUV exposure. The PAB treatment may involve a combination of thermal treatment, chemical exposure, and moisture to increase the EUV sensitivity of the EUV-patternable film, reducing the EUV dose to develop a pattern in the EUV-patternable film. The PAB treatment temperature may be tuned and optimized for increasing the sensitivity of the EUV-patternable film. For example, the treatment temperature may be between about 90° C. and about 200° C. or between about 150° C. and about 190° C. In some embodiments, the PAB treatment may be conducted with a pressure between atmospheric and vacuum, and a treatment duration of about 1 to 15 minutes, for example about 2 minutes. In some embodiments, the PAB treatment is conducted at a temperature between about 100° C. and about 230° C. and at atmospheric pressure.

At block 108 of the process 100, the metal-containing EUV resist film is exposed to EUV radiation to develop a pattern. Generally speaking, the EUV exposure causes a change in the chemical composition and cross-linking in the metal-containing EUV resist film, creating a contrast in etch selectivity that can be exploited for subsequent development.

The metal-containing EUV resist film may then be patterned by exposing a region of the film to EUV light, typically under relatively high vacuum. EUV devices and imaging methods among those useful herein include methods known in the art. In particular, as discussed above, exposed areas of the film are created through EUV patterning that have altered physical or chemical properties relative to unexposed areas. For example, in exposed areas, metal-carbon bond cleavage may occur, as through a beta-hydride elimination, leaving behind reactive and accessible metal hydride functionality that can be converted to hydroxide and cross-linked metal oxide moieties via metal-oxygen bridges during a subsequent post-exposure bake (PEB) step. This process can be used to create chemical contrast for development as a negative tone resist. In general, a greater number of beta-H in the alkyl group results in a more sensitive film. This can also be explained as weaker Sn—C bonding with more branching. Following exposure, the metal-containing EUV resist film may be baked, so as to cause additional cross-linking of the metal oxide film. The difference in properties between exposed and unexposed areas may be exploited in subsequent processing, such as to dissolve unexposed areas or to deposit materials on the exposed areas. For example the pattern can be developed using a dry method to form a metal oxide-containing mask.

In particular, in various embodiments, the hydrocarbyl-terminated tin oxide present on the surface is converted to hydrogen-terminated tin oxide in the exposed region(s) of an imaging layer, particularly when the exposure is performed in a vacuum using EUV. However, removing exposed imaging layers from vacuum into air, or the controlled introduction of oxygen, ozone, $H_2O_2$, or water, can result in the oxidation of surface Sn—H into Sn—OH. The difference in properties between exposed and unexposed regions may be exploited in subsequent processing, such as by reacting the irradiated region, the unirradiated region, or both, with one or more reagents to selectively add material to or remove material from the imaging layer.

Without limiting the mechanism, function, or utility of present technology, EUV exposure, for example, at doses of from 10 mJ/cm$^2$ to 100 mJ/cm$^2$, results in the cleavage of Sn—C bonds, thereby resulting in the loss of the alkyl substituent and alleviating steric hindrance and allowing the low-density film to collapse. In addition, reactive metal-H bond generated in the beta-hydride elimination reactions can react with neighboring active groups such as hydroxyls in the film, leading to further cross-linking and densification, and creating chemical contrast between exposed and unexposed region(s).

Following exposure of the metal-containing EUV resist film to EUV light, a photopatterned metal-containing EUV resist is provided. The photopatterned metal-containing EUV resist includes EUV-exposed and unexposed regions.

At block 110 of the process 100, an optional post-exposure bake (PEB) is performed to further increase contrast in etch selectivity of the photopatterned metal-containing EUV resist. The photopatterned metal-containing EUV resist can be thermally treated in the presence of various chemical species to facilitate cross-linking of the EUV-exposed regions or simply baked on a hot plate in ambient air, for example between 100° C. and 250° C. for between one and five minutes (e.g., 190° C. for two minutes).

In various embodiments, a bake strategy involves careful control of the bake ambient, introduction of reactive gases, and/or careful control of the ramping rate of the bake temperature. Examples of useful reactive gases include e.g., air, $H_2O$, $H_2O_2$ vapor, $CO_2$, CO, $O_2$, $O_3$, $CH_4$, $CH_3OH$, $N_2$, $H_2$, $NH_3$, $N_2O$, NO, alcohol, acetyl acetone, formic acid, Ar, He, or their mixtures. The PEB treatment is designed to (1) drive complete evaporation of organic fragments that are generated during EUV exposure and (2) oxidize any Sn—H, Sn—Sn, or Sn radical species generated by EUV exposure into metal hydroxide, and (3) facilitate cross-linking between neighboring Sn—OH groups to form a more densely crosslinked $SnO_2$-like network. The bake temperature is carefully selected to achieve optimal EUV lithographic performance. Too low a PEB temperature would lead to insufficient cross-linking, and consequently less chemical contrast for development at a given dose. Too high a PEB temperature would also have detrimental impacts, including severe oxidation and film shrinkage in the unexposed region (the region that is removed by development of the patterned film to form the mask in this example), as well as, undesired interdiffusion at the interface between the photopatterned metal-containing EUV resist and an underlayer, both of which can contribute to loss of chemical contrast and an increase in defect density due to insoluble scum. The PEB treatment temperature may be between about 100° C. and about 300° C., between about 170° C. and about 290° C., or between about 200° C. and about 240° C. In some embodiments, the PEB treatment may be conducted with a pressure between atmospheric and vacuum, and a treatment duration of about 1 to 15 minutes, for example about 2 minutes. In some embodiments, PEB thermal treatment may be repeated to further increase etch selectivity.

At block 112 of the process 100, the photopatterned metal-containing EUV resist is developed to form a resist mask. In various embodiments, the exposed regions are removed (positive tone) or the unexposed regions are removed (negative tone). In some embodiments, development may include selective deposition on either the exposed or unexposed regions of the photopatterned metal-containing EUV resist, followed by an etching operation. In various embodiments, these processes may be dry processes or wet processes. The development may be done with flows of halogen-containing gas(es) without striking a plasma in some embodiments. Or, development may be done with flows of halogen-containing gas(es) activated in a remote plasma source or activated by exposure to remote UV radiation. The photoresist for development may include an element selected from the group consisting of: tin, hafnium, tellurium, bismuth, indium, antimony, iodine, and germanium. The element may have a high patterning radiation-absorption cross-section. In some embodiments, the element may have a high EUV-absorption cross-section. In some embodiments, the metal-containing EUV resist may have an overall absorption greater than 30%. In an all-dry lithography process, this provides more efficient utilization of EUV photons, enabling development of thicker and more EUV-opaque resists.

Examples of processes for development involve an organotin oxide-containing EUV-sensitive photoresist thin film (e.g., 10-30 nm thick, such as 20 nm), subjected to a EUV exposure dose and post-exposure bake, and then developed. The photoresist film may be, for example, deposited based on a gas phase reaction of an organotin precursor such as isopropyl(tris)(dimethylamino)tin and water vapor, or may be a spin-on film comprising tin clusters in an organic matrix.

Figure 2A:
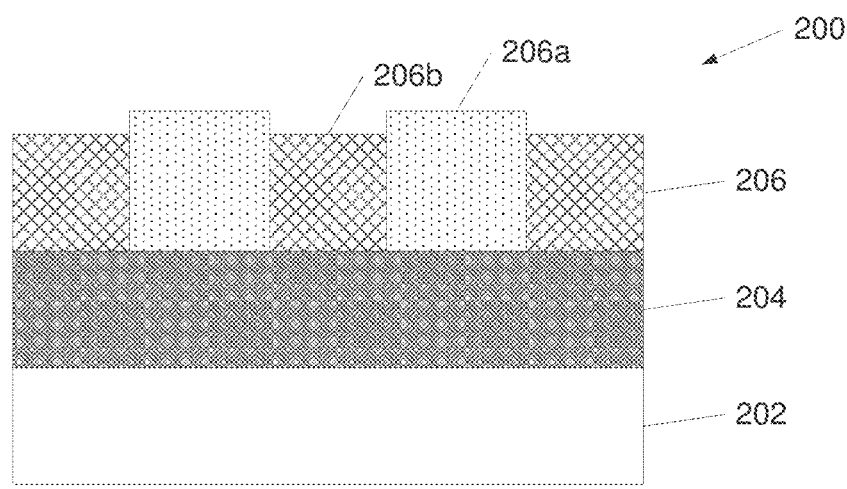
FIGS. 2A-2C show cross-sectional schematic illustrations of various processing stages of dry development according to some embodiments.
Figure 2B:
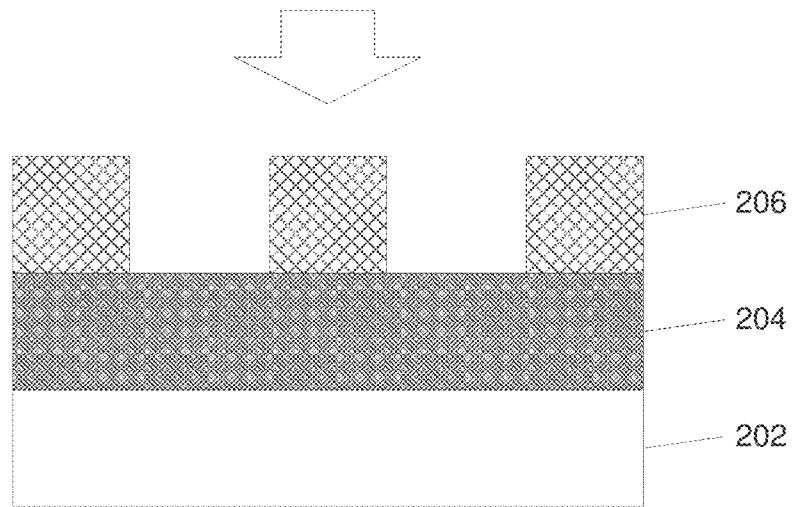
Figure 2C:
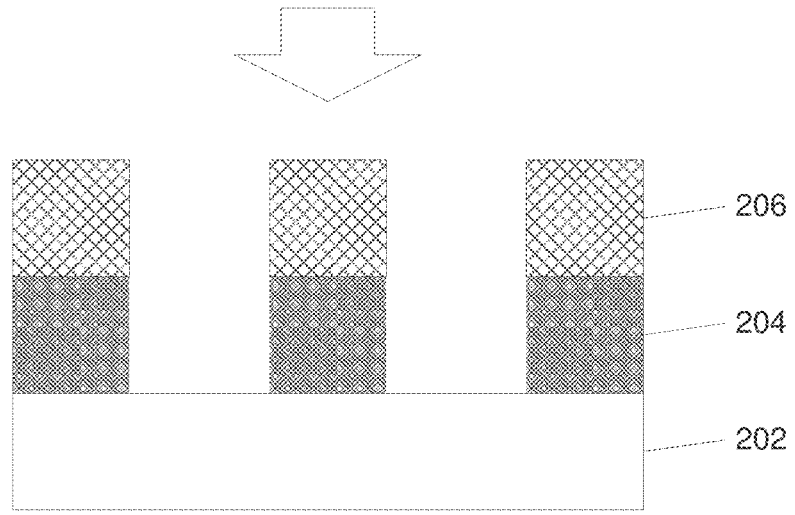

FIGS. 2A-2C show cross-sectional schematic illustrations of various processing stages of dry development according to some embodiments. The example shown in FIGS. 2A-2C illustrates negative tone dry development. As shown in FIG. 2A, a wafer 200 includes a substrate 202 and a substrate layer 204 to be etched. In some embodiments, the substrate layer 204 includes an ashable hard mask such as spin-on carbon (SoC) or other material, e.g., silicon, silicon oxide, silicon nitride, silicon carbide, etc. In some embodiments, the substrate layer 204 may be a layer stack disposed on the substrate 202. The wafer 200 further includes a photopatterned metal-containing EUV resist film 206. For example, the photopatterned metal-containing EUV resist film 206 may be an organo-metal-containing layer disposed on the substrate layer 204 to be etched. The photopatterned metal-containing EUV resist film 206 may have a thickness between about 5 nm and about 50 nm or between about 10 nm and about 30 nm. The photopatterned metal-containing EUV resist film 206 may be provided in a process chamber after photopatterning in an EUV scanner and/or after a PEB treatment as described above. The photopatterned metal-containing EUV resist film 206 includes non-EUV exposed regions 206a and EUV exposed regions 206b. As shown in FIG. 2B, the non-EUV exposed regions 206a of the photopatterned metal-containing EUV resist film 206 can be removed in a dry development process by exposure to flows of dry development chemistry without striking a plasma. The dry development chemistry may include a halogen-containing chemistry. A resist mask 208 is formed after development by removal of the non-EUV exposed regions 206a. Thereafter, the substrate layer 204 to be etched may be etched using the resist mask 208 to provide the structure depicted in FIG. 2C.

Returning to FIG. 1, the photopatterned metal-containing EUV resist is developed by exposure to a dry development chemistry at block 112, where the dry development chemistry is a halogen-containing chemistry. In some embodiments, dry development of the EUV resist is combined with other dry processing operations such as dry deposition (e.g., CVD) of the metal-containing EUV resist film.

In some embodiments, photoresist processing of the semiconductor substrate may combine all dry steps including film formation by vapor deposition, backside and/or bevel edge dry cleaning, PAB exposure, EUV lithographic patterning, PEB exposure, and dry development. Each of the operations at blocks 102-114 in the process 100 may be dry processing operations. Such processing operations may avoid material and productivity costs associated with wet processing operations such as wet development. Dry processing can provide more tunability and add further critical dimension (CD) control and scum removal. Wet development is limited by solubility and cluster size, whereas dry development is not limited by solubility and cluster size. Wet development is more prone to pattern collapse and delamination issues that dry development avoids.

In some embodiments, dry development processes can be done by using either a gentle plasma (high pressure, low power) or a thermal process while flowing the dry development chemistry. For example, dry development can be carried out in a thermal process using dry development chemistry. In some embodiments, dry development is able to quickly remove the unexposed material, leaving behind a pattern of the exposed film that can be transferred into the underlying layers by plasma-based etch processes, for example conventional etch processes.

In thermal development processes, the substrate is exposed to development chemistry (e.g., a Lewis Acid) in a process chamber (e.g., oven). Instead of requiring vacuum equipment for generating a vacuum environment in the process chamber, the process chamber may be exposed to atmospheric conditions. In other words, the process chamber for thermal development can expose the photopatterned metal-containing EUV resist to non-vacuum pressure, where non-vacuum pressure is between about 50 Torr and about 765 Torr, between about 100 Torr and about 765 Torr, or between about 300 Torr and about 765 Torr. In some embodiments, the process chamber for thermal development may expose the metal-containing EUV resist to above atmospheric pressure, where a chamber pressure is greater than about 760 Torr. In some embodiments, the process chamber for thermal development can expose the photopatterned metal-containing EUV resist to air or ambient gas(es). Ambient gases may include oxygen, nitrogen, carbon dioxide, water vapor, or combinations thereof. In some embodiments, the process chamber for thermal development can expose the photopatterned metal-containing EUV resist to a controlled atmosphere, where the controlled atmosphere includes exposure to nitrogen, water vapor, carbon dioxide, argon, helium, or combinations thereof.

The process chamber for thermal development may include one or more heating elements for temperature control. The one or more heating elements may be coupled to a heating assembly facing the semiconductor substrate in the process chamber for substrate temperature control. In some embodiments, the one or more heating elements may be one or more LEDs, where the LEDs may be arranged in a plurality of independently controllable heating zones. During dry development of the EUV resist, the semiconductor substrate may be subjected to an elevated temperature. Temperature may be tuned, where temperature may influence various aspects of development such as etch selectivity. In some embodiments, dry development includes heating the semiconductor substrate to a temperature equal to or greater than about 50° C., equal to or greater than about 100° C., equal to or greater than about 120° C., or between about 100° C. and about 230° C.

The process chamber for thermal development may include an etch gas delivery nozzle or etch gas distributor positioned over the substrate support. Etch gas flow rate may be tuned, where gas flow may influence etch selectivity between exposed and unexposed regions during development. In some embodiments, gas flow rate is between 0.5 SLM and about 30 SLM, between about 1 SLM and about 20 SLM, or between about 2 SLM and about 15 SLM. The gas flow rate includes a total flow rate of gases flowed, including the etch gas and carrier gas such as nitrogen, argon, etc. The etch gas flow rate may only be a fraction of the total flow rate, where the etch gas flow rate may be between about 0.01 SLM and about 1 SLM. Duration of exposure may be tuned in the thermal development process. The duration of exposure may depend on how much resist is desired to be removed, development chemistry, amount of crosslinking in the resist, and composition and properties of the resist, among other factors. In some embodiments, duration of exposure may be between about 1 second and about 50 minutes, between about 3 seconds and about 20 minutes, or between about 10 seconds and about 6 minutes.

Etch selectivity during dry development is tunable by controlling process conditions such as temperature, pressure, gas flow, gas composition, and plasma power, among other tunable process conditions. Tuning etch selectivity in a single step or multiple steps may achieve desired patterned characteristics. In some embodiments, etch selectivity during dry development is tuned across one or more steps to influence EUV resist profile. More specifically, the amount of taper or a re-entrant angle in the EUV resist profile can be controlled by applying development chemistry of different etch selectivity over one or more steps. Descumming, photoresist reworking, curing, smoothing, and cleaning operations may also be tuned according to a tunable etch selectivity.

In some embodiments, the process chamber for dry development may be a plasma-free thermal process chamber. The plasma-free thermal process chamber may be incapable of generating a direct or remote plasma. In some other embodiments, the process chamber for dry development may be coupled to a direct or remote plasma source. The plasma source may be useful for generating plasma for dry development or subsequent desorption, descumming, and smoothing operations.

In some embodiments, dry development in the process chamber may be performed in a bake chamber such as a bake chamber for performing PAB exposure at block 106 or a bake chamber for performing PEB exposure at block 110. In some embodiments, dry development in the process chamber may be performed in a wafer cleaning chamber such as a bevel edge cleaning chamber for performing a bevel edge clean at block 104. In some embodiments, dry development in the process chamber may be performed in a wafer cleaning chamber such as a spin-clean chamber. In some embodiments, dry development in the process chamber may be performed in a treatment chamber such as a HMDS treatment chamber. In some embodiments, dry development in the process chamber may be performed in a batch furnace reactor. In some embodiments, dry development in the process chamber may be performed in a single or mini-batch buffer module.

At block 114 of the process 100, the semiconductor substrate optionally undergoes a hard bake. During the hard baking process, the semiconductor substrate is subjected to an elevated temperature. For example, the semiconductor substrate may be subjected to an elevated temperature equal to or greater than about 50° C., between about 100° C. and about 300° C., or between about 170° C. and about 290° C. The hard baking process may drive out remaining solvents or etch gas from dry development.

Figure 3A:
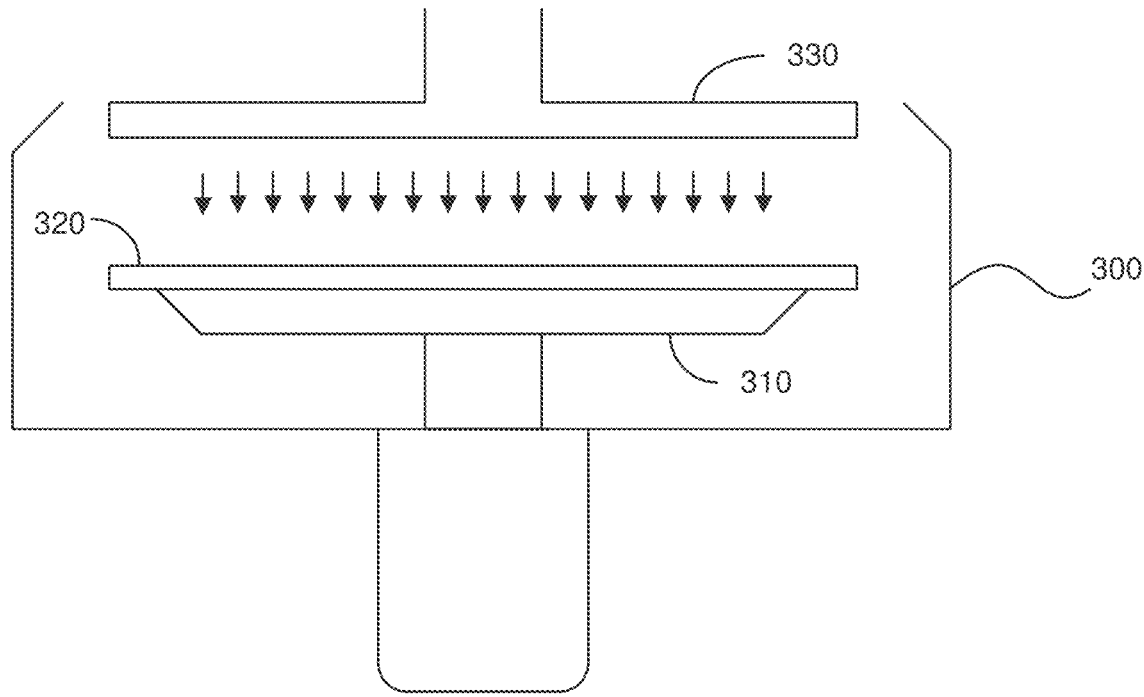
FIGS. 3A and 3B show schematic diagrams of example process chambers for performing dry etch of photoresist according to some embodiments.
Figure 3B:
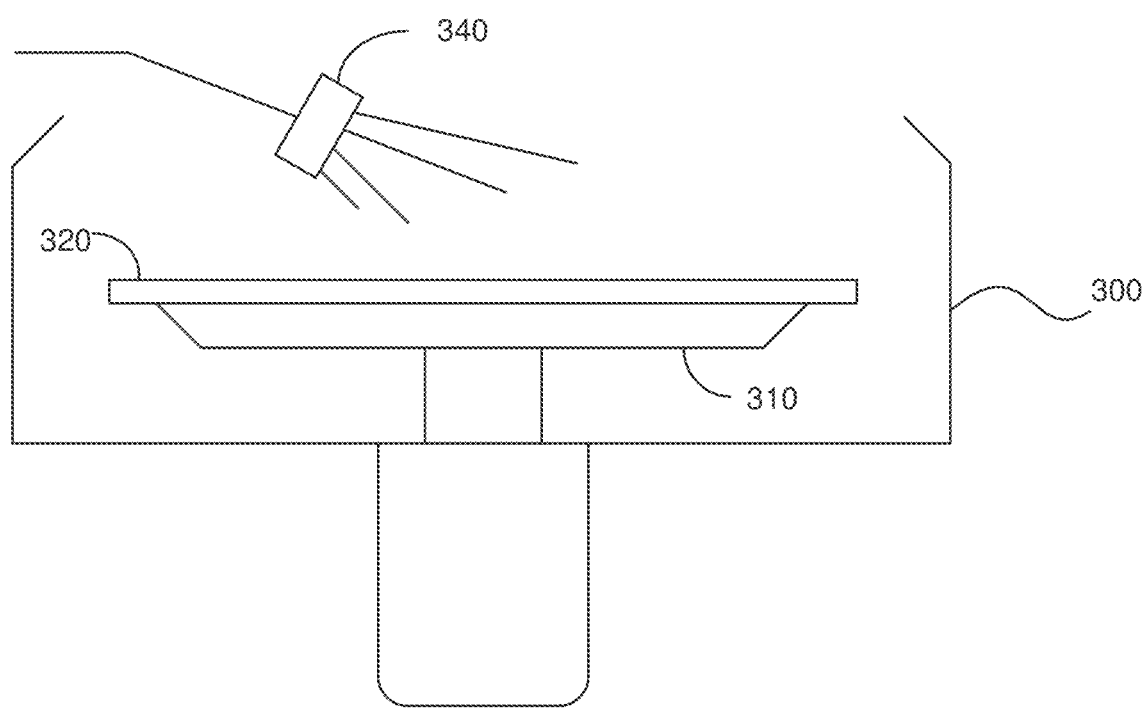

FIGS. 3A and 3B show schematic diagrams of example process chambers for performing dry etch of photoresist according to some embodiments. In FIGS. 3A and 3B, a process chamber 300 is open to the atmosphere. The process chamber 300 includes a platen or substrate support 310 on which a semiconductor substrate 320 is supported. In some embodiments, the substrate support 310 may be coupled to one or more heaters (not shown) configured to control a substrate temperature of the semiconductor substrate 320. In some embodiments, the substrate support 310 may be configured to spin the semiconductor substrate 320 so that the semiconductor substrate 320 rotates. In some embodiments, the substrate support 310 may be a bake plate used in PAB or PEB treatment. Surprisingly, without bringing the process chamber 300 to vacuum, dry etch (e.g., dry development) of EUV resist can be performed at atmospheric pressure in an open air environment or performed in a controlled atmosphere above atmospheric pressure. In some embodiments, the process chamber for performing dry etch may be a non-plasma based thermal process chamber. In other words, the non-plasma based thermal process chamber may be incapable of generating a direct or remote plasma. In some other embodiments, the process chamber for performing dry etch may be a plasma-based process chamber.

In FIG. 3A, an apparatus includes a process chamber 300, where the process chamber 300 is exposed to atmospheric conditions. In some embodiments, the process chamber 300 is a bake chamber. In some embodiments, the apparatus includes a bake plate 310 for supporting the semiconductor substrate 320 in the process chamber 300. In some embodiments, the bake plate 310 includes an upper surface and a plurality of minimum contact area (MCA) supports (not shown) for supporting the semiconductor substrate at a height above the upper surface of the bake plate 310. The bake plate 310 may include a plurality of heating zones (not shown), where each of the plurality of heating zones includes one or more heating elements. The apparatus further includes an etch gas distributor 330 positioned over the bake plate 310. The etch gas distributor 330 may be a showerhead having a faceplate that faces the semiconductor substrate 320, where the faceplate includes a plurality of through-holes for delivery of etch gas to the semiconductor substrate 320. The showerhead may serve to introduce etch gas during dry development, dry bevel edge cleaning, or other dry photoresist process. In some embodiments, the showerhead may deliver the etch gas to the semiconductor substrate 320 as a whole or locally in certain regions. Though the process chamber 300 is not necessarily brought to vacuum, an exhaust fan or pump may be coupled to the process chamber 300 to remove etch byproducts and other residual gases.

In FIG. 3B, an apparatus includes a process chamber 300, where the process chamber 300 is exposed to atmospheric conditions. It will be understood that the process chamber 300 is not necessarily connected to any vacuum pump or other vacuum equipment. However, the process chamber 300 may be coupled to an exhaust fan or pump to remove etch byproducts and other residual gases. In some embodiments, the process chamber 300 is a wafer spin-clean chamber. In some embodiments, the apparatus includes a substrate support 310 for holding the semiconductor substrate 320 in the process chamber 300. The substrate support 310 may be configured to rotate the semiconductor substrate 320. The apparatus further includes a heating assembly (not shown) that faces the semiconductor substrate 320 in the process chamber 300, where the heating assembly includes a plurality of heating elements. The plurality of heating elements may include a plurality of LEDs, where the plurality of LEDs may be arranged in a plurality of independently controllable heating zones. The apparatus further includes an etch gas delivery nozzle 340 positioned over the substrate support 310, where the etch gas delivery nozzle 340 is movable to position the delivery of etch gas to a location over the semiconductor substrate 320. In some embodiments, the etch gas delivery nozzle 340 is coupled to a movable swing arm for positioning the etch gas delivery nozzle 340 locally over certain regions of the semiconductor substrate 320. For instance, the movable swing arm may radially position the etch gas delivery nozzle 340 from center to edge of the semiconductor substrate 320. In some embodiments, the etch gas delivery nozzle 340 is angled or normal to the surface of the semiconductor substrate 320.

A process chamber for dry development or bevel edge cleaning of photoresist may be implemented in a track lithography system. It is common for many of the steps associated with photolithography to be performed in a multi-chamber system or cluster tool that has the capability to sequentially process semiconductor substrates in a controlled manner. The cluster tool that is used to deposit and develop photoresist material may also be referred to as a track lithography tool. Track lithography tools typically include a mainframe that houses multiple process chambers dedicated to performing various aspects of photolithography. Some may be wet processing chambers and some may be dry processing chambers. Some may be exposed to an open air environment and some may be enclosed in a vacuum environment. The process chamber for dry removal may be exposed to an open air environment or controlled atmosphere above atmospheric pressure in the track lithography tool. Track lithography tools frequently include pod/cassette mounting devices to receive and return semiconductor substrates to a clean room. Track lithography tools also frequently include transfer robots to transfer semiconductor substrates between various chambers/stations.

Figure 4:
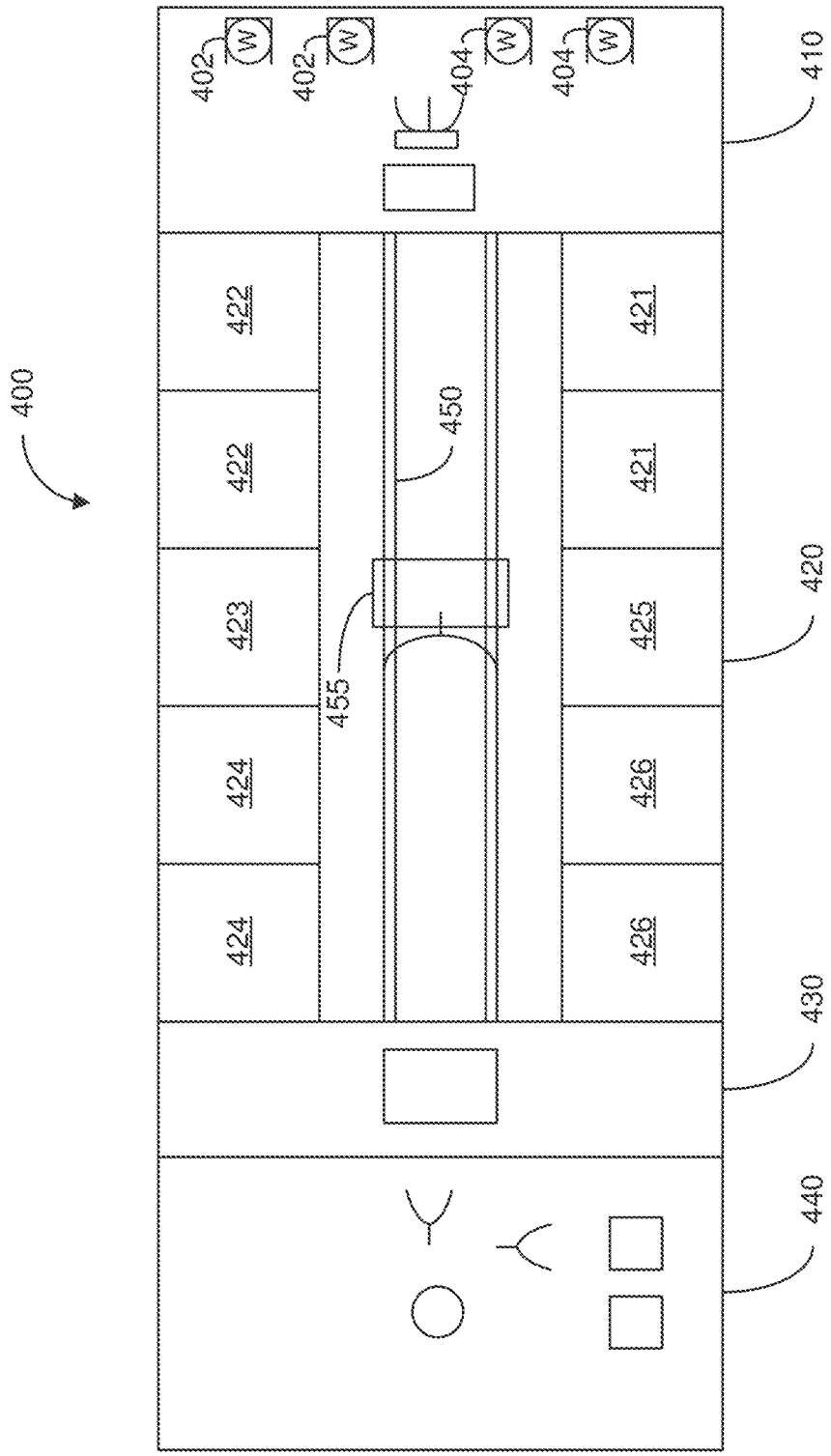
FIG. 4 shows a schematic illustration of an example system architecture or track system for photoresist processing according to some embodiments.

FIG. 4 shows a schematic illustration of an example system architecture or track system for photoresist processing according to some embodiments. A track system 400 includes a cassette mounting section 410, a processing section 420, an interface section 430, and an exposure section 440. Semiconductor wafers W may be received at cassette 402 and returned at cassette 404. The processing section 420 may have a plurality of process chambers or stations 421-426. A conveying robot 455 may be configured to move along a central passage 450 for transferring the semiconductor wafers between chambers. In the present disclosure, at least one of the plurality of process chambers or stations 421-426 are exposed to atmospheric conditions and configured to perform dry removal of one or more portions of metal-containing EUV resist from the semiconductor wafer W.

The exposure section 440 is connected to the processing section 420 through the interface section 430. The exposure section 440 may include a scanner for exposing photosensitive materials on the semiconductor wafer W to electromagnetic radiation (e.g., EUV radiation).

The processing section 420 may include one or more deposition chambers 421 for depositing photoresist material onto the semiconductor wafer W. One of the deposition chambers 421 may be configured to deposit a resist coating such as an antireflective coating and another one of the deposition chambers 421 may be configured to deposit photoresist material. The processing section 420 may further include a wafer cleaning chamber 422. For example, wafer cleaning chamber 422 may clean the semiconductor wafer W with a jet stream of pure water. The processing section 420 may further include a treatment chamber 423. For instance, the treatment chamber 423 may include an adhesion processing chamber for subjecting a surface of the semiconductor wafer W to HMDS. In some embodiments, the processing section 420 further includes a one or more bake chambers 424. For instance, each of the bake chambers 424 may have one or more bake plates for heating the semiconductor wafer W. The bake chambers 424 may perform PAB treatments or PEB treatments in photoresist processing. In some embodiments, the processing section 420 further includes a scrubbing station 425 for scrubbing the semiconductor wafer W with rotating brushes. In some embodiments, processing section 420 optionally includes development chambers 426 for developing the photoresist using development chemistry.

In the present disclosure, it will be understood that the process chamber for dry removal may be any of the process chambers 421-426 in the track lithography system 400. Thus, rather than a dedicated station for dry removal, a process chamber in the track lithography system 400 may be modified to perform dry removal or integrated to perform dry removal with baking, cleaning, scrubbing, treatment, deposition, or other photoresist processing function. By way of an example, the deposition chamber 421 for depositing metal-containing EUV may be configured to perform dry removal of the one or more portions of the metal-containing EUV resist from the semiconductor wafer W. In another example, the bake chamber 424 may be configured to perform dry removal of the one or more portions of the metal-containing EUV resist from the semiconductor wafer W. In yet another example, the wafer cleaning chamber 422 may be configured to perform dry removal of the one or more portions of the metal-containing EUV resist from the semiconductor wafer W. In still yet another example, the HMDS treatment chamber for treating a surface of the semiconductor wafer W may be configured to perform dry removal of the one or more portions of the metal-containing EUV resist from the semiconductor wafer W. Or, the development chamber 426 may be modified to perform baking, cleaning, scrubbing, treatment, deposition, or other photoresist processing function with dry removal. Dry removal may be performed in atmospheric conditions.

Figure 5:
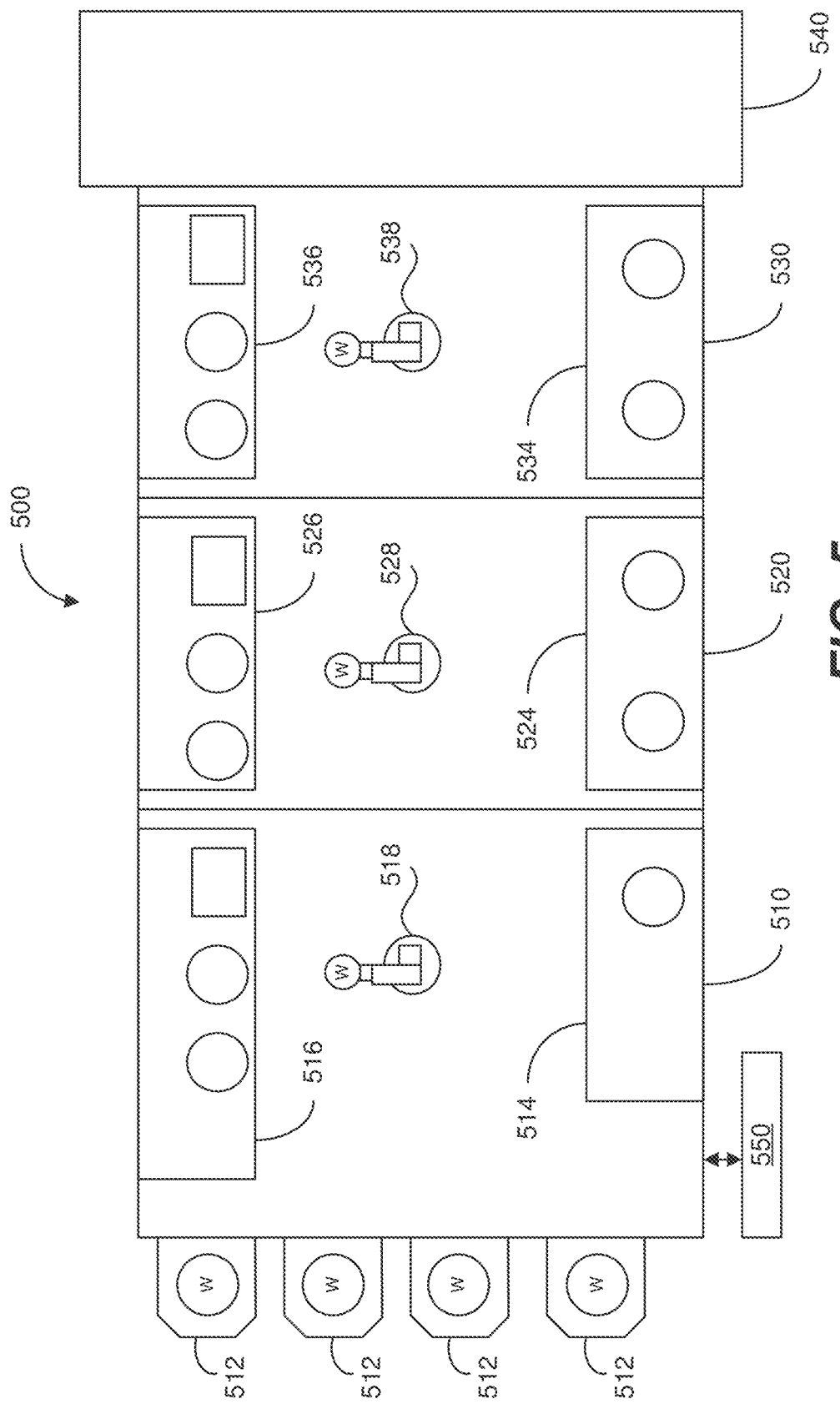
FIG. 5 shows a schematic illustration of an alternative example system architecture or track system for photoresist processing according to some embodiments.

FIG. 5 shows a schematic illustration of an alternative example system architecture or track system for photoresist processing according to some embodiments. A track lithography system 500 includes a front end module 510 that is sometimes referred to as a factory interface, a central module 520, and a rear module 530 that is sometimes referred to as a scanner interface. The front end module 510 includes one or more pods or front opening unified pods (FOUPs) 512. The FOUPs 512 are configured to receive one or more semiconductor wafers W that are to be processed in the track lithography system 500.

The front end module 510 includes a first processing rack 514 and a second processing rack 516 with a front end robot 518. The central module 520 includes a first processing rack 524 and a second processing rack 526 with a central robot 528. The rear module 530 includes a first processing rack 534 and a second processing rack 536 with a back end robot 538. In some embodiments, the processing racks 534 and 536 in the rear module 530 may be configured to exchange semiconductor wafers W with a stepper or scanner 540. The scanner 540 exposes photoresist materials deposited on the semiconductor wafer to some form of electromagnetic radiation (e.g., EUV radiation).

Each of the processing racks 514, 516, 524, 526, 534, and 536 may contain multiple processing modules in a vertically stacked arrangement. That is, each of the processing racks 514, 516, 524, 526, 534, and 536 may contain multiple stacked coating modules, thermal or bake modules, cleaning modules, developer modules, or other modules adapted to perform photoresist processing steps. By way of an example, the coating modules may deposit antireflective coating or photoresist layers, thermal and bake modules may perform bake/chill operations, and developer modules may perform development operations. A processing rack in the track lithography system 500 may be modified to perform dry removal or integrated to perform dry removal with coating, thermal or bake operation, cleaning, or other photoresist processing function. The processing rack may be exposed to atmospheric conditions for performing dry removal.

In some embodiments, the track lithography system 500 further includes a controller 550 configured to communicate with the scanner 540, and monitor and control aspects of the processes performed in the front end module 510, the central module 520, and the rear module 530. Aspects of a controller 550 are described in further detail below.

A dry etch process (e.g., dry development) under atmospheric conditions may be performed in a thermal process chamber such as a bake plate or oven. In some embodiments, the thermal process chamber may additionally perform PAB or PEB treatment in photoresist processing. In some embodiments, the method of depositing and developing photoresist includes baking the metal-containing EUV resist at an elevated temperature in the same process chamber as dry developing the metal-containing EUV resist. In some embodiments, the method of depositing and developing photoresist includes baking the metal-containing EUV resist at an elevated temperature in the same process chamber as bevel edge cleaning the metal-containing EUV resist from the semiconductor substrate.

The PAB or PEB thermal treatment increases the substrate temperature to an elevated temperature such as between about 100° C. and about 170° C. or between about 120° C. and about 150° C. In some embodiments, the substrate temperature may be controlled using a radiative heat source such as an IR lamp or one or more LEDs. The radiative heat source may be positioned below the substrate. Alternatively, the radiative heat source may be positioned above the substrate. The substrate temperature may be actively controlled by a pyrometer in a feedback control loop established with the radiative heat source. The atmosphere during PAB or PEB thermal treatment may be controlled by flowing inert gases such as Na, Ar, He, Xe, or Ne, where the inert gases may be mixed with $O_2$ and/or $H_2O$. In some embodiments, the pressure during PAB or PEB thermal treatment may be controlled to atmospheric pressure or less. In some embodiments, the pressure during PAB or PEB treatment may be controlled to above atmospheric pressure.

In some embodiments, the thermal process chamber includes a substrate support made of highly conductive metal such as aluminum that may be used to spread heat from a source to provide heating of the semiconductor substrate. In some embodiments, the thermal process chamber includes a bake plate having one or more resistive heating elements embedded or in thermal communication with the bake plate. The bake plate may include a plurality of heater zones to control various zone temperatures. In some embodiments, one or more proximity pins or MCA supports may be configured to adjust a height of the semiconductor substrate above an upper surface of the bake plate to control substrate temperature. In some embodiments, a face plate may be positioned above the bake plate, where a face plate temperature may further provide control to substrate temperature.

A dry etch process (e.g., dry development) under atmospheric conditions may be performed in a batch furnace reactor. The batch furnace reactor may be a vertical oven for processing several substrates at a time and may operate across a large pressure range. For example, such a vertical oven may operate at a pressure between about 50 Torr and about 765 Torr, or equal to or greater than about 760 Torr. Operating at above atmospheric pressure may be useful to avoid leak-in contamination by oxygen or air.

Figure 6:
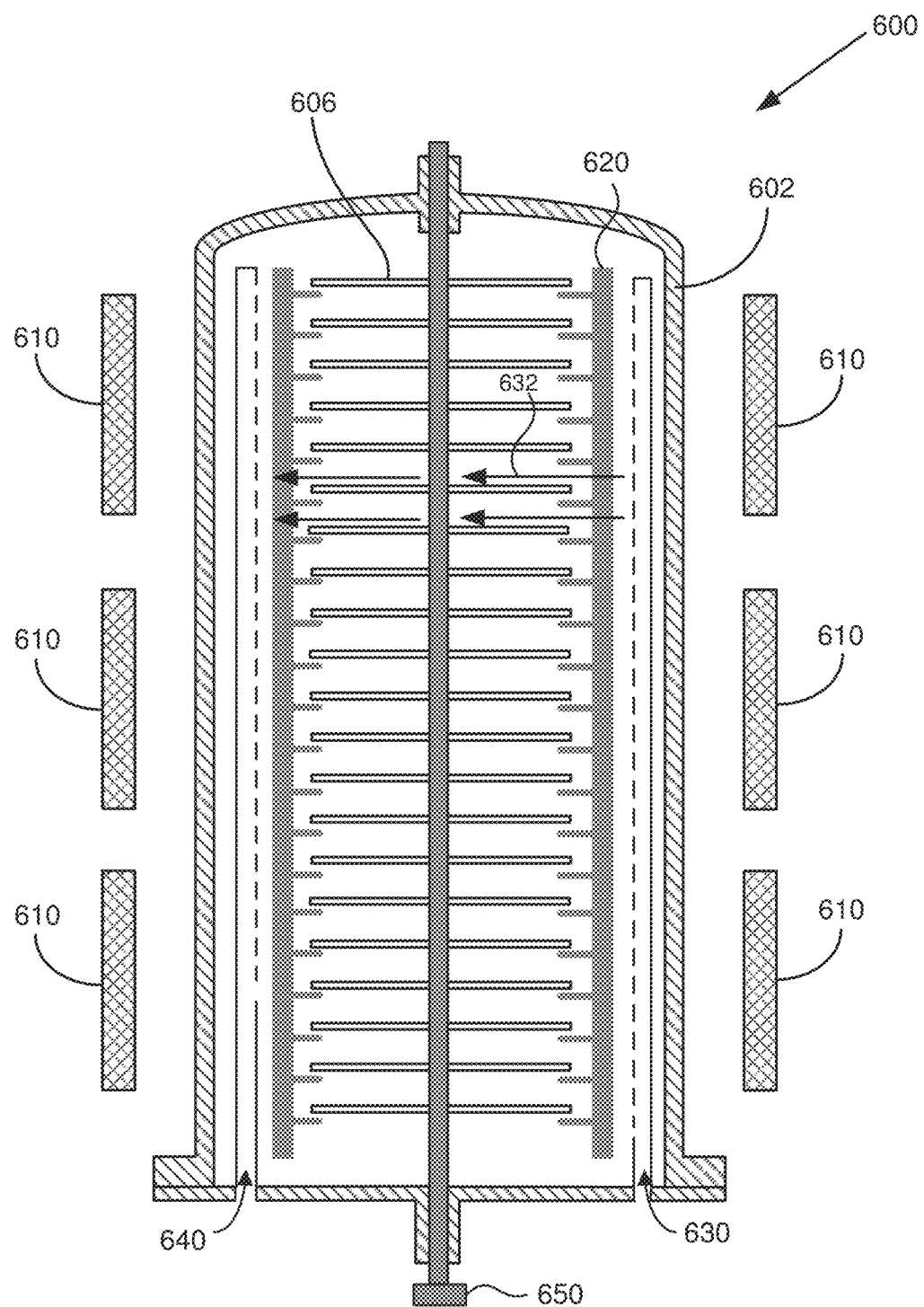
FIG. 6 shows a schematic illustration of an example batch vertical furnace for performing dry etch of photoresist according to some embodiments.

FIG. 6 shows a schematic illustration of an example batch vertical furnace for performing dry etch of photoresist according to some embodiments. The batch vertical furnace 600 may be a vertical oven for batch processing of substrates 606. The batch vertical furnace 600 may include a substrate support 620 for holding a plurality of substrates 606. As shown in FIG. 6, the plurality of substrates 606 may be supported and stacked over one another. Each of the substrates 606 may be supported by the substrate support 620 and held by gravity. This allows for tens or hundreds of substrates 606 to be batch processed in a single run through the batch vertical furnace 600. The batch vertical furnace 600 includes a plurality of heating elements 610 for subjecting the plurality of substrates 606 to an elevated temperature. As shown in FIG. 6, the plurality of heating elements 610 may surround chamber walls 602 of the batch vertical furnace 600. However, it will be understood that the plurality of heating elements 610 may be incorporated in the substrate support 620. In some embodiments, the substrate support 620 may be a plurality of plates for holding each of the plurality of substrates 606. In some embodiments, the substrate support 620 may support each of the plurality of substrates 606 at the edges such as in a slotted support frame.

The batch vertical furnace 600 further includes one or more etch gas inlets 630 for delivering etch gas into a furnace reactor enclosed by the chamber walls 602 of the batch vertical furnace 600. The one or more etch gas inlets 630 may additionally or alternatively deliver precursor gas for deposition operations or purge gas for purging operations. The one or more etch gas inlets 630 may provide gas flow 632 from side to side or parallel across substrate surfaces of the plurality of substrates 606. This promotes gas flow uniformity across the substrates 606. Each of the plurality of substrates 606 may include metal-containing EUV resist. The etch gas may react with metal-containing EUV resist to remove one or more portions of metal-containing EUV resist from the plurality of substrates. This may occur in a bevel edge cleaning process, dry development, or other photoresist processing operation.

In some embodiments, the batch vertical furnace 600 further includes a motor 650 configured to rotate the substrate support 620. That way, the plurality of substrates 606 may be rotated while exposed to the elevated temperature and/or exposed to the etch gas. This mitigates potential differences attributable to gas inlet and/or exit positions. In some embodiments, the batch vertical furnace 600 further includes one or more gas outlets 640. The one or more gas outlets 640 may be configured to remove etch byproducts and residual gases from the batch vertical furnace 600. In some embodiments, the one or more gas outlets 640 may be coupled to a vacuum pump or exhaust fan.

In some embodiments, the chamber walls 602 of the batch vertical furnace 600 includes a material that is resistant to the etch gas, particularly where the etch gas includes a halogen-based compound such as HBr, HCl, or $BCl_3$. For example, the material of the chamber walls 602 may include quartz, a ceramic material, or a low-temperature polymer material rather than an aluminum-based material that more easily corrodes. In some embodiments, the low-temperature polymer material may be polytetrafluoroethylene (PTFE). The batch vertical furnace 600 may be useful in dry development or other photoresist processes that do not demand low temperatures, tight control of etch reactant stoichiometry, or gas flow uniformity across the substrate surfaces.

A dry etch process (e.g., dry development) under atmospheric conditions may be performed in a single or mini-batch buffer module. Such buffer modules may provide a controlled atmosphere. The controlled atmosphere may be employed in a heating step or cooldown step. The controlled atmosphere may include exposure to air or ambient gas(es), or the controlled atmosphere may include exposure to nitrogen, water vapor, carbon dioxide, argon, helium, or combinations thereof. In some embodiments, the controlled atmosphere may operate at atmospheric pressure or above atmospheric pressure.

The buffer module may hold one or more substrates, where the substrates may include a metal-containing EUV resist. The single or mini-batch buffer module may include one or more etch gas inlets for delivering etch gas to the one or more substrates. The etch gas may remove one or more portions of the metal-containing EUV resist. In some embodiments, the buffer module may be employed in 300 mm wafer FOUP or storage cases. The buffer module may be directly applicable for performing slow and/or high temperature degas operations to remove etch byproducts such as volatile tin-containing byproducts.

A dry etch process (e.g., dry development) under atmospheric conditions may be performed in a wafer cleaning chamber. Wafer cleaning chambers may be equipped with one or more discharge nozzles for delivering gas or liquid to the semiconductor substrate. In some embodiments, the wafer cleaning chamber may have a substrate support or chuck configured to rotate so that treatment fluids can be driven outwardly from the edge of a rotating substrate. In some embodiments, the substrate support or chuck may include or may be coupled to one or more heating elements for heating the semiconductor substrate. Heating the semiconductor substrate may typically promote evaporation of a rinse liquid. In some embodiments, the wafer cleaning station may be configured for bevel edge cleaning of the semiconductor substrate. In some embodiments, the wafer cleaning station may be a plasma-free thermal process station or chamber. In some other embodiments, the wafer cleaning station may be equipped to generate a direct or remote plasma for performing desorption, descumming, and smoothing operations.

In some embodiments, the method of depositing and developing photoresist includes performing bevel edge cleaning of the semiconductor substrate in the same process chamber as dry developing the metal-containing EUV resist. In some embodiments, the method of depositing and developing photoresist includes dry developing the metal-containing EUV resist in the same process chamber as performing bevel edge cleaning of the semiconductor substrate.

Figure 7A:
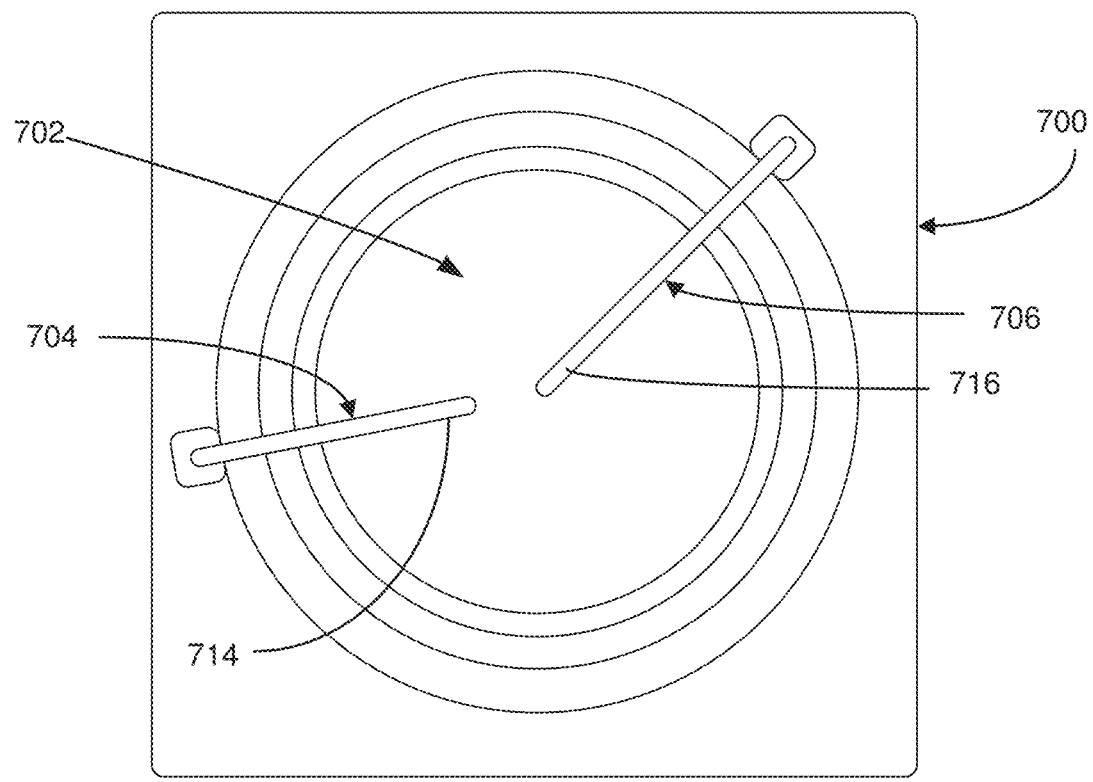
FIGS. 7A and 7B show schematic depictions of wafer cleaning stations configured for performing dry etch of photoresist according to some embodiments.
Figure 7B:
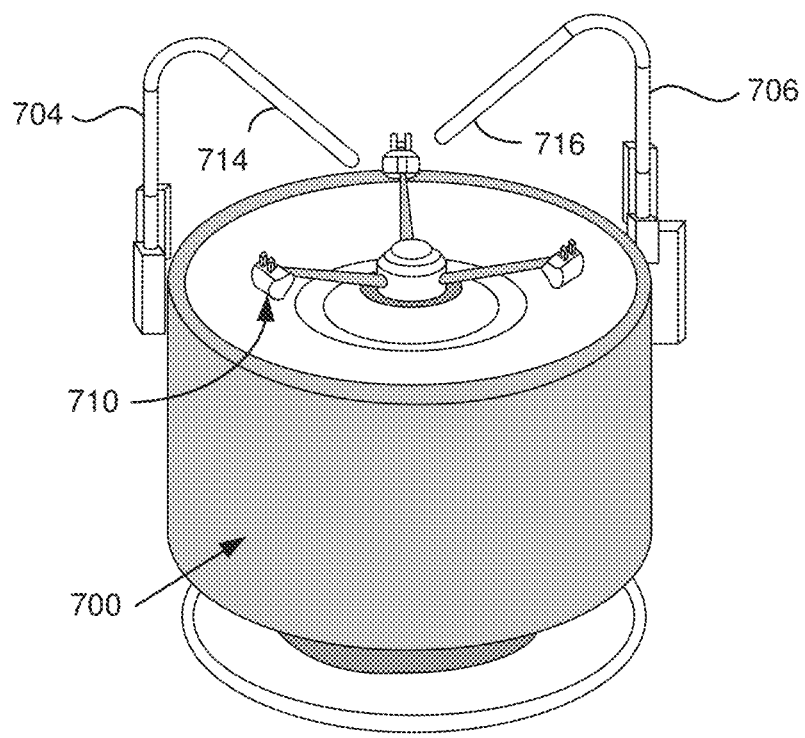

FIGS. 7A and 7B show schematic depictions of wafer cleaning stations configured for performing dry etch of photoresist according to some embodiments. In some embodiments, the wafer cleaning station 700 may be a spin-rinse-dry cleaning station. The wafer cleaning station 700 includes a substrate support 710, a liquid nozzle 714, and a gas nozzle 716. The liquid nozzle 714 may be mounted on a liquid delivery arm or movable swing arm 704 such that the liquid nozzle 714 is mounted at a distal end of the liquid delivery swing arm 704. The gas nozzle 716 may be mounted on a gas delivery arm or movable swing arm 706 such that the gas nozzle 716 is mounted at a distal end of the gas delivery swing arm 706. As shown in FIGS. 7A and 7B, both nozzles 714, 716 are positioned such that delivery of liquid or gas would be directed to the center of the semiconductor substrate 702. Treatment fluid may be dispensed from a liquid nozzle 714 to the semiconductor substrate 702. In some embodiments, the treatment fluid may be dispensed as a jet of water. During a cleaning operation, the semiconductor substrate 702 may be rotating and the liquid nozzle 714 may be delivering treatment fluid to the semiconductor substrate 702 such that the treatment fluid is flung out from the edge of the semiconductor substrate 702 due to the centrifugal force acting on the treatment fluid. The liquid nozzle 714 can be pivoted towards the edge of the semiconductor substrate 702. A gas nozzle 716 may assist in drying the surface of the semiconductor substrate 702. The gas nozzle 716 may be pivoted such that it rotates along an axis, where the gas nozzle 716 can pivot away from the center of the semiconductor substrate 702. Put another way, the gas nozzle 716 can move radially outward towards the edge of the semiconductor substrate 702. The gas nozzle 716 may be configured for other methods of movement such as translation or rotation. The positioning of the liquid nozzle 714 and/or the gas nozzle 716 may be controlled via a controller and a feedback loop.

The wafer cleaning station 700 may be modified or integrated for dry development and/or dry bevel edge cleaning under atmospheric conditions. Specifically, the gas nozzle 716 and gas delivery arm 706 may serve to deliver etch gas for development of photoresist or bevel edge cleaning of photoresist. The gas delivery arm 706 is movable for precise positioning of the gas nozzle 616 over certain localized regions of the semiconductor substrate 602. Localized gas delivery above the semiconductor substrate 702 may enable greater uniformity in dry developing or bevel edge cleaning of photoresist.

Figure 8A:
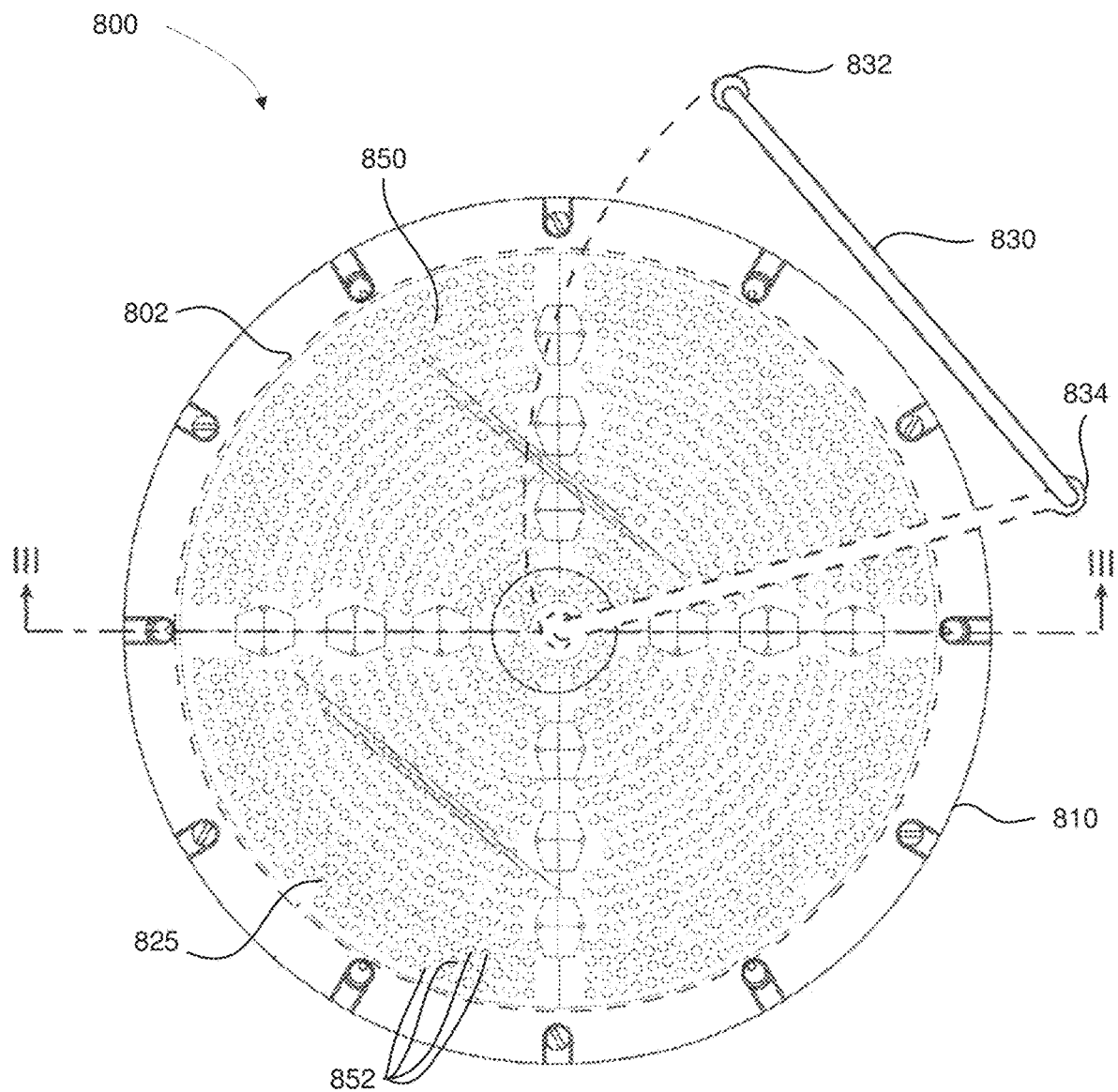
FIGS. 8A and 8B show schematic depictions of wafer cleaning and heating stations configured for performing dry etch of photoresist according to some embodiments.
Figure 8B:
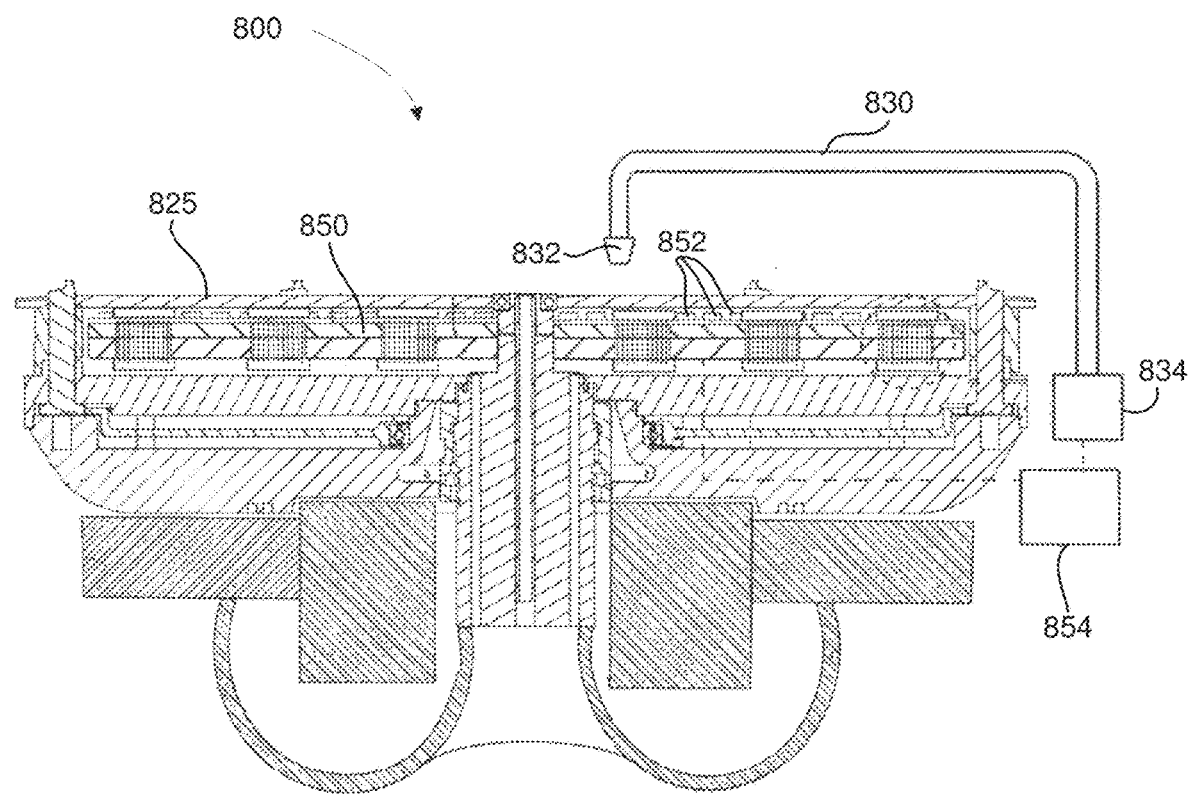

FIGS. 8A and 8B show schematic depictions of wafer cleaning and heating stations configured for performing dry etch of photoresist according to some embodiments. The wafer cleaning and heating station 800 may be configured for localized heating of a semiconductor substrate 802 and for delivery of a fluid (e.g., gas or liquid) to the semiconductor substrate 802. A rotary chuck 810 may be designed to hold and rotate the semiconductor substrate 802. In some embodiments, the semiconductor substrate 802 is held by a series of gripping pins 816. The gripping pins 816 may pass through openings in a plate 825, which may be made of quartz or sapphire. The plate 825 may be secured to the rotary chuck 810. When the semiconductor substrate 802 is positioned on the rotary chuck 810, it is held above the plate 825 so that the lower surface of the semiconductor substrate 802 is parallel to the plate 825 and spaced therefrom by a small gap. In some embodiments, the wafer cleaning and heating station 800 further includes an exhaust fan (not shown) for removal of etch byproducts and other residual gases from the wafer cleaning and heating station 800. In some embodiments, the wafer cleaning and heating station 800 further includes a gas source (not shown) for delivering inert or diluent gases into the wafer cleaning and heating station 800. The gas source may increase the pressure above atmospheric pressure and/or deliver useful gas to the semiconductor substrate 802.

Adjacent to the rotary chuck 810 is a movable swing arm 830, The movable swing arm 830 is mounted for pivotal motion about its drive motor 834. The movable swing arm 830 is supplied with a discharge fluid, which is discharged downwardly through its discharge nozzle 832. The movable swing arm 830 is movable between a standby position shown in a solid line and a central position shown in a broken line. The discharge nozzle 832 can therefore scan across the full radius of the semiconductor substrate 802, and when the semiconductor substrate 802 is rotated by the rotary chuck 810, dispense discharge fluid onto its entire upwardly-facing surface. In some embodiments of the present disclosure, the discharge fluid includes an etch gas for dry development of the metal-containing EUV resist or bevel edge cleaning of the metal-containing EUV resist. In some embodiments of the present disclosure, the wafer cleaning and heating station 800 may be exposed to an open air environment. For instance, a pressure in the wafer cleaning and heating station 800 may be between about 50 Torr and about 765 Torr. In some embodiments of the present disclosure, the wafer cleaning and heating station 800 may be in a controlled atmosphere. For instance, the controlled atmosphere may include exposure to atmospheric pressure or above atmospheric pressure. The controlled atmosphere may include exposure to inert or diluent gas(es) such as nitrogen, water vapor, carbon dioxide, argon, helium, or combinations thereof.

Beneath the plate 825 is a heating assembly 850. The heating assembly 850 is mounted on a stationary post 820 and therefore does not rotate. The heating assembly 850 may include a plurality of heating elements 852 for a plurality of independently controllable heating zones. In some embodiments, the plurality of heating elements 852 include a plurality of LEDs such as blue LEDs. Thus, the heating assembly 850 may be a radiant heating assembly. The plurality of heating elements 852 may be connected to a controller 854, where the controller 854 may control the turning on and off, as well as the power, of the plurality of heating elements 852. In some embodiments, the controller 854 further communicates with the drive motor 834 for positioning of the movable swing arm 830.

As shown in FIG. 8A, the plurality of heating elements 852 may be a plurality of LEDs arranged in several concentric circles. For instance, the plurality of LEDs may be arranged in twenty concentric circles and each circle is a multiple of sixteen. Accordingly, each concentric circle can be individually controlled as a separate heating zone by virtue of such an arrangement. The semiconductor substrate 802 may be considered to be divided into N zones 1, 2, 3, 4, . . . N, corresponding to the number of independently controllable heating zones of the heating assembly 850. This arrangement allows for rapid localized heating of the semiconductor substrate 802.

Control of the power supplied to the independently controllable heating zones of the heating assembly 850 may correspond to the radial position of the discharge nozzle 832. Thus, the controller 854 may control the power supply to the heating elements 852 of the relevant heating zones based on the radial position of the discharge nozzle 832.

In some embodiments, the discharge nozzle 852 may be positioned over regions of the semiconductor substrate 802 for dry development of metal-containing EUV resist. Furthermore, the heating assembly 850 may provide localized heating of regions of the semiconductor substrate 802 to promote dry development of the metal-containing EUV resist. In some embodiments, dry development of the metal-containing EUV resist in the wafer cleaning and heating station 800 may be performed in atmospheric conditions.

In some embodiments, the discharge nozzle 852 may be positioned over a bevel edge region of the semiconductor substrate 802 for bevel edge cleaning of the semiconductor substrate 802. Specifically, bevel edge cleaning exposes the bevel edge of the semiconductor substrate 802 to etch gas for removal of metal-containing EUV resist. The metal-containing EUV resist may be removed using etch gas at various temperatures, though higher temperatures may accelerate etch rates. In some embodiments, the heating assembly 850 may provide localized heating at the bevel edge of the semiconductor substrate 802 to promote removal of the metal-containing EUV resist. In some embodiments, bevel edge cleaning of the metal-containing EUV resist in the wafer cleaning and heating station 800 may be performed in atmospheric conditions.

An apparatus of the present disclosure is configured for dry etch of EUV resist. The dry etch may be performed in atmospheric conditions or in a process chamber with or without vacuum equipment. In some embodiments, the process chamber is a plasma-free thermal process chamber. The apparatus may be configured to perform other processing operations such as deposition, bevel and backside cleaning, post-application baking, EUV scanning, post-exposure baking, photoresist reworking, descum, smoothing, curing, and other operations. In some embodiments, the apparatus is configured to perform all dry operations. In some embodiments, the apparatus is configured to perform all wet operations. In some embodiments, the apparatus is configured to perform a combination of wet and dry operations.

Figure 9:
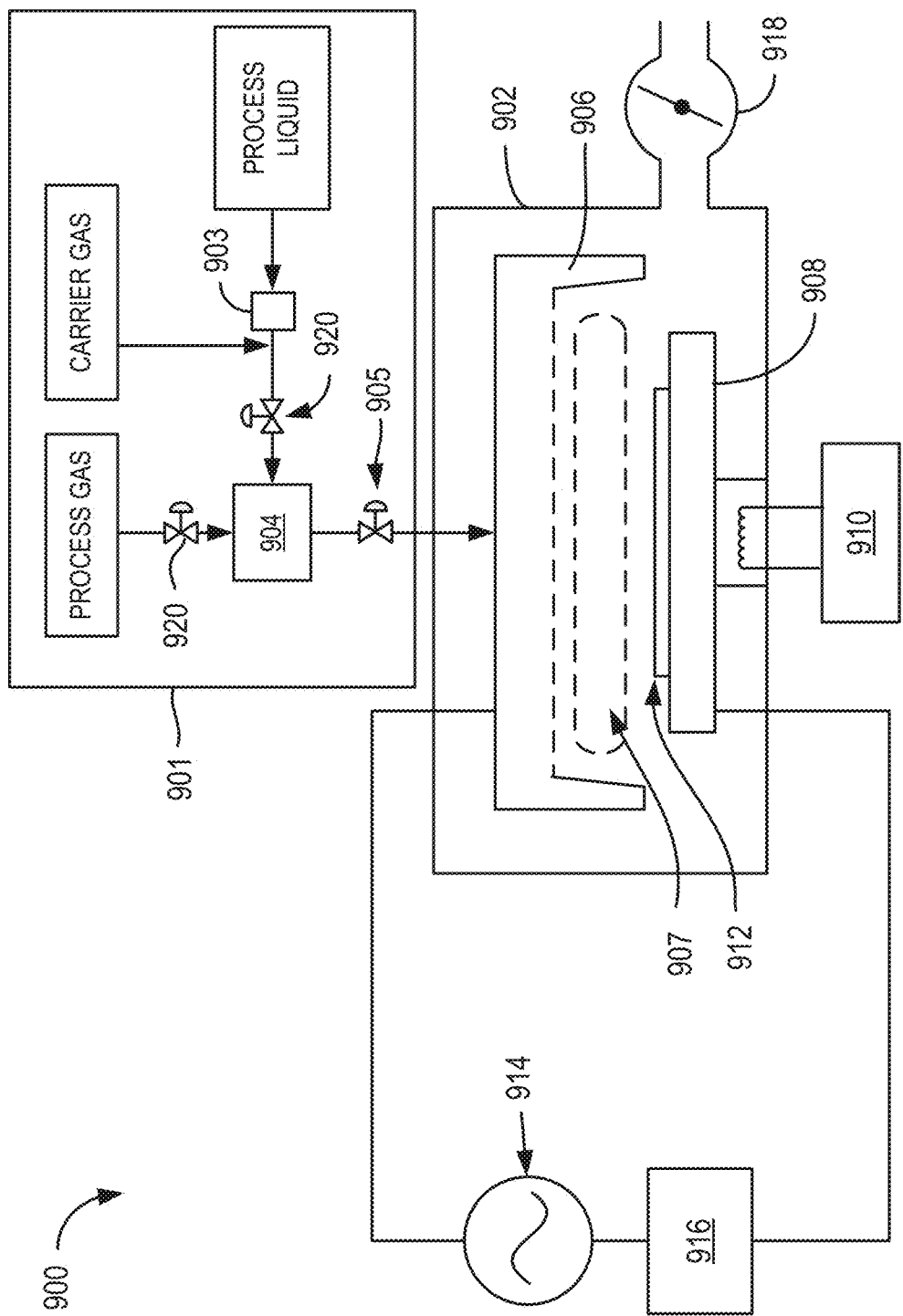
FIG. 9 depicts a schematic illustration of an example process station for performing dry etch according to some embodiments.
Figure 10:
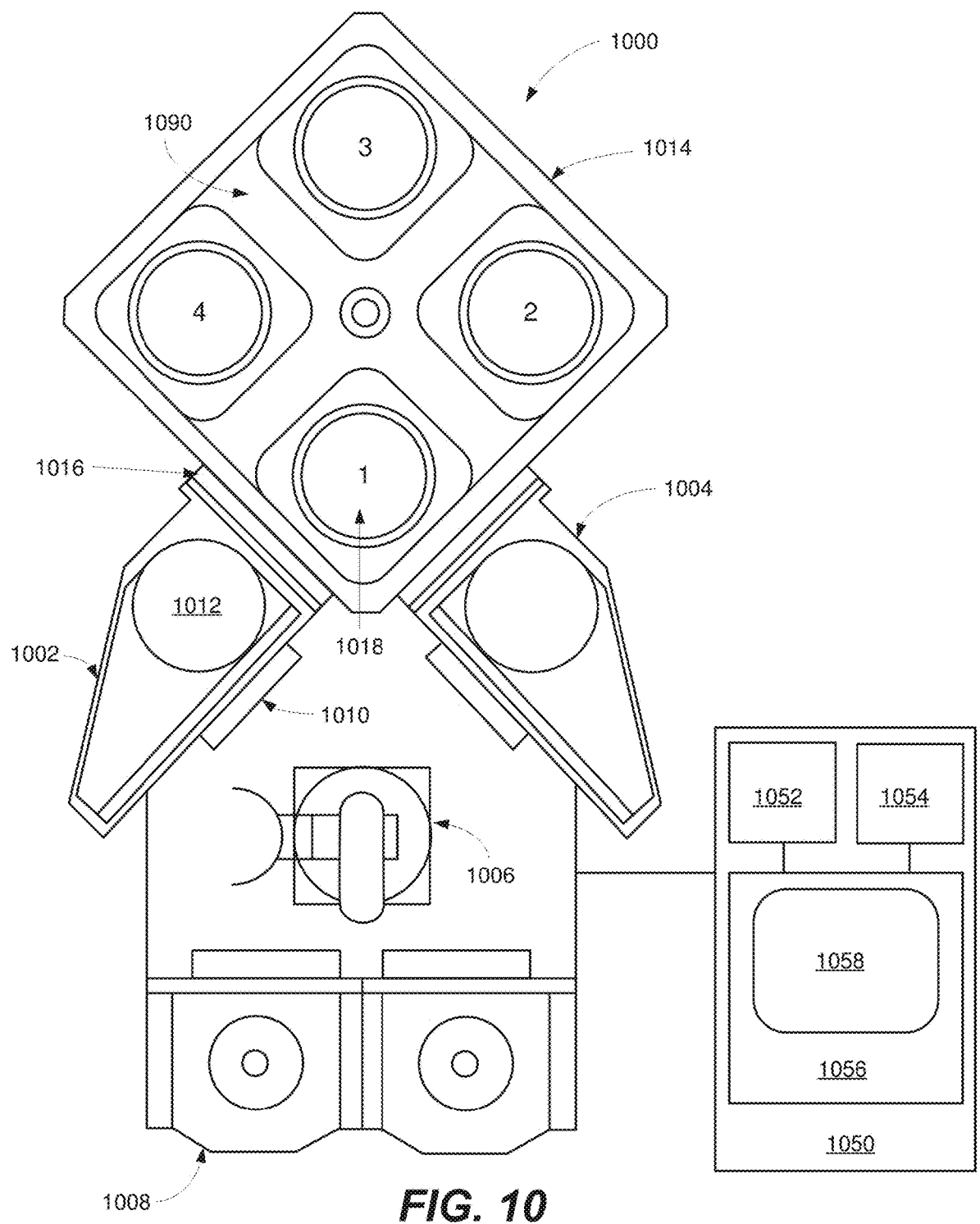
FIG. 10 depicts a schematic illustration of an example multi-station processing tool suitable for implementation of various photoresist processing operations described herein.

FIG. 9 depicts a schematic illustration of an example process station for performing dry etch according to some embodiments. A plurality of process stations 900 may be included in a common process tool environment. For example, FIG. 10 depicts an embodiment of a multi-station processing tool 1000, such as a VECTOR® processing tool available from Lam Research Corporation, Fremont, CA. In some embodiments, one or more hardware parameters of the process station 1000 including those discussed in detail below may be adjusted programmatically by one or more computer controllers 1050.

A process station may be configured as a module in a cluster tool. FIG. 9 depicts a semiconductor process cluster tool architecture with deposition and patterning modules suitable for implementation of the embodiments described herein. Such a cluster process tool architecture can include resist deposition, resist treatment, resist bevel edge cleaning, resist baking, resist exposure (EUV scanner), resist dry development, and etch modules, as described above with reference to FIGS. 4 and 5 and further below with reference to FIG. 10.

In some embodiments, certain of the processing functions can be performed consecutively in the same module. For example dry development and baking or dry development and bevel edge cleaning may be performed in the same module.

Returning to FIG. 9, process station 900 fluidly communicates with reactant delivery system 901 for delivering process gases to a distribution showerhead 906. Reactant delivery system 901 optionally includes a mixing vessel 904 for blending and/or conditioning process gases, for delivery to showerhead 906. One or more mixing vessel inlet valves 920 may control introduction of process gases to mixing vessel 904. Where plasma exposure is used, plasma may also be delivered to the showerhead 906 or may be generated in the process station 900. As noted above, in at least some embodiments, non-plasma thermal exposure is favored.

FIG. 9 includes an optional vaporization point 903 for vaporizing liquid reactant to be supplied to the mixing vessel 904. In some embodiments, a liquid flow controller (LFC) upstream of vaporization point 903 may be provided for controlling a mass flow of liquid for vaporization and delivery to process station 900. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM.

Showerhead 906 distributes process gases toward substrate 912. In the embodiment shown in FIG. 9, the substrate 912 is located beneath showerhead 906 and is shown resting on a pedestal 908. Showerhead 906 may have any suitable shape, and may have any suitable number and arrangement of ports for distributing process gases to substrate 912.

In some embodiments, pedestal 908 may be raised or lowered to expose substrate 912 to a volume between the substrate 912 and the showerhead 906. It will be appreciated that, in some embodiments, pedestal height may be adjusted programmatically by a suitable computer controller 950.

In some embodiments, pedestal 908 may be temperature controlled via heater 910. In some embodiments, the pedestal 908 may be heated to a temperature of greater than 50° C. and up to 300° C. or more, for example 50° C. to 230° C., such as about 100° C. to 200° C., during non-plasma thermal exposure of a EUV resist to dry development chemistry or dry cleaning chemistry.

Further, in some embodiments, pressure control for process station 900 may be optionally provided by a butterfly valve 918. As shown in the embodiment of FIG. 9, butterfly valve 918 throttles a vacuum provided by a downstream vacuum pump (not shown). However, in some embodiments, the process station 900 may be in an open air environment without vacuum equipment. The process station 900 may perform photoresist processing operations such as dry development, baking, and/or dry bevel edge cleaning.

In some embodiments, a position of showerhead 906 may be adjusted relative to pedestal 908 to vary a volume between the substrate 912 and the showerhead 906. Further, it will be appreciated that a vertical position of pedestal 908 and/or showerhead 906 may be varied by any suitable mechanism within the scope of the present disclosure. In some embodiments, pedestal 908 may include a rotational axis for rotating an orientation of substrate 912. It will be appreciated that, in some embodiments, one or more of these example adjustments may be performed programmatically by one or more suitable computer controllers 950.

Where plasma may be used, for example in gentle plasma-based dry development embodiments and/or etch operations conducted in the same chamber, showerhead 906 and pedestal 908 electrically communicate with a radio frequency (RF) power supply 914 and matching network 916 for powering a plasma. In some embodiments, the plasma energy may be controlled by controlling one or more of a process station pressure, a gas concentration, an RF source power, an RF source frequency, and a plasma power pulse timing. For example, RF power supply 914 and matching network 916 may be operated at any suitable power to form a plasma having a desired composition of radical species. Examples of suitable powers are up to about 500 W.

In some embodiments, instructions for a controller 950 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a recipe phase may include instructions for setting a flow rate of an etch gas such as a halogen-containing compound, and time delay instructions for the recipe phase. In some embodiments, the controller 950 may include any of the features described below with respect to system controller 1050 of FIG. 10.

As described above, one or more process stations may be included in a multi-station processing tool. FIG. 10 depicts a schematic illustration of an example multi-station processing tool 1000 suitable for implementation of various photoresist processing operations described herein. FIG. 10 shows an embodiment of the multi-station processing tool 1000 with an inbound load lock 1002 and an outbound load lock 1004, either or both of which may optionally include a remote plasma source. A robot 1006 at atmospheric pressure is configured to move wafers from a cassette loaded through a pod 1008 into inbound load lock 1002 via an atmospheric port 1010. A wafer is placed by the robot 1006 on a pedestal 1012 in the inbound load lock 1002, the atmospheric port 1010 is closed, and the load lock is pumped down. Where the inbound load lock 1002 includes a remote plasma source, the wafer may be exposed to a remote plasma treatment to treat the substrate surface in the load lock prior to being introduced into a processing chamber 1014. Further, the substrate also may be heated in the inbound load lock 1002 as well, for example, to remove moisture and adsorbed gases. Next, a chamber transport port 1016 to processing chamber 1014 is opened, and another robot (not shown) places the substrate into the reactor on a pedestal of a first station shown in the reactor for processing. While the embodiment depicted in FIG. 10 includes load locks, it will be appreciated that, in some embodiments, direct entry of a substrate into a process station may be provided.

The depicted processing chamber 1014 includes four process stations, numbered from 1 to 4 in the embodiment shown in FIG. 10. Each station has a heated pedestal (shown at 1018 for station 1), and gas line inlets. It will be appreciated that in some embodiments, each process station may have different or multiple purposes. For example, in some embodiments, a process station may be switchable between dry development and etch process modes. Additionally or alternatively, in some embodiments, processing chamber 1014 may include one or more matched pairs of dry development and etch process stations. While the depicted processing chamber 1014 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 10 depicts an embodiment of a substrate handling system 1090 for transferring substrates within processing chamber 1014. In some embodiments, substrate handling system 1090 may transfer substrates between various process stations and/or between a process station and a load lock. It will be appreciated that any suitable substrate handling system may be employed. Non-limiting examples include substrate carousels and substrate handling robots. FIG. 10 also depicts an embodiment of a system controller 1050 employed to control process conditions and hardware states of process tool 1000. System controller 1050 may include one or more memory devices 1056, one or more mass storage devices 1054, and one or more processors 1052. Processor 1052 may include a CPU or computer, analog, and/or digital input/output connections, stepper motor controller boards, etc.

In some embodiments, system controller 1050 controls all of the activities of process tool 1000. System controller 1050 executes system control software 1058 stored in mass storage device 1054, loaded into memory device 1056, and executed on processor 1052. Alternatively, the control logic may be hard coded in the controller 1050. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 1058 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 1000. System control software 1058 may be configured in any suitable way. For example, various process tool component subroutines or control objects may be written to control operation of the process tool components used to carry out various process tool processes. System control software 1058 may be coded in any suitable computer readable programming language.

In some embodiments, system control software 1058 may include input/output control (IOC) sequencing instructions for controlling the various parameters described above. Other computer software and/or programs stored on mass storage device 1054 and/or memory device 1056 associated with system controller 1050 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 1018 and to control the spacing between the substrate and other parts of process tool 1000.

A process gas control program may include code for controlling various gas compositions (e.g., halogen-containing compound) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 1050. The user interface may include a display screen, graphical software displays of the apparatus and/or process conditions, and user input devices such as pointing devices, keyboards, touch screens, microphones, etc.

In some embodiments, parameters adjusted by system controller 1050 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 1050 from various process tool sensors. The signals for controlling the process may be output on the analog and digital output connections of process tool 1000. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 1050 may provide program instructions for implementing the above-described deposition processes.

The program instructions may control a variety of process parameters, such as DC power level, RF bias power level, pressure, temperature, etc. The instructions may control the parameters to operate deposition, bake, bevel edge cleaning, exposure, development, etch, and other photoresist processing operations according to various embodiments described herein.

The system controller 1050 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 1050.

In some implementations, the system controller 1050 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 1050, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 1050 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 1050 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

In some embodiments, system controller 1050 is configured with instructions for processing a semiconductor substrate. The instructions comprise code for: providing in a process chamber a metal-containing EUV resist on the semiconductor substrate, and delivering etch gas to the semiconductor substrate via an etch gas distributor or etch gas delivery nozzle to dry etch one or more portions of the metal-containing EUV resist from the semiconductor substrate under atmospheric conditions. In some embodiments, dry etching the one or more portions of the metal-containing EUV resist under atmospheric conditions includes dry developing the metal-containing EUV resist by selectively removing unexposed portions of the metal-containing EUV resist relative to exposed portions of the metal-containing EUV resist. In some embodiments, dry etching the one or more portions of the metal-containing EUV resist under atmospheric conditions includes dry cleaning the metal-containing EUV resist from a bevel edge of the semiconductor substrate.

The system controller 1050, in some implementations, may be a part of or coupled to a computer that is integrated with, coupled to the system, otherwise networked to the system, or a combination thereof. For example, the system controller 1050 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 1050 receives instructions in the form of data, which specify parameters for each of the processing steps to be performed during one or more operations. It should be understood that the parameters may be specific to the type of process to be performed and the type of tool that the system controller 1050 is configured to interface with or control. Thus as described above, the system controller 1050 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, an EUV lithography chamber (scanner) or module, a dry development chamber or module, and any other semiconductor processing systems that may be associated or used in the fabrication and/or manufacturing of semiconductor wafers.

As noted above, depending on the process step or steps to be performed by the tool, the system controller 1050 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Inductively coupled plasma (ICP) reactors which, in certain embodiments, may be suitable for etch operations suitable for implementation of some embodiments, are now described. Although ICP reactors are described herein, in some embodiments, it should be understood that capacitively coupled plasma reactors may also be used.

Figure 11:
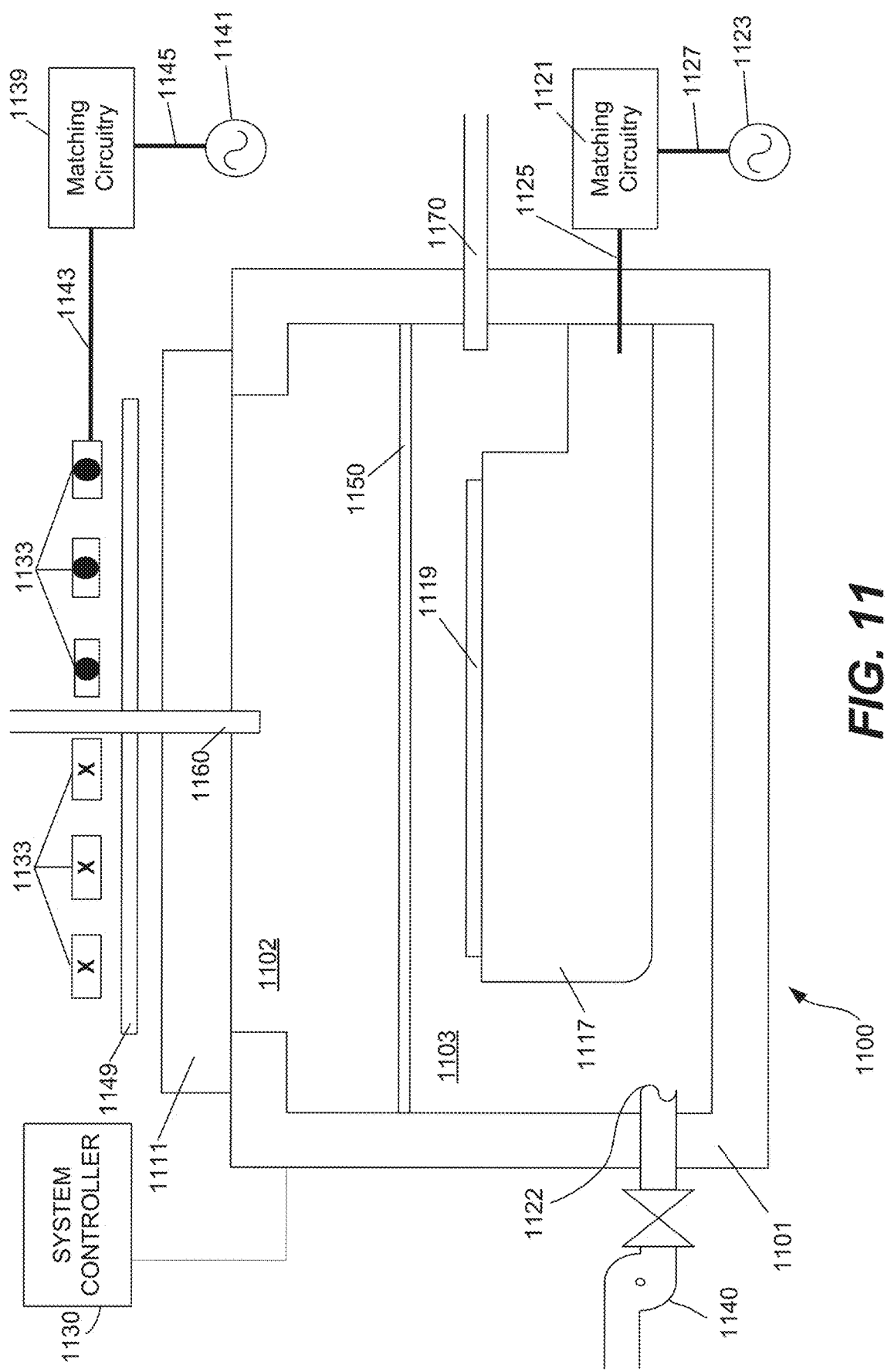
FIG. 11 shows a cross-sectional schematic view of an example inductively-coupled plasma apparatus for implementing certain embodiments and operations described herein.

FIG. 11 shows a cross-sectional schematic view of an example inductively-coupled plasma apparatus for implementing certain embodiments and operations described herein. The apparatus may be used for various photoresist processing operations such as dry development and/or bevel edge cleaning, an example of which is a Kiyo® reactor, produced by Lam Research Corp. of Fremont, CA. In other embodiments, other tools or tool types having the functionality to conduct the dry development and/or bevel edge cleaning may be used for implementation.

The inductively coupled plasma apparatus 1100 includes an overall process chamber 1124 structurally defined by chamber walls 1101 and a window 1111. The chamber walls 1101 may be fabricated from stainless steel or aluminum. The window 1111 may be fabricated from quartz or other dielectric material. An optional internal plasma grid 1150 divides the overall process chamber into an upper sub-chamber 1102 and a lower sub chamber 1103. In most embodiments, plasma grid 1150 may be removed, thereby utilizing a chamber space made of sub chambers 1102 and 1103. A chuck 1117 is positioned within the lower sub-chamber 1103 near the bottom inner surface. The chuck 1117 is configured to receive and hold a semiconductor wafer 1119 upon which the etching and deposition processes are performed. The chuck 1117 can be an electrostatic chuck for supporting the wafer 1119 when present. In some embodiments, an edge ring (not shown) surrounds chuck 1117, and has an upper surface that is approximately planar with a top surface of the wafer 1119, when present over chuck 1117. The chuck 1117 also includes electrostatic electrodes for chucking and dechucking the wafer 1119. A filter and DC clamp power supply (not shown) may be provided for this purpose. Other control systems for lifting the wafer 1119 off the chuck 1117 can also be provided. The chuck 1117 can be electrically charged using an RF power supply 1123. The RF power supply 1123 is connected to matching circuitry 1121 through a connection 1127. The matching circuitry 1121 is connected to the chuck 1117 through a connection 1125. In this manner, the RF power supply 1123 is connected to the chuck 1117. In various embodiments, a bias power of the electrostatic chuck may be set at about 50V or may be set at a different bias power depending on the process performed in accordance with disclosed embodiments. For example, the bias power may be between about 20 Vb and about 100 V, or between about 30 V and about 150 V.

Elements for plasma generation include a coil 1133 is positioned above window 1111. In some embodiments, a coil is not used in disclosed embodiments. The coil 1133 is fabricated from an electrically conductive material and includes at least one complete turn. The example of a coil 1133 shown in FIG. 11 includes three turns. The cross sections of coil 1133 are shown with symbols, and coils having an "X" extend rotationally into the page, while coils having a "●" extend rotationally out of the page. Elements for plasma generation also include an RF power supply 1141 configured to supply RF power to the coil 1133. In general, the RF power supply 1141 is connected to matching circuitry 1139 through a connection 1145. The matching circuitry 1139 is connected to the coil 1133 through a connection 1143. In this manner, the RF power supply 1141 is connected to the coil 1133. An optional Faraday shield 1149a is positioned between the coil 1133 and the window 1111. The Faraday shield 1149a may be maintained in a spaced apart relationship relative to the coil 1133. In some embodiments, the Faraday shield 1149a is disposed immediately above the window 1111. In some embodiments, the Faraday shield 1149b is between the window 1111 and the chuck 1117. In some embodiments, the Faraday shield 1149b is not maintained in a spaced apart relationship relative to the coil 1133. For example, the Faraday shield 1149b may be directly below the window 1111 without a gap. The coil 1133, the Faraday shield 1149a, and the window 1111 are each configured to be substantially parallel to one another. The Faraday shield 1149a may prevent metal or other species from depositing on the window 1111 of the process chamber 1124.

Process gases may be flowed into the process chamber through one or more main gas flow inlets 1160 positioned in the upper sub-chamber 1102 and/or through one or more side gas flow inlets 1170. Likewise, though not explicitly shown, similar gas flow inlets may be used to supply process gases to a capacitively coupled plasma processing chamber. A vacuum pump, e.g., a one or two stage mechanical dry pump and/or turbomolecular pump 1140, may be used to draw process gases out of the process chamber 1124 and to maintain a pressure within the process chamber 1124. For example, the vacuum pump may be used to evacuate the lower sub-chamber 1103 during a purge operation of ALD. A valve-controlled conduit may be used to fluidically connect the vacuum pump to the process chamber 1124 so as to selectively control application of the vacuum environment provided by the vacuum pump. This may be done employing a closed loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus 1100, one or more process gases may be supplied through the gas flow inlets 1160 and/or 1170. In certain embodiments, process gas may be supplied only through the main gas flow inlet 1160, or only through the side gas flow inlet 1170. In some cases, the gas flow inlets shown in the figure may be replaced by more complex gas flow inlets, one or more showerheads, for example. The Faraday shield 1149a and/or optional grid 1150 may include internal channels and holes that allow delivery of process gases to the process chamber 1124. Either or both of Faraday shield 1149a and optional grid 1150 may serve as a showerhead for delivery of process gases. In some embodiments, a liquid vaporization and delivery system may be situated upstream of the process chamber 1124, such that once a liquid reactant or precursor is vaporized, the vaporized reactant or precursor is introduced into the process chamber 1124 via a gas flow inlet 1160 and/or 1170.

Radio frequency power is supplied from the RF power supply 1141 to the coil 1133 to cause an RF current to flow through the coil 1133. The RF current flowing through the coil 1133 generates an electromagnetic field about the coil 1133. The electromagnetic field generates an inductive current within the upper sub-chamber 1102. The physical and chemical interactions of various generated ions and radicals with the wafer 1119 etch features of and selectively deposit layers on the wafer 1119.

If the plasma grid 1150 is used such that there is both an upper sub-chamber 1102 and a lower sub-chamber 1103, the inductive current acts on the gas present in the upper sub-chamber 1102 to generate an electron-ion plasma in the upper sub-chamber 1102. The optional internal plasma grid 650 limits the amount of hot electrons in the lower sub-chamber 1103. In some embodiments, the apparatus 1100 is designed and operated such that the plasma present in the lower sub-chamber 1103 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower sub-chamber 1103 through port 1122. The chuck 1117 disclosed herein may operate at elevated temperatures ranging between about 10° C. and about 250° C. The temperature will depend on the process operation and specific recipe.

Apparatus 1100 may be coupled to facilities (not shown) when installed in a clean room or a fabrication facility. Facilities include plumbing that provide processing gases, vacuum, temperature control, and environmental particle control. These facilities are coupled to apparatus 1100, when installed in the target fabrication facility. Additionally, apparatus 1100 may be coupled to a transfer chamber that allows robotics to transfer semiconductor wafers into and out of apparatus 1100 using typical automation.

In some embodiments, a system controller 1130 (which may include one or more physical or logical controllers) controls some or all of the operations of a process chamber 1124. The system controller 1130 may include one or more memory devices and one or more processors. In some embodiments, the apparatus 1100 includes a switching system for controlling flow rates and durations when disclosed embodiments are performed. In some embodiments, the apparatus 1100 may have a switching time of up to about 600 ms, or up to about 750 ms. Switching time may depend on the flow chemistry, recipe chosen, reactor architecture, and other factors.

In some implementations, the system controller 1130 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be integrated into the system controller 1130, which may control various components or subparts of the system or systems. The system controller 1130, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 1130 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication or removal of one or more layers, materials, metals, oxides, silicon, silicon dioxide, surfaces, circuits, and/or dies of a wafer.

The system controller 1130, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 630 receives instructions in the form of data, which specify parameters for each of the processing steps to be performed during one or more operations. It should be understood that the parameters may be specific to the type of process to be performed and the type of tool that the controller is configured to interface with or control. Thus as described above, the system controller 630 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, an EUV lithography chamber (scanner) or module, a dry development chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 12:
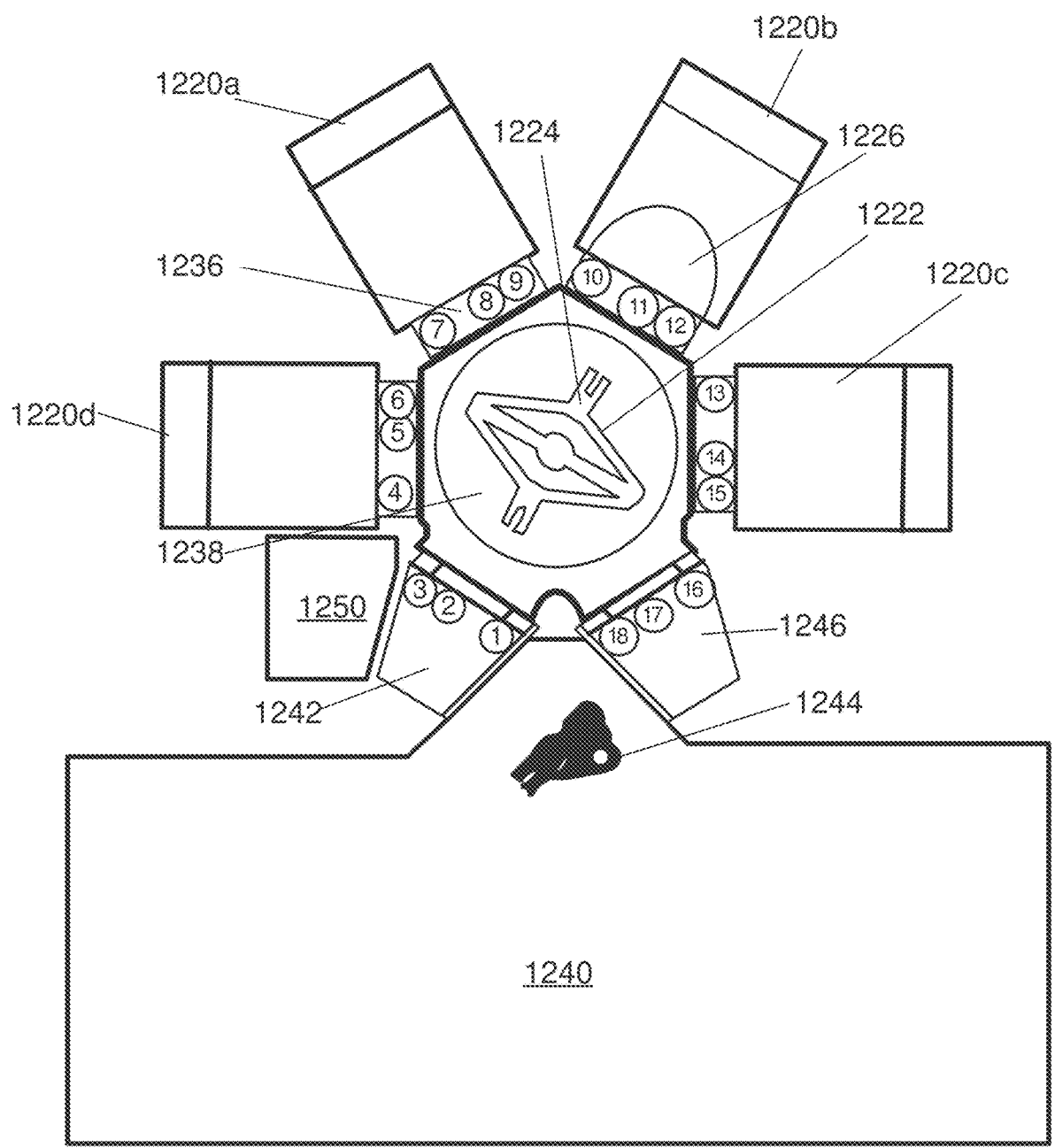
FIG. 12 depicts a semiconductor process cluster tool architecture with deposition and patterning modules that interface with a transfer module, suitable for implementations of processes described herein.

EUVL patterning may be conducted using any suitable tool, often referred to as a scanner, for example the TWIN-SCAN NXE: 3300B® platform supplied by ASML of Veldhoven, NL). The EUVL patterning tool may be a standalone device from which the substrate is moved into and out of for deposition and etching as described herein. Or, as described below, the EUVL patterning tool may be a module on a larger multi-component tool. FIG. 12 depicts a semiconductor process cluster tool architecture with deposition and patterning modules that interface with a transfer module, suitable for implementations of processes described herein. While the processes may be conducted without a vacuum integrated apparatus, such apparatus may be advantageous in some implementations.

FIG. 12 depicts a semiconductor process cluster tool architecture with deposition and patterning modules that interface with a transfer module, suitable for implementation of processes described herein. The arrangement of transfer modules to "transfer" wafers among multiple storage facilities and processing modules may be referred to as a "cluster tool architecture" system. Deposition and patterning modules are vacuum-integrated, in accordance with the requirements of a particular process. Other modules, such as for etch, may also be included on the cluster.

A vacuum transport module (VTM) 1238 interfaces with four processing modules 1220a-1220d, which may be individually optimized to perform various fabrication processes. By way of example, processing modules 1220a-1220d may be implemented to perform deposition, evaporation, ELD, dry development, etch, strip, and/or other semiconductor processes. For example, module 1220a may be an ALD reactor that may be operated to perform in a non-plasma, thermal atomic layer depositions as described herein, such as Vector tool, available from Lam Research Corporation, Fremont, CA. And module 1220b may be a PECVD tool, such as the Lam Vector®. It should be understood that the figure is not necessarily drawn to scale.

Airlocks 1242 and 1246, also known as a loadlocks or transfer modules, interface with the VTM 1238 and a patterning module 1240. For example, as noted above, a suitable patterning module may be the TWINSCAN NXE: 3300B® platform supplied by ASML of Veldhoven, NL). This tool architecture allows for work pieces, such as semiconductor substrates or wafers, to be transferred under vacuum so as not to react before exposure. Integration of the deposition modules with the lithography tool is facilitated by the fact that EUVL also requires a greatly reduced pressure given the strong optical absorption of the incident photons by ambient gases such as H2O, O2, etc.

As noted above, this integrated architecture is just one possible embodiment of a tool for implementation of the described processes. The processes may also be implemented with a more conventional stand-alone EUVL scanner and a deposition reactor, such as a Lam Vector tool, either stand alone or integrated in a cluster architecture with other tools, such as etch, strip etc. (e.g., Lam Kiyo or Gamma tools), as modules, for example as described with reference to FIG. 12 but without the integrated patterning module.

Airlock 1242 may be an "outgoing" loadlock, referring to the transfer of a substrate out from the VTM 1238 serving a deposition module 1220a to the patterning module 1240, and airlock 1246 may be an "ingoing" loadlock, referring to the transfer of a substrate from the patterning module 1240 back in to the VTM 1238. The ingoing loadlock 1246 may also provide an interface to the exterior of the tool for access and egress of substrates. Each process module has a facet that interfaces the module to VTM 1238. For example, deposition process module 1220a has facet 1236. Inside each facet, sensors, for example, sensors 1-18 as shown, are used to detect the passing of wafer 1226 when moved between respective stations. Patterning module 1240 and airlocks 1242 and 1246 may be similarly equipped with additional facets and sensors, not shown.

Main VTM robot 1222 transfers wafer 1226 between modules, including airlocks 1242 and 1246. In one embodiment, robot 1222 has one arm, and in another embodiment, robot 1222 has two arms, where each arm has an end effector 1224 to pick wafers such as wafer 1226 for transport. Front-end robot 1244, in is used to transfer wafers 1226 from outgoing airlock 1242 into the patterning module 1240, from the patterning module 1240 into ingoing airlock 1246. Front-end robot 1244 may also transport wafers 1226 between the ingoing loadlock and the exterior of the tool for access and egress of substrates. Because ingoing airlock module 1246 has the ability to match the environment between atmospheric and vacuum, the wafer 1226 is able to move between the two pressure environments without being damaged.

It should be noted that a EUVL tool typically operates at a higher vacuum than a deposition tool. If this is the case, it is desirable to increase the vacuum environment of the substrate during the transfer between the deposition to the EUVL tool to allow the substrate to degas prior to entry into the patterning tool. Outgoing airlock 1242 may provide this function by holding the transferred wafers at a lower pressure, no higher than the pressure in the patterning module 1240, for a period of time and exhausting any off-gassing, so that the optics of the patterning tool 1240 are not contaminated by off-gassing from the substrate. A suitable pressure for the outgoing, off-gassing airlock is no more than 1E-8 Torr.

Figure 13:
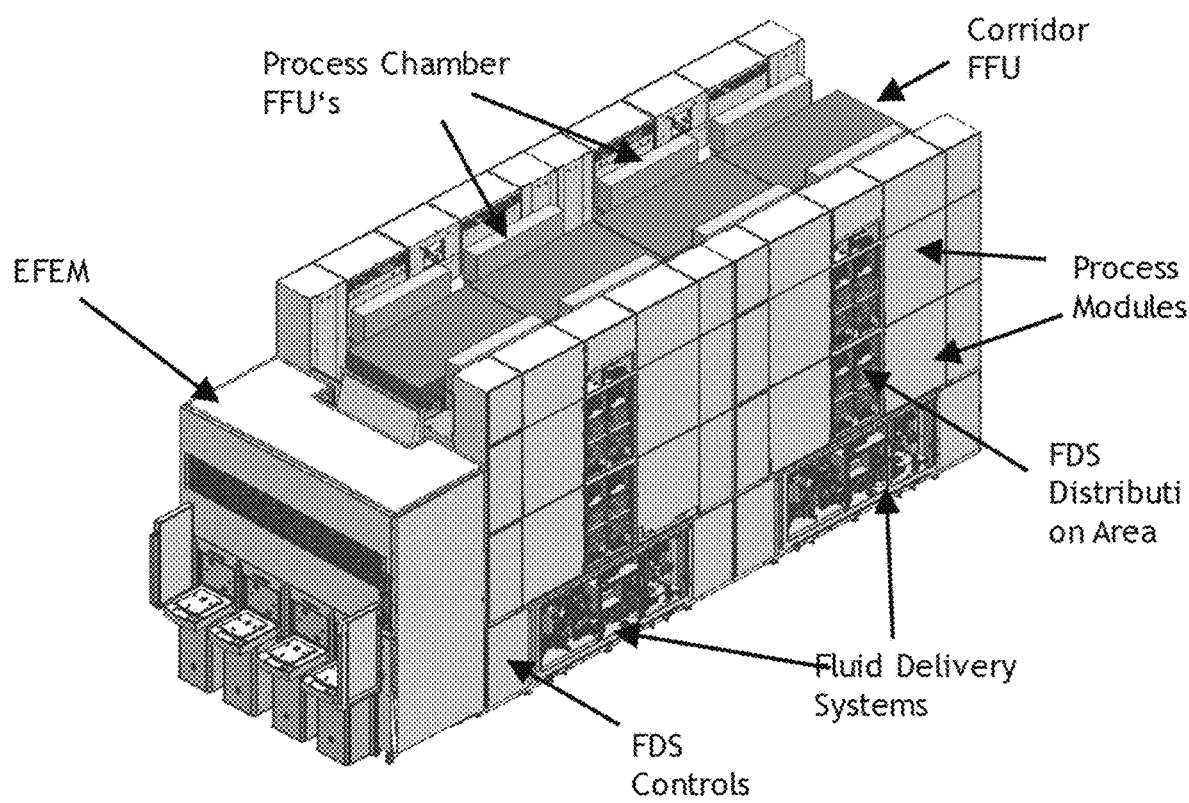

FIGS. 13 and 14 provide configurations for alternative processing tool architectures, such as may be implemented at least in part in the EOS or Sense.i products available from Lam Research Corporation, Fremont, CA, that may be used in some embodiments. Resist processing tracks, as shown in FIGS. 13 and 14, may be used for implementation of wet development of dry deposited EUV photoresist. Various embodiments described herein may be performed using cluster architecture as shown in FIGS. 13 and 14.

CONCLUSION

Process and apparatus for dry etch of metal and/or metal oxide photoresists, for example to form a patterning mask in the context of EUV patterning is disclosed.

It is understood that the examples and embodiments described herein are for illustrative purposes only and that various modifications or changes in light thereof will be suggested to persons skilled in the art. Although various details have been omitted for clarity's sake, various design alternatives may be implemented. Therefore, the present examples are to be considered as illustrative and not restrictive, and the disclosure is not to be limited to the details given herein, but may be modified within the scope of the disclosure.

What is claimed is:

1. A track lithography system comprising:
a processing section, wherein the processing section includes a plurality of processing stations for photoresist processing of a semiconductor substrate, wherein at least one of the processing stations comprises a dry development chamber, wherein the dry development chamber is configured to perform dry removal of one or more portions of a metal-oxide-containing EUV resist from the semiconductor substrate by exposure to dry development chemistry, wherein the dry development chamber is exposed to a controlled environment and is configured to perform the dry removal of the one or more portions of the metal-oxide-containing EUV resist under the controlled environment, wherein the controlled environment comprises exposure to nitrogen, water vapor, carbon dioxide, argon, helium, air, or combinations thereof, in addition to exposure to the dry development chemistry, wherein the controlled environment comprises a pressure above atmospheric pressure; and
an interface section for transferring the semiconductor substrate between the processing section and a scanner, wherein the scanner is configured to expose the semiconductor substrate to EUV radiation.

2. The track lithography system of claim 1, wherein the dry development chamber is configured to perform a cooldown operation.

3. The track lithography system of claim 1, further comprising:
one or more gas inlets for delivery of the nitrogen, oxygen, water vapor, carbon dioxide, argon, helium, or combinations thereof to provide the controlled environment in the dry development chamber.

4. The track lithography system of claim 1, wherein the plurality of processing stations further comprises a bake chamber configured to expose the semiconductor substrate to a post-application bake (PAB) treatment or post-exposure bake (PEB) treatment.

5. The track lithography system of claim 1, wherein the dry development chemistry comprises a halogen-containing gas.

6. The track lithography system of claim 1, wherein one or more of the plurality of processing stations are configured to expose the semiconductor substrate to a controlled environment.

7. The track lithography system of claim 6, further comprising:
one or more gas inlets for delivery of nitrogen, oxygen, water vapor, carbon dioxide, argon, helium, or combinations thereof to provide the controlled environment to the one or more of the plurality of processing stations.

8. The track lithography system of claim 1, wherein the dry development chamber is further configured to perform bevel edge and backside clean of the semiconductor substrate.

9. The track lithography system of claim 1, wherein the plurality of processing stations further comprises a bevel edge and backside clean chamber, wherein the bevel and backside clean chamber is configured to perform edge bead removal by directing a stream of solvent above and below a bevel edge while the semiconductor substrate is rotating.

10. The track lithography system of claim 1, wherein the plurality of processing stations further comprises a post-development treatment chamber, wherein the post-development treatment chamber is configured to treat the metal-oxide-containing EUV resist on the semiconductor substrate after dry development.

11. The track lithography system of claim 1, wherein the plurality of processing stations further comprises a treatment chamber configured to treat the semiconductor substrate prior to exposure to the dry development chemistry by changing one or both of a temperature of the semiconductor substrate and a pressure in the treatment chamber.

12. The track lithography system of claim 1, wherein the plurality of processing stations further comprises:
 a bevel edge and backside clean chamber, wherein the bevel and backside clean chamber is configured to perform dry removal of metal-oxide-containing EUV resist material on a bevel edge and/or backside of the semiconductor substrate.

13. A track lithography system comprising:
 a processing section, wherein the processing section includes a plurality of processing stations for photoresist processing of a semiconductor substrate, wherein the plurality of processing stations comprises:
 a deposition chamber for depositing metal-oxide-containing EUV resist on the semiconductor substrate; and
 a dry development chamber, wherein the dry development chamber is configured to perform dry removal of one or more portions of the metal-oxide-containing EUV resist from the semiconductor substrate by exposure to dry development chemistry, wherein the dry development chamber is exposed to a controlled environment and is configured to perform the dry removal of the one or more portions of the metal-oxide-containing EUV resist under the controlled environment, wherein the controlled environment comprises exposure to nitrogen, water vapor, carbon dioxide, argon, helium, air, or combinations thereof, in addition to exposure to the dry development chemistry, wherein the controlled environment comprises a pressure above atmospheric pressure; and
 a bake chamber that comprises a bake plate for supporting the semiconductor substrate and heating the semiconductor substrate to an elevated temperature; and
 an interface section for transferring the semiconductor substrate between the processing section and a scanner, wherein the scanner is configured to expose the semiconductor substrate to EUV radiation.

14. The track lithography system of claim 13, wherein the dry development chamber is configured to perform a cooldown operation.

15. The track lithography system of claim 13, wherein the dry development chemistry comprises a halogen-containing gas.

16. The track lithography system of claim 13, wherein one or more of the plurality of processing stations are configured to expose the semiconductor substrate to a controlled environment.

17. The track lithography system of claim 16, further comprising:
 one or more gas inlets for delivery of nitrogen, oxygen, water vapor, carbon dioxide, argon, helium, or combinations thereof to provide the controlled environment to the one or more of the plurality of processing stations.

18. The track lithography system of claim 13, wherein the processing section is configured to adjust a vacuum environment of the semiconductor substrate between each of the plurality of processing stations.

19. The track lithography system of claim 13, wherein the plurality of processing stations further comprises:
 a bevel edge and backside clean chamber, wherein the bevel and backside clean chamber is configured to perform edge bead removal by directing a stream of solvent above and below a bevel edge while the semiconductor substrate is rotating.

20. The track lithography system of claim 13, wherein the plurality of processing stations further comprises:
 an auxiliary treatment chamber, wherein the auxiliary treatment chamber is configured to perform one or more of the following: PAB treatment, PEB treatment, post-development treatment, photoresist rework, hexamethyldisilazane (HMDS) treatment, and bevel and backside clean of the semiconductor substrate.

21. The track lithography system of claim 13, wherein the plurality of processing stations further comprises:
 a bevel edge and backside clean chamber, wherein the bevel and backside clean chamber is configured to perform dry removal of metal-oxide-containing EUV resist material on a bevel edge and/or backside of the semiconductor substrate.

* * * * *